(12) United States Patent
Jin et al.

(10) Patent No.: US 11,040,624 B2
(45) Date of Patent: Jun. 22, 2021

(54) COOLING STRATEGY FOR BATTERY SYSTEMS

(71) Applicant: CPS Technology Holdings LLC, New York, NY (US)

(72) Inventors: Zhihong H. Jin, Glendale, WI (US); Brian C. Sisk, Mequon, WI (US); Kem M. Obasih, Brookfield, WI (US); Mark R. Johnson, Milwaukee, WI (US); Perry M. Wyatt, Fox Point, WI (US); Timur L. Aliyev, Chicago, IL (US); Zhenli Zhang, Glendale, WI (US)

(73) Assignee: CPS Technology Holdings LLC, New York, NY (US)

( * ) Notice: Subject to any disclaimer, the term of this patent is extended or adjusted under 35 U.S.C. 154(b) by 0 days.

(21) Appl. No.: 16/160,369

(22) Filed: Oct. 15, 2018

(65) Prior Publication Data
US 2019/0047421 A1 Feb. 14, 2019

Related U.S. Application Data

(63) Continuation of application No. 14/788,223, filed on Jun. 30, 2015, now Pat. No. 10,099,562.
(Continued)

(51) Int. Cl.
*B60L 50/60* (2019.01)
*B60L 7/10* (2006.01)
(Continued)

(52) U.S. Cl.
CPC ............. *B60L 7/10* (2013.01); *B60L 50/60* (2019.02); *B60L 58/24* (2019.02); *B60L 58/26* (2019.02);
(Continued)

(58) Field of Classification Search
CPC ............. Y02T 10/7005; Y02T 10/7044; B60L 11/182; B60L 11/1861; B60L 1/00;
(Continued)

(56) References Cited

U.S. PATENT DOCUMENTS 5,541,496 A 7/1996 Simmonds
5,563,494 A 10/1996 Cuesta et al.
(Continued)

FOREIGN PATENT DOCUMENTS

CN 101181874 5/2008
DE 102013002198 8/2014
(Continued)

OTHER PUBLICATIONS

US 6,175,216 B1, 01/2001, Stuck Anersen et al. (withdrawn)
(Continued)

*Primary Examiner* — Sibin Chen
(74) *Attorney, Agent, or Firm* — Boardman & Clark LLP

(57) ABSTRACT

Embodiments describe a battery system that includes a first battery module coupled to a regenerative braking system and a control module that controls operation of the battery system by: determining a predicted driving pattern over a prediction horizon using a driving pattern recognition model based in part on a battery current and a previous driving pattern; determining a predicted battery resistance of the first battery module over the prediction horizon using a recursive battery model based in part on the predicted driving pattern, the battery current, a present bus voltage, and a previous bus voltage; determining a target trajectory of a battery temperature of the first battery module over a control horizon using an objective function; and controlling magnitude and duration of electrical power supplied from the regenerative such that a predicted trajectory of the battery temperature is
(Continued)

guided toward the target trajectory of the battery temperature during the control horizon.

4 Claims, 17 Drawing Sheets

Related U.S. Application Data

(60) Provisional application No. 62/064,318, filed on Oct. 15, 2014, provisional application No. 62/075,140, filed on Nov. 4, 2014.

(51) Int. Cl.
| | |
|---|---|
| G01R 31/382 | (2019.01) |
| G01R 31/3842 | (2019.01) |
| B60L 58/24 | (2019.01) |
| B60L 58/26 | (2019.01) |
| G01R 31/36 | (2020.01) |
| H05K 7/20 | (2006.01) |

(52) U.S. Cl.
CPC ........... *G01R 31/36* (2013.01); *G01R 31/382* (2019.01); *G01R 31/3842* (2019.01); *H05K 7/20145* (2013.01); *B60L 2240/36* (2013.01); *B60L 2240/423* (2013.01); *B60L 2240/545* (2013.01); *B60L 2260/40* (2013.01); *B60L 2260/44* (2013.01)

(58) Field of Classification Search
CPC .......... B60L 50/60; B60L 58/24; B60L 58/26; B60L 2240/36; B60L 2240/423; B60L 2240/545; B60L 2260/40; B60L 2260/44; H05K 7/20145
See application file for complete search history.

(56) References Cited

U.S. PATENT DOCUMENTS

| | | | |
|---|---|---|---|
| 5,773,962 A | 6/1998 | Nor | |
| 6,239,579 B1 | 5/2001 | Dunn et al. | |
| 6,441,586 B1 | 8/2002 | Tate, Jr. et al. | |
| 6,476,584 B2 | 11/2002 | Sakakibara | |
| 6,603,288 B2 | 8/2003 | Sakakibara | |
| 6,630,810 B2 | 10/2003 | Takemasa et al. | |
| 6,784,635 B2 | 8/2004 | Larson | |
| 6,828,755 B1 | 12/2004 | Iverson et al. | |
| 7,372,237 B2 | 5/2008 | Bushong et al. | |
| 7,400,113 B2 | 7/2008 | Osborne | |
| 7,489,048 B2 | 2/2009 | King et al. | |
| 7,498,772 B2 | 3/2009 | Palladino | |
| 7,679,325 B2 | 3/2010 | Seo | |
| 7,683,582 B2 | 3/2010 | Zhu et al. | |
| 8,022,663 B2 | 9/2011 | Davis et al. | |
| 8,035,349 B2 | 10/2011 | Lubawy | |
| 8,078,417 B2 | 12/2011 | Ishishita | |
| 8,129,952 B2 | 3/2012 | Lee | |
| 8,395,357 B2 | 3/2013 | Hsieh | |
| 8,756,025 B2 | 6/2014 | Banerjee et al. | |
| 9,067,589 B1* | 6/2015 | Zhao .................... B60W 20/12 | |
| 2001/0001533 A1 | 5/2001 | Stuck Andersen et al. | |
| 2002/0062183 A1 | 5/2002 | Yamaguchi et al. | |
| 2004/0070371 A1 | 4/2004 | Chern et al. | |
| 2008/0003491 A1 | 1/2008 | Yahnker et al. | |
| 2008/0275644 A1 | 11/2008 | Macneille et al. | |
| 2009/0153104 A1 | 6/2009 | Matsuura et al. | |
| 2009/0266631 A1 | 10/2009 | Kikuchi | |
| 2010/0019729 A1 | 1/2010 | Kaita et al. | |
| 2010/0079111 A1 | 4/2010 | Masuda | |
| 2010/0176768 A1 | 7/2010 | Kimura et al. | |
| 2010/0305794 A1 | 12/2010 | Foster | |
| 2011/0001442 A1 | 1/2011 | Lee et al. | |
| 2011/0109273 A1 | 5/2011 | Tamezane | |
| 2012/0109443 A1 | 5/2012 | Takahashi et al. | |
| 2012/0200257 A1 | 8/2012 | Schwarz et al. | |
| 2012/0232736 A1 | 9/2012 | Aoki | |
| 2012/0316810 A1 | 12/2012 | Syed et al. | |
| 2013/0106173 A1 | 5/2013 | Nomura | |
| 2013/0141045 A1 | 6/2013 | Karim et al. | |
| 2014/0012447 A1 | 1/2014 | Gao et al. | |
| 2014/0091772 A1 | 4/2014 | Del Core | |
| 2014/0111145 A1 | 4/2014 | Mitsuda et al. | |
| 2014/0200755 A1 | 7/2014 | Sisk et al. | |
| 2014/0200756 A1 | 7/2014 | Sisk | |
| 2014/0247018 A1 | 9/2014 | Kikuchi et al. | |
| 2014/0375277 A1 | 12/2014 | Yan et al. | |
| 2015/0097518 A1 | 4/2015 | Bishop et al. | |
| 2015/0100188 A1 | 4/2015 | Wagner et al. | |
| 2015/0232049 A1 | 8/2015 | Ohsumi et al. | |
| 2015/0258897 A1 | 9/2015 | Okada et al. | |
| 2015/0318725 A1* | 11/2015 | Brockman ................ H02J 7/00 340/636.1 | |

FOREIGN PATENT DOCUMENTS

| | | |
|---|---|---|
| EP | 2579419 | 4/2013 |
| GB | 2504353 | 1/2014 |
| JP | 2004015876 | 1/2004 |
| JP | 2011040349 | 2/2011 |
| KR | 101452771 | 10/2014 |
| WO | WO2014083740 | 6/2014 |

OTHER PUBLICATIONS

Ahmad A. Pesaran et al., Impact of the 3Cs of Batteries on PHEV Value Proposition: Cost, Calendar Life, and Cycle Life; Jun. 10, 2009.
Ahmad A. Pesaran, Battery Thermal Management in EVs and HEVs: Issues and Solutions; Feb. 6, 2001.
M. Keyser et al., Thermal Evaluation and Performance of High-Power Lithium-Ion Cells; Oct. 1, 1999.
Bor Yann Liaw et al., Correlation of Arrhenius behaviors in power and capacity fades with cell impedance and heat generation in cylindrical lithium-ion cells; 2003.
Yalian Yang et al., Arrhenius Equation-Based Cell-Health Assessment: Application to Thermal Energy Management Design of a HEV NiMH Battery Pack; May 22, 2013.
E. V. Thomas et al., Accelerated Power Degradation of Li-ion Cells; Jun. 11, 2003.
Marc Doyle et al., Modeling of Galvanostatic Charge and Discharge of the Lithium/Polymer/Insertion Cell; Jun. 1993.
Tae-Kyung Lee et al., Synthesis of Real-World Driving Cycles and Their Use for Estimating PHEV Energy Consumption and Charging Opportunities: Case Study for Midwest/U.S.; Nov. 2011.
M. Kassem et al., Erratum to "Calendar aging of a graphite/LiFePO4 Cell" [Power 208 296-305]; 2012.
Harry J. Ploehn et al., Solvent Diffusion Model for Aging of Lithium-Ion Battery Cells; Feb. 11, 2004.
Qingsong Wang et al., Thermal Runaway Caused Fire and Explosion of Lithium Ion Battery; Jun. 15, 2012.
Hossein Maleki et al., Thermal Stability Studies of Li-Ion Cells and Components; Apr. 27, 1999.
Hu Jianjun et al., Temperature Field Analysis Thermal Dissipation Structure Optimization of Lithium-ion Battery Pack in PEVs; Jan. 1, 2014.
Brian Sisk et al., Integrating thermal and electrochemical modeling of lithium-ion batteries to optimize requirements compliance; Apr. 14, 2015.
John Krumm, How People Use Their Vehicles: Statistics from the 2009 National Household Travel Survey; Apr. 16, 2012.
Ahmad Pesaran et al., Thermal Abuse Modeling of Li-Ion Cells and Propagation in Modules; May 13, 2008.
Randy B. Wright et al., Calendar-Life Studies of Advanced Technology Development Program Gen 1 Lithium Ion Batteries; Mar. 2001.

(56) References Cited

OTHER PUBLICATIONS

Mark R. Johnson et al.; Micro Hybrid Battery Thermal Design: An Investigation of Thermal Design Impacts on Drive Profile Performance and Aging Response in a 48V Battery System; Jun. 19, 2015.
Dan Doughty et al., A General Discussion of Li Ion Battery Safety; 2012.
Guangming Liu et al., Online Monitoring of Lithium-Ion Battery Aging Effects by Internal Resistance Estimation in Electric Vehicles; Jul. 25, 2012.
Ahmad Pesaran et al., Thermal Characteristics of Selected EV and HEV Batteries; Jan. 9, 2001.
Ahmad Pesaran et al., Temperature-Dependent Battery Models for High-Power Lithium-Ion Batteries; Oct. 16, 2000.
Takuji Matsubara et al., Development of New Hybrid System for Compact Class Vehicles; 2009.
CN 201580055208.6 Office Action dated Oct. 31, 2018.

\* cited by examiner

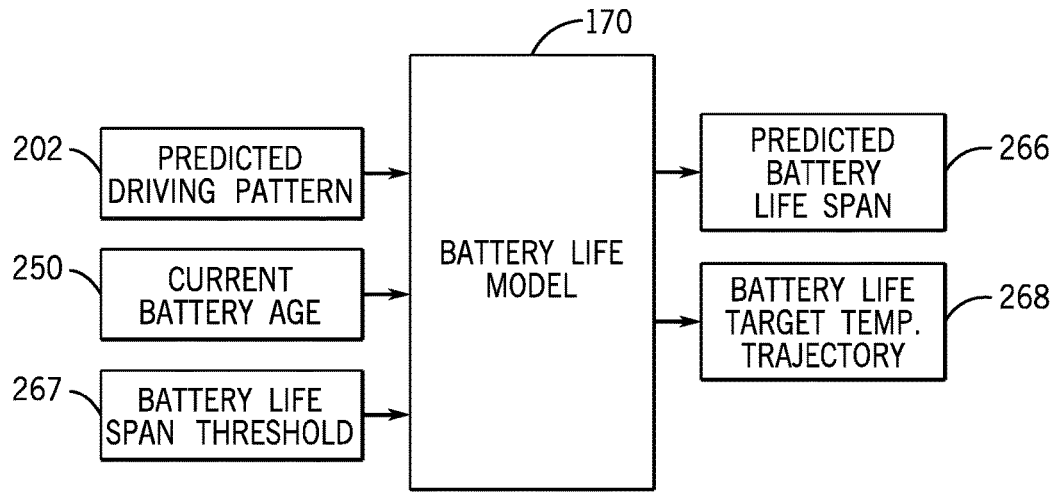
FIG. 26
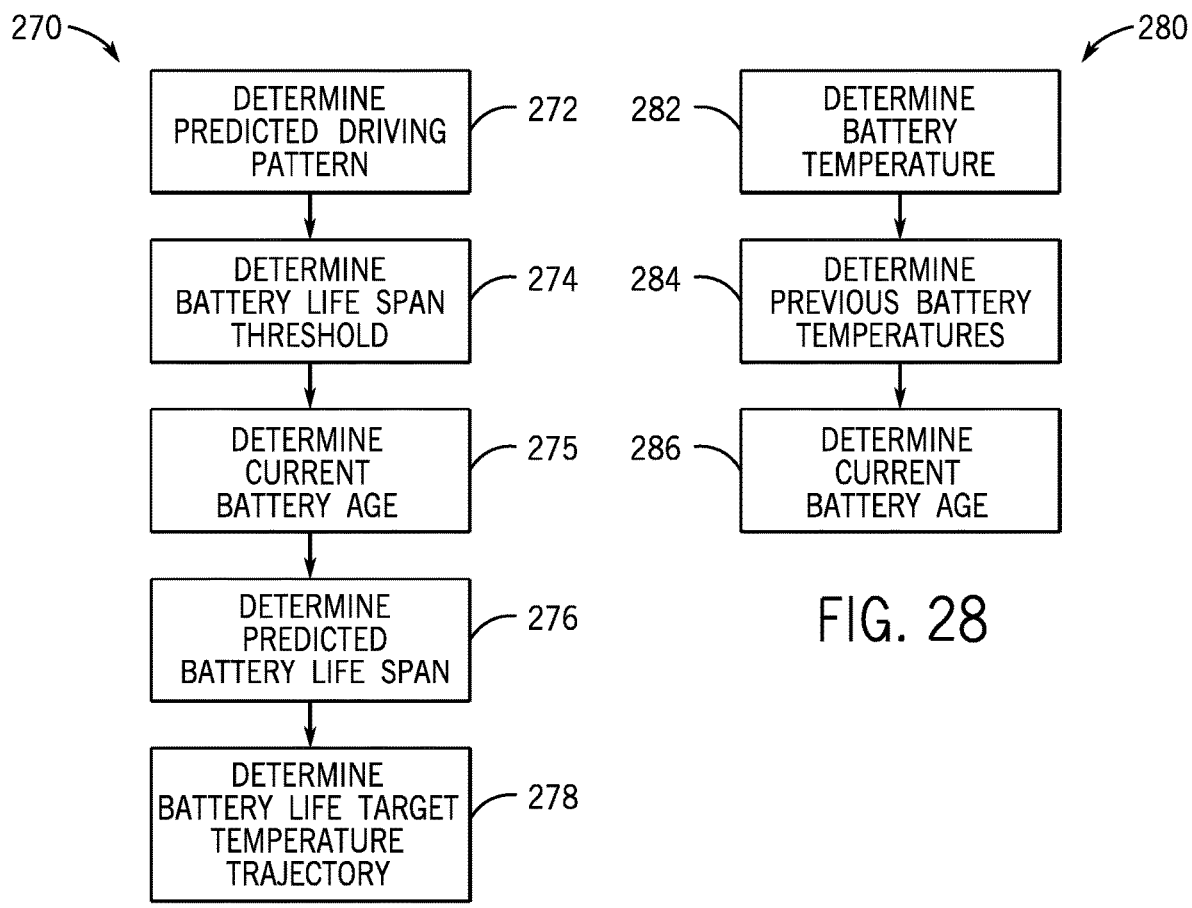
FIG. 27
FIG. 28

COOLING STRATEGY FOR BATTERY SYSTEMS

CROSS-REFERENCE TO RELATED APPLICATIONS

This application is a continuation of U.S. patent application Ser. No. 14/788,223 filed Jun. 30, 2015, now U.S. Pat. No. 10,099,562, which claims priority to and benefit of U.S. Provisional Application No. 62/064,318 filed Oct. 15, 2014 and U.S. Provisional Application No. 62/075,140 filed Nov. 4, 2014, each of which is hereby incorporated herein by reference in its entirety for all purposes.

BACKGROUND

The present disclosure relates generally to the field of batteries and battery systems. More specifically, the present disclosure relates to management of operational parameters in a lithium ion battery.

This section is intended to introduce the reader to various aspects of art that may be related to various aspects of the present disclosure, which are described below. This discussion is believed to be helpful in providing the reader with background information to facilitate a better understanding of the various aspects of the present disclosure. Accordingly, it should be understood that these statements are to be read in this light, and not as admissions of prior art.

An automotive vehicle that uses one or more battery systems for providing all or a portion of the motive power for the vehicle can be referred to as an xEV, where the term "xEV" is defined herein to include all of the following vehicles, or any variations or combinations thereof, that use electric power for all or a portion of their vehicular motive force. For example, xEVs include electric vehicles (EVs) that utilize electric power for all motive force. As will be appreciated by those skilled in the art, hybrid electric vehicles (HEVs), also considered xEVs, combine an internal combustion engine propulsion system and a battery-powered electric propulsion system, such as 48 Volt (V) or 130V systems.

The term HEV may include any variation of a hybrid electric vehicle. For example, full hybrid systems (FHEVs) may provide motive and other electrical power to the vehicle using one or more electric motors, using only an internal combustion engine, or using both. In contrast, mild hybrid systems (MHEVs) may disable the internal combustion engine when the vehicle is idling and utilize a battery system to continue powering the air conditioning unit, radio, or other electronics, as well as to restart the engine when propulsion is desired. The mild hybrid system may also apply some level of power assist, during acceleration for example, to supplement the internal combustion engine.

Further, a micro-hybrid electric vehicle (mHEV) also uses a "Stop-Start" system similar to the mild hybrids, but the micro-hybrid systems of a mHEV may or may not supply power assist to the internal combustion engine and operates at a voltage below 60V. For the purposes of the present discussion, it should be noted that mHEVs may not technically use electric power provided directly to the crankshaft or transmission for any portion of the motive force of the vehicle, but an mHEV may still be considered as an xEV since it does use electric power to supplement a vehicle's power needs when the vehicle is idling with internal combustion engine disabled.

In addition, a plug-in electric vehicle (PEV) is any vehicle that can be charged from an external source of electricity, such as wall sockets, and the energy stored in the rechargeable battery packs drives or contributes to drive the wheels. PEVs are a subcategory of EVs that include all-electric or battery electric vehicles (BEVs), plug-in hybrid electric vehicles (PHEVs), and electric vehicle conversions of hybrid electric vehicles and conventional internal combustion engine vehicles.

xEVs as described above may provide a number of advantages as compared to more traditional gas-powered vehicles using only internal combustion engines and traditional electrical systems, which are typically 12V systems powered by a lead-acid battery. In fact, xEVs may produce fewer undesirable emission products and may exhibit greater fuel efficiency as compared to traditional internal combustion vehicles. For example, some xEVs may utilize regenerative braking to generate and store electrical energy as the xEV decelerates or coasts. More specifically, as the xEV reduces in speed, a regenerative braking system may convert mechanical energy into electrical energy, which may then be stored and/or used to power to the xEV.

Often, a lithium ion battery may be used to facilitate efficiently capturing the generated electrical energy. More specifically, the lithium ion battery may capture/store electrical energy during regenerative braking and subsequently supply electrical power to the vehicle's electrical system. However, as the lithium ion battery operates, operational parameters of the lithium ion battery may change. For example, the temperature of the lithium ion battery may increase over operation of the vehicle. It is now recognized that temperature of a lithium ion battery may affect performance and/or life span of the battery. For example, temperature increases may decrease life span of the battery, decrease fuel economy contribution of the battery, place the battery in an undesired operating range, or any combination thereof.

SUMMARY

Certain embodiments commensurate in scope with the disclosed subject matter are summarized below. These embodiments are not intended to limit the scope of the disclosure, but rather these embodiments are intended only to provide a brief summary of certain disclosed embodiments. Indeed, the present disclosure may encompass a variety of forms that may be similar to or different from the embodiments set forth below.

Accordingly, a first embodiment describes a battery system used in an automotive vehicle. The battery system includes a first battery module coupled to a regenerative braking system. The battery system also includes a control module that controls operation of the battery system by: determining a predicted driving pattern of the automotive vehicle over a prediction horizon using a driving pattern recognition model based at least in part on a battery current and a previous driving pattern of the automotive vehicle; determining a predicted battery resistance of the first battery module over the prediction horizon using a recursive battery model based at least in part on the predicted driving pattern, the battery current, a present bus voltage, and a previous bus voltage; determining a target trajectory of a battery temperature of the first battery module over a control horizon using an objective function to balance effects of the battery temperature on aspects of the first battery module; and controlling magnitude and duration of electrical power supplied from the regenerative braking system to the first battery module such that a predicted trajectory of the battery temperature is guided toward the target trajectory of the battery temperature during the control horizon.

Additionally, a second embodiment describes a tangible non-transitory, computer readable medium of a lithium ion battery system that stores instructions executable by a processor in an automotive vehicle. The instructions include instructions to determine, using the processor, temperature of a lithium ion battery module; determine, using the processor, a temperature threshold; instruct, using the processor, an electrical energy generator to output a high electrical power when the temperature of the lithium ion battery module is not greater than the temperature threshold to enable the lithium ion battery system to utilize a first amount of storage capacity to capture generated electrical energy; and instruct, using the processor, the electrical energy generator to output a low electrical power when the temperature of the lithium ion battery module is greater than the temperature threshold to enable the lithium ion battery system to utilize a second amount of storage capacity to capture generated electrical energy, in which the second amount is less than the first amount.

Furthermore, a third embodiment describes a method for controlling temperature of a battery system. The method includes determining, using a control module, temperature of a lithium ion battery module in the battery system; determining, using the control module, a temperature threshold and a target trajectory of the temperature over a control horizon; determining, using the control module, battery parameter setpoints based at least in part on a thermal predictive model, in which the thermal predictive model is configured to describe a relationship between the battery parameter setpoints and a predicted trajectory of the temperature over a prediction horizon; and controlling, using the control module, operation of the battery system to implement the battery parameter setpoints such that the predicted trajectory of the temperature is guided toward the target trajectory and maintained below the temperature threshold over the control horizon.

DRAWINGS

These and other features, aspects, and advantages of the present disclosure will become better understood when the following detailed description is read with reference to the accompanying drawings in which like characters represent like parts throughout the drawings, wherein:

FIG. 26 is a block diagram of a battery life model used in the control module of FIG. 18, in accordance with an embodiment;

FIG. 27 is a flow diagram describing a process for determining a predicted battery life span using the battery life model of FIG. 26, in accordance with an embodiment;

FIG. 28 is a flow diagram describing a process for determining a current battery age using the recursive battery model of FIG. 24, in accordance with an embodiment;

DETAILED DESCRIPTION

Figure 1:
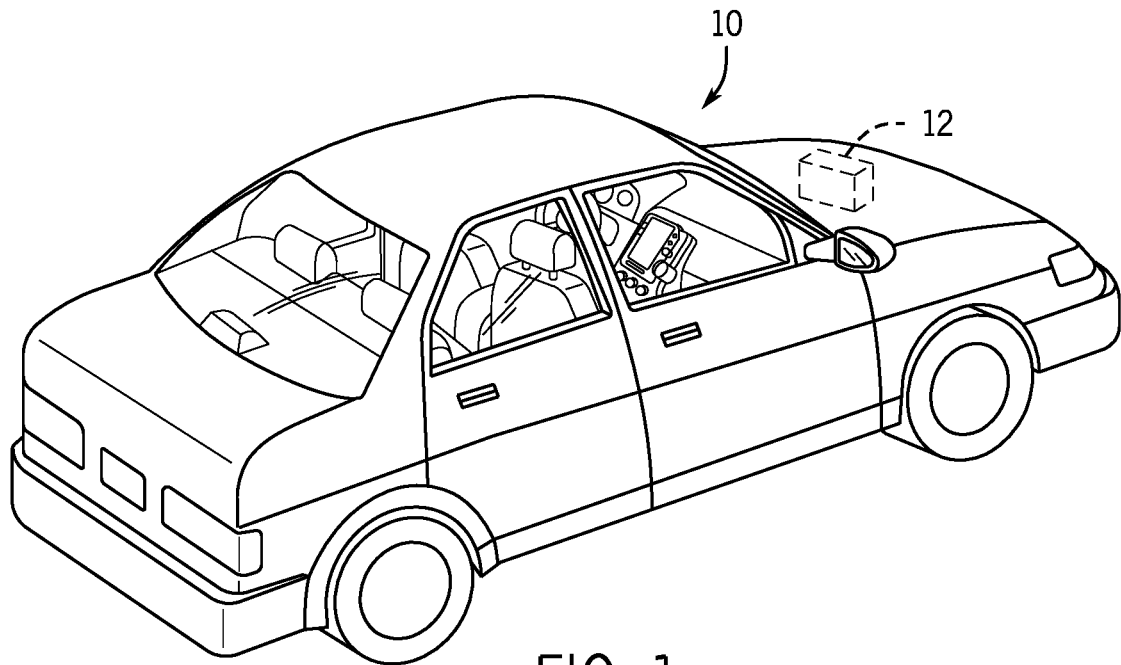
FIG. 1 is a perspective view of a vehicle, in accordance with an embodiment.

One or more specific embodiments of the present techniques will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

The battery systems described herein may be used to provide power to various types of electric vehicles (xEVs) and other high voltage energy storage/expending applications (e.g., electrical grid power storage systems). For example, xEVs may include regenerative braking systems to capture and store electrical energy generated when the vehicle is decelerating or coasting. The captured electrical energy may then be utilized to supply power to the vehicle's electrical system. As another example, battery modules in accordance with present embodiments may be incorporated with or provide power to stationary power systems (e.g., non-automotive systems).

In some embodiments, the battery system may include a lithium ion battery coupled in parallel with one or more other batteries, such as a lead-acid battery, to capture generated electrical energy and supply electrical power to electrical devices. In some embodiments, electrical energy may be generated by a regenerative braking system that converts mechanical energy into electrical energy. The lithium ion battery may then be used to capture and store the electrical energy generated during regenerative braking. Subsequently, the lithium ion battery may supply electrical power to a vehicle's electrical system.

Based on the advantages over traditional gas-power vehicles, manufacturers that generally produce traditional gas-powered vehicles may desire to utilize improved vehicle technologies (e.g., regenerative braking technology) within their vehicle lines. Often, these manufacturers may utilize one of their traditional vehicle platforms as a starting point. Accordingly, since traditional gas-powered vehicles are designed to utilize 12 volt battery systems, a 12 volt lithium ion battery may be used to supplement a 12 volt lead-acid battery. More specifically, the 12 volt lithium ion battery may be used to more efficiently capture electrical energy generated during regenerative braking and subsequently supply electrical energy to power the vehicle's electrical system. Additionally, in a mHEV, the internal combustion engine may be disabled when the vehicle is idle. Accordingly, the 12 volt lithium ion battery may be used to crank (e.g., restart) the internal combustion engine when propulsion is desired.

However, as advancements are made in vehicle technologies, high voltage electrical devices may be included in the vehicle's electrical system. For example, the lithium ion battery may supply electrical energy to an electric motor in a FHEV. Often, these high voltage electrical devices utilize voltages greater than 12 volts, for example, up to 48, 96, or 130 volts. Accordingly, in some embodiments, the output voltage of a 12 volt lithium ion battery may be boosted using a DC-DC converter to supply power to the high voltage devices. Additionally or alternatively, a 48 volt lithium ion battery may be used to supplement a 12 volt lead-acid battery. More specifically, the 48 volt lithium ion battery may be used to more efficiently capture electrical energy generated during regenerative braking and subsequently supply electrical energy to power the high voltage devices.

Thus, the design choice regarding whether to utilize a 12 volt lithium ion battery or a 48 volt lithium ion battery may depend directly on the electrical devices included in a particular vehicle. Although the voltage characteristics may differ, the operational principles of a 12 volt lithium ion battery and a 48 volt lithium ion battery are generally similar. More specifically, as described above, both may be used to capture electrical energy during regenerative braking and subsequently supply electrical power to electrical devices in the vehicle. Additionally, as both operate over a period of time, the operational parameters may change. For example, the temperature of the lithium ion battery may increase the longer the lithium ion battery is in operation.

Accordingly, to simplify the following discussion, the present techniques will be described in relation to a battery system with a 12 volt lithium ion battery and a 12 volt lead-acid battery. However, one of ordinary skill in art should be able to adapt the present techniques to other battery systems, such as a battery system with a 48 volt lithium ion battery and a 12 volt lead-acid battery.

As described above, the operational parameters of a lithium ion battery may change over operation of the vehicle. For example, the temperature of the lithium ion battery may gradually increase during operation. More specifically, charging and/or discharging the lithium ion battery may generate heat. As such, repeatedly charging and discharging the lithium ion battery may increase the temperature of the lithium ion battery. Generally, a lithium ion battery may be designed to function over a wide range of operating temperatures. However, when the temperature reaches an upper threshold (e.g., 70° Celsius) or increases at a fast rate, the performance and/or life span of the lithium ion battery may be affected. For example, increased battery temperature may reduce energy capture efficiency of the lithium ion battery and/or increase internal resistance a faster rate, which may shorten lifespan of the lithium ion battery.

Accordingly, the present disclosure describes techniques to facilitate controlling operational parameters of the lithium ion battery. For example, as will be described in more detail below, a control module may instruct the battery system to implement battery parameter setpoints to de-rate and/or re-rate the battery system. In some embodiments, the battery parameter setpoints may include charging power (e.g., current or voltage) setpoints, discharging power setpoints, or any combination thereof. More specifically, the battery system may be de-rated to reduce the operation of the lithium ion battery (e.g., number of charge and discharge cycles). In this manner, the heat caused by charging/discharging may be reduced, which may facilitate cooling the lithium ion battery. Once the lithium ion battery has been sufficiently cooled, the battery system may be re-rated to resume normal operation of the lithium ion battery. In other words, the lithium ion battery may increase the amount of charging and/or discharging performed.

Additionally, as will be described in more detail below, the present disclosure provides techniques for both reactive and intelligent (e.g., predictive) control schemes of lithium ion battery temperature. For example, in a reactive control scheme, a control module may de-rate the battery system when temperature of the lithium ion battery reaches a temperature threshold or increases faster than a threshold rate, thereby reducing operation of the lithium ion battery. Once the temperature of the lithium ion battery falls below a temperature threshold, the control module may re-rate the battery system, thereby resuming maximum operation of the lithium ion battery. In other words, in a reactive scheme, the control module may de-rate and re-rate the battery system based on a current temperature of the lithium ion battery.

On the other hand, in an intelligent control scheme, a control module may de-rate and re-rate the battery system based at least in part on a predicted trajectory of lithium ion battery temperature, for example, determined via a thermal predictive model. In some embodiments, the control module may de-rate the battery system when the predicted trajectory of lithium ion battery temperature is expected to reach a temperature threshold or is expected to increase faster than a threshold rate, thereby decreasing magnitude of the future lithium ion battery temperature. Once the predicted trajectory of lithium ion battery temperature falls below a temperature threshold, the control module may re-rate the battery system.

Thus, embodiments of the techniques described herein enable operational parameters of the lithium ion battery, such as temperature, amount of stored energy, and/or duration of operation, to be controlled to improve performance (e.g., energy capture efficiency) and/or life span of the battery system. For example, as will be described in more detail below, de-rating and re-rating the battery system may supplement a cooling system, such as cooling fins. In fact, in some embodiments, de-rating and re-rating techniques may enable the battery system to rely solely on passive cooling features, which may reduce bulkiness of the battery system as well as manufacturing complexity and cost of the battery system.

To help illustrate, FIG. 1 is a perspective view of an embodiment of a vehicle 10, which may utilize a regenerative braking system. Although the following discussion is presented in relation to vehicles with regenerative braking systems, the techniques described herein are adaptable to other vehicles that capture/store electrical energy with a battery, which may include electric-powered and gas-powered vehicles.

As discussed above, it would be desirable for a battery system 12 to be largely compatible with traditional vehicle designs. Accordingly, the battery system 12 may be placed in a location in the vehicle 10 that would have housed a traditional battery system. For example, as illustrated, the vehicle 10 may include the battery system 12 positioned similarly to a lead-acid battery of a typical combustion-engine vehicle (e.g., under the hood of the vehicle 10). Furthermore, as will be described in more detail below, the battery system 12 may be positioned to facilitate managing temperature of the battery system 12. For example, in some embodiments, positioning a battery system 12 under the hood of the vehicle 10 may enable an air duct to channel airflow over the battery system 12 and cool the battery system 12.

Figure 2:
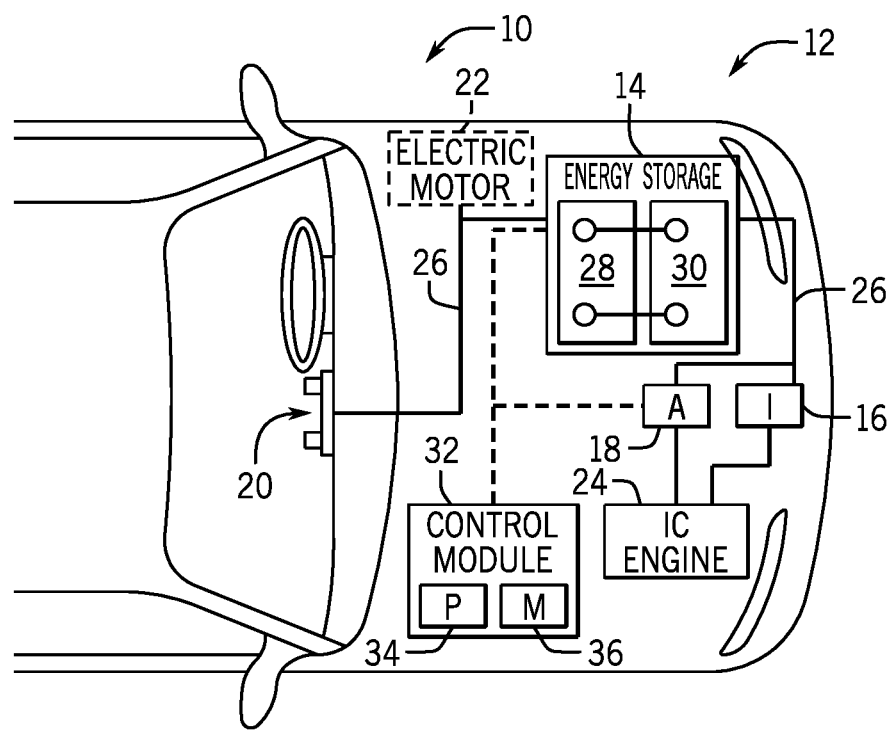
FIG. 2 is a schematic view of a battery system in the vehicle of FIG. 1, in accordance with an embodiment.

A more detailed view of the battery system 12 is described in FIG. 2. As depicted, the battery system 12 includes an energy storage component 14 coupled to an ignition system 16, an alternator 18, a vehicle console 20, and optionally to an electric motor 22. Generally, the energy storage component 14 may capture/store electrical energy generated in the vehicle 10 and output electrical energy to power electrical devices in the vehicle 10.

In other words, the battery system 12 may supply power to components of the vehicle's electrical system, which may include radiator cooling fans, climate control systems, electric power steering systems, active suspension systems, auto park systems, electric oil pumps, electric super/turbochargers, electric water pumps, heated windscreen/defrosters, window lift motors, vanity lights, tire pressure monitoring systems, sunroof motor controls, power seats, alarm systems, infotainment systems, navigation features, lane departure warning systems, electric parking brakes, external lights, or any combination thereof. Illustratively, in the depicted embodiment, the energy storage component 14 supplies power to the vehicle console 20 and the ignition system 16, which may be used to start (e.g., crank) the internal combustion engine 24.

Additionally, the energy storage component 14 may capture electrical energy generated by the alternator 18 and/or the electric motor 22. In some embodiments, the alternator 18 may generate electrical energy while the internal combustion engine 24 is running. More specifically, the alternator 18 may convert the mechanical energy produced by the rotation of the internal combustion engine 24 into electrical energy. Additionally or alternatively, when the vehicle 10 includes an electric motor 22, the electric motor 22 may generate electrical energy by converting mechanical energy produced by the movement of the vehicle 10 (e.g., rotation of the wheels) into electrical energy. Thus, in some embodiments, the energy storage component 14 may capture electrical energy generated by the alternator 18 and/or the electric motor 22 during regenerative braking. As such, the alternator 18 and/or the electric motor 22 are generally referred to herein as electrical energy generators.

To facilitate capturing and supplying electric energy, the energy storage component 14 may be electrically coupled to the vehicle's electric system via a bus 26. For example, the bus 26 may enable the energy storage component 14 to receive electrical energy generated by the alternator 18 and/or the electric motor 22. Additionally, the bus 26 may enable the energy storage component 14 to output electrical power to the ignition system 16 and/or the vehicle console 20. Accordingly, when a 12 volt battery system 12 is used, the bus 26 may carry electrical power typically between 8-18 volts.

Additionally, as depicted, the energy storage component 14 may include multiple battery modules. For example, in the depicted embodiment, the energy storage component 14 includes a lithium ion (e.g., a first) battery module 28 and a lead-acid (e.g., a second) battery module 30, which each includes one or more battery cells. In other embodiments, the energy storage component 14 may include any number of battery modules. Additionally, although the lithium ion battery module 28 and lead-acid battery module 30 are depicted adjacent to one another, they may be positioned in different areas around the vehicle. For example, the lead-acid battery module 30 may be positioned in or about the interior of the vehicle 10 while the lithium ion battery module 28 may be positioned under the hood of the vehicle 10.

In some embodiments, the energy storage component 14 may include multiple battery modules to utilize multiple different battery chemistries. For example, the lithium ion battery module 28 may improve performance of the battery system 12 since a lithium ion battery chemistry generally has a higher coulombic efficiency and/or a higher power charge acceptance rate (e.g., higher maximum charge current or charge voltage) than a lead-acid battery chemistry. As such, the capture, storage, and/or distribution efficiency of the battery system 12 may be improved.

To facilitate controlling the capturing and storing of electrical energy, the battery system 12 may additionally include a control module 32. More specifically, the control module 32 may control operations of components in the battery system 12, such as relays (e.g., switches) within energy storage component 14, the alternator 18, and/or the electric motor 22. For example, the control module 32 may regulate amount of electrical energy captured/supplied by each battery module 28 or 30 (e.g., to de-rate and re-rate the battery system 12), perform load balancing between the battery modules 28 and 30, determine a state of charge of each battery module 28 or 30, determine temperature of each battery module 28 or 30, determine a predicted temperature trajectory of either battery module 28 and 30, determine predicted life span of either battery module 28 or 30, determine fuel economy contribution by either battery module 28 or 30, control magnitude of voltage or current output by the alternator 18 and/or the electric motor 22, and the like.

Accordingly, the control module (e.g., unit) 32 may include one or processor 34 and one or more memory 36. More specifically, the one or more processor 34 may include one or more application specific integrated circuits (ASICs), one or more field programmable gate arrays (FPGAs), one or more general purpose processors, or any combination thereof. Additionally, the one or more memory 36 may include volatile memory, such as random access memory (RAM), and/or non-volatile memory, such as read-only memory (ROM), optical drives, hard disc drives, or solid-state drives. In some embodiments, the control module 32 may include portions of a vehicle control unit (VCU) and/or a separate battery control module.

Furthermore, as depicted, the lithium ion battery module 28 and the lead-acid battery module 30 are connected in parallel across their terminals. In other words, the lithium ion battery module 28 and the lead-acid battery module 30 may be coupled in parallel to the vehicle's electrical system via the bus 26. To help illustrate, embodiments of the lithium ion module 28 and the lead-acid battery module 30 coupled in parallel are described in FIGS. 3 and 4.

Figure 3:
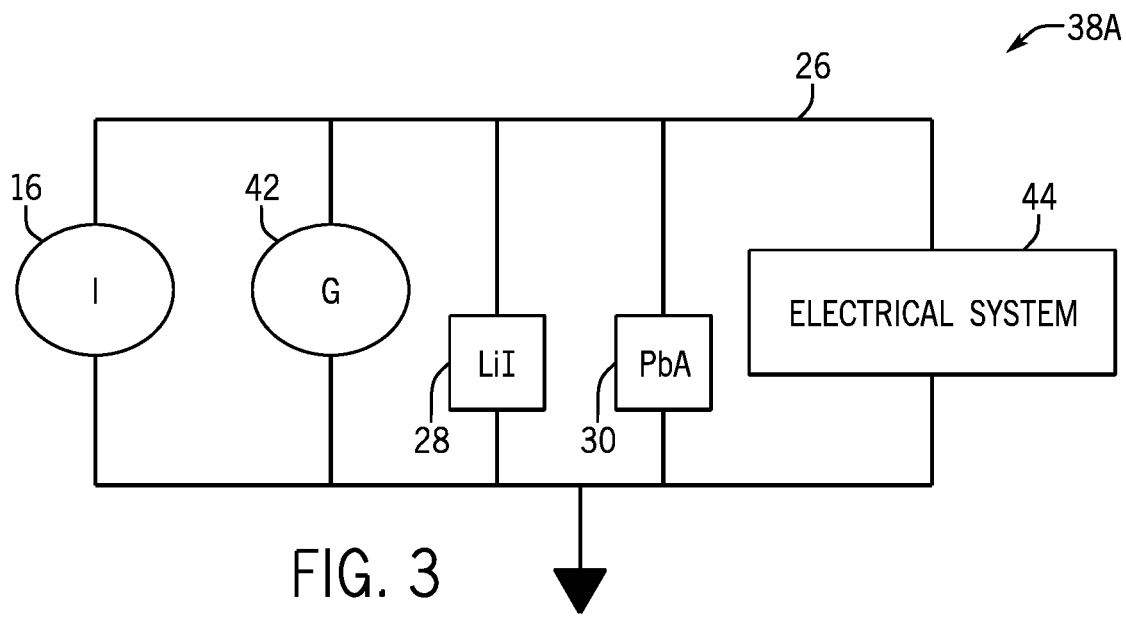
FIG. 3 is a schematic diagram of a passive architecture for the battery system of FIG. 2, in accordance with an embodiment.
Figure 4:
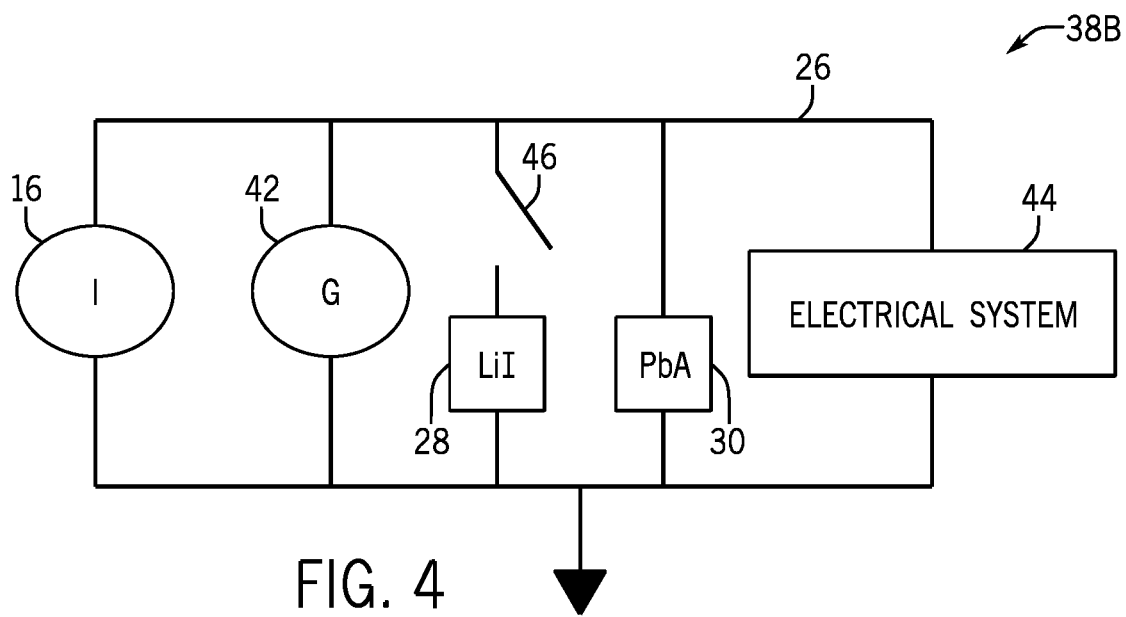
FIG. 4 is a schematic diagram of a semi-passive architecture for the battery system of FIG. 2, in accordance with an embodiment.

More specifically, FIG. 3 describes the lithium ion battery module 28 and the lead-acid battery module 30 in a passive parallel architecture battery system 38A and FIG. 4 describes the lithium ion battery module 28 and the lead-acid battery module 30 in a semi-passive parallel architecture battery system 38B. As depicted, in both architectures the lead-acid battery module 30 and the lithium ion battery module 28 are coupled in parallel with the ignition system 16, an electrical energy generator 42 (e.g., the electric motor 22 and/or alternator 18), and the vehicle's electrical system 44 via the bus 26. However, in the semi-passive battery system 38B the lithium ion battery module 28 may be selectively coupled to the bus 26 via a relay 46 (e.g., switch) in series with the lithium ion battery 28 while, in the passive battery system 38A, the lead-acid battery module 30 and the lithium ion battery module 28 are both directly coupled to the bus 26.

Accordingly, in the passive battery system 38A, the operation of the battery module 30 and the lithium ion battery module 28 may be based at least in part on characteristics of each of the batteries. More specifically, the charging of the batteries 28 and 30 may be controlled by characteristics of the lithium ion battery module 28 and the lead-acid battery module 30 and/or the power (e.g., voltage or current) output by the electrical energy generator 42. For example, when the lead-acid battery module 30 is fully charged or close to fully charged (e.g., generally full state of charge), the lead-acid battery module 30 may have a high internal resistance that steers current toward the lithium ion battery module 28. Additionally, when the open-circuit voltage of the lithium ion battery module 28 is higher than the voltage output by the electrical energy generator 42, the lithium ion battery module 28 may cease capturing additional electrical energy.

Similarly, the discharging of the batteries 28 and 30 may also be based at least in part on characteristics of the lithium ion battery module 28 and the lead-acid battery module 30. For example, when the open-circuit voltage of the lithium ion battery module 28 is higher than the open-circuit voltage of the lead-acid battery module 30, the lithium ion battery module 28 may provide power by itself, for example to the electrical system 44, until it nears the open-circuit voltage of the lead-acid battery module 30.

As can be appreciated, the characteristics of the lithium ion battery module 28 may vary when different configurations (e.g., chemistries) are used. In some embodiments, the lithium ion battery module 28 may be a lithium nickel manganese cobalt oxide (NMC) battery, a lithium nickel manganese cobalt oxide/lithium-titanate (NMC/LTO) battery, a lithium manganese oxide/lithium-titanate (LMO/LTO) battery, a nickel-metal hydride (NiMH) battery, a nickel-zinc (NiZn) battery, a lithium iron phosphate (LFP) battery, or the like. More specifically, an NMC battery may utilize battery cells 56 having a lithium nickel manganese cobalt oxide cathode with a graphite anode, an NMC/LTO battery may utilize battery cells having a lithium manganese oxide cathode with a lithium-titanate anode, an LMO/LTO battery may utilize battery cells having a lithium manganese oxide cathode and a lithium-titanate anode, and an LFP battery may utilize battery cells having a lithium iron phosphate cathode and a graphite anode.

The battery chemistries utilized in the lithium ion battery module 28 may be selected based on desired characteristics, such as coulombic efficiency, charge acceptance rate, power density, and voltage overlap with the lead-acid battery. For example, the NMC/LTO battery chemistry may be selected due to its high specific power at 50% state of charge (e.g., 3700 W/kg) and/or due to its high discharge current (e.g., 350A), which may enable the lithium ion battery module 28 to supply a greater amount of electrical power, for example, to power a high voltage device.

Although the techniques described herein may be adapted to a number of different battery chemistries, to simplify the following discussion, the lithium ion battery module 28 will be described as an NMC/LTO battery. To help illustrate the operation (e.g., charging/discharging) of the batteries 28 and 30, the voltage characteristics of the lithium ion battery module 28 and the lead-acid battery module 30 in a 12 volt battery system 12 are described in FIG. 5. It should be appreciated that the voltage characteristics described in FIG. 5 are merely intended to be illustrative and not limiting.

Figure 5:
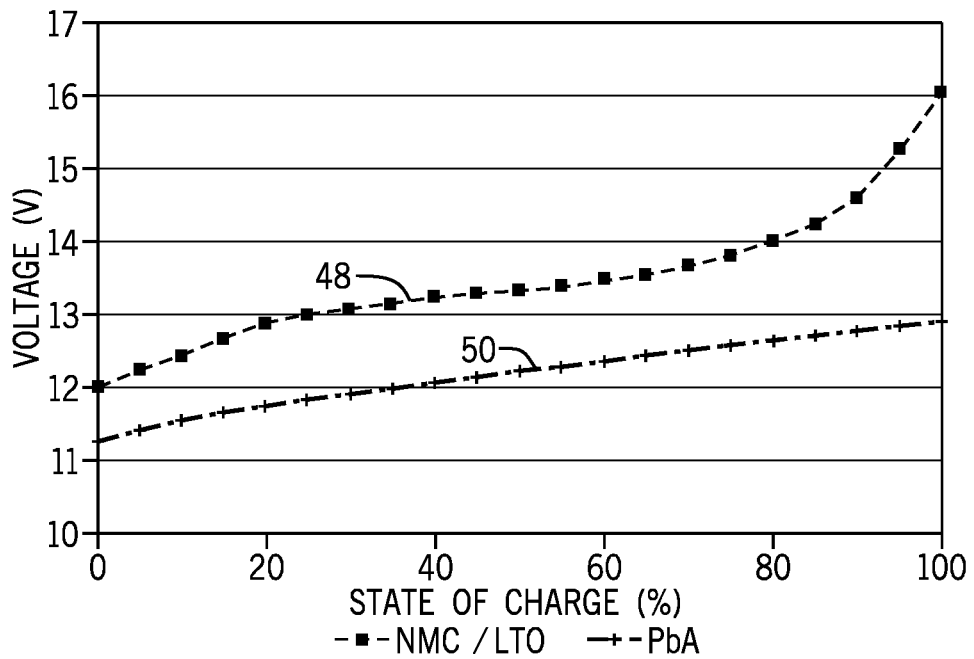
FIG. 5 is a graph describing voltage characteristics of a lithium ion battery and a lead-acid battery used in the battery system of FIG. 2, in accordance with an embodiment.

More specifically, FIG. 5 is a plot that describes the open-circuit voltage of the lithium ion battery module 28 with a NMC/LTO voltage curve 48 and the open-circuit voltage of the lead-acid battery module 30 with a PbA voltage curve 50 over the batteries' total state of charge ranges (e.g., from 0% state of charge to 100% state of charge), in which state of charge is shown on the X-axis and voltage is shown on the Y-axis. As described by the NMC/LTO voltage curve 48, the open-circuit voltage of the lithium ion battery module 28 may range from 12 volts when it is at 0% state of charge to 16.2 volts when it is at 100% state of charge. Additionally, as described by the PbA voltage curve 50, the open-circuit voltage of the lead-acid battery module 30 may range from 11.2 volts when it is at 0% state of charge to 12.9 volts when it is at 100% state of charge.

As such, the lithium ion battery module 28 and the lead-acid battery module 30 may be partial voltage matched because the NMC/LTO voltage curve 48 and the lead-acid voltage curve 50 partially overlap. In other words, depending on their respective states of charge, the open-circuit voltage of the lead-acid battery module 30 and lithium ion battery module 28 may be the same. In the depicted embodiment, the lead-acid battery module 30 and the lithium ion battery module 28 may be at approximately the same open-circuit voltage when they are both between 12-12.9 volts. For example, when the lithium ion battery module 28 is at 25% state of charge and the lead-acid battery module 30 is at a 100% state of charge, both will have an open-circuit voltage of approximately 12.9 volts. Additionally, when the lithium ion battery is at 15% state of charge and the lead-acid battery is at 85% state of charge, both will have an open-circuit voltage of approximately 12.7 volts.

Thus, returning to FIG. 3, the operation of the electrical energy generator 42 may be used to control operation of the battery system 12. For example, when the electrical energy generator 42 has a variable output voltage, the voltage characteristics of the batteries 28 and 30 and/or the voltage output by the electrical energy generator 42 may be used to control operation of the battery system 12. More specifically, when the voltage output by the electrical energy generator 42 is variable (e.g., a range of output voltages between 8-18 volts), the amount of charging/discharging performed and the amount of energy stored in the lithium ion battery module 28 may be controlled by determining a specific voltage to be output by the electrical energy generator 42. For example, when the electrical energy generator 42 outputs a voltage greater than or equal to 16.2 volts, both the lithium ion battery module 28 and the lead-acid battery module 30 may both utilize their full storage capacity (e.g., first amount of storage capacity up 100% state of charge) to capture generated electrical energy.

However, as described above, the amount of charging/discharging performed by the lithium ion battery module 28 may increase the temperature of the lithium ion battery module 28 over time. As such, the temperature of the lithium ion battery module 28 may be regulated by de-rating the battery system 12. More specifically, as will be described in more detail below, the battery system 12 may be de-rated by limiting the amount of charging/discharging performed by the lithium ion battery module 28.

For example, the voltage output by the electrical energy generator 42 may be reduced to 12.9 volts so that the lithium ion battery module 28 is limited to capturing electrical energy up to 25% state of charge (e.g., second amount of storage capacity). The voltage output by the electrical energy generator 42 may further be reduced to 12.7 volts so that the lithium ion battery module 28 is limited to capturing electrical energy up to 15% state of charge (e.g., second amount of storage capacity) and the lead-acid battery module 30 is limited to capturing electrical energy up to 85% state of charge. In this manner, since the maximum state of charge of the lithium ion battery module 28 may be reduced, the amount of charging/discharging performed by the lithium ion battery module 28 may also be reduced. As such, controlling the voltage output by the electrical energy generator 42 may enable de-rating the battery system 12.

In addition to the output voltage, other operational characteristics of the electrical energy generator 42 may also be used to control operation of the battery system 12. In some embodiments, electrical energy generator 42 has a fixed output voltage (e.g., 13.3 volts) or an output voltage with a small window of variation (e.g., between 13-13.3 volts). In such embodiments, the electrical energy generator 42 may control operation of the battery system 12 by controlling magnitude of the current generated and/or the duration electrical energy is being generated.

For example, when the electrical energy generator 42 outputs 12.9 volts at 200 amps and the batteries are connected in parallel, the lithium ion battery module 28 may capture regenerative energy up to 25% state of charge and the lead-acid battery module 30 may capture regenerative energy up to 100% state of charge. Accordingly, to de-rate the battery system 12, the electrical energy generator 42 may maintain the lead-acid battery module 30 and the lithium ion battery module 28 at a lower (e.g., target) state of charge, which may reduce the amount of charging/discharging performed by the lithium ion battery module 28 since less energy is stored in the batteries 28 and 30. For example, the electrical energy generator 42 may reduce the output current to 150 amps so that the lithium ion battery module 28 may only be charged to 15% state of charge and the lead-acid battery module 30 may only be charged to 85% state of charge. Additionally or alternatively, the electrical energy generator 42 may cease generating electrical energy once the batteries 28 and 30 reach their target states of charge.

Additionally, in some embodiments, the relay 46 may also be used to control operation of the battery system 12, for example, in the semi-passive battery system 38B of FIG. 4. More specifically, the described relay 46 may be a bi-stable relay. For example, the relay 46 may include a first state to connect the lithium ion battery module 28 in parallel with the lead-acid battery module 30. As such, in the first state, the semi-passive battery system 38B may operate generally the same as the passive battery system 38A. For example, when the relay 46 is in the first state and the electrical energy generator 42 has a variable output voltage, battery system 12 may be de-rated by controlling the voltage output by the electrical energy generator 42.

Additionally, the relay 46 may include a second state to electrically disconnect the lithium ion battery module 28. More specifically, when the lithium ion battery module 28 is disconnected, it may cease charging/discharging and maintain its state of charge. As such, disconnecting the lithium ion battery module 28 may enable de-rating the battery system 12 to regulate temperature of the lithium ion battery module 28. However, disconnecting the lithium ion battery module 28 may be a dramatic step to take because the lead-acid battery module 30 may be used to supply power to a larger load (e.g., more electrical devices). In some embodiments, this may have an effect on the vehicle performance, such as fuel economy. As such, in some embodiments, disconnecting the lithium ion battery module 28 may be a last resort to regulate temperature of the lithium ion battery module 28, for example, when temperature reaches an upper threshold.

Figure 6:
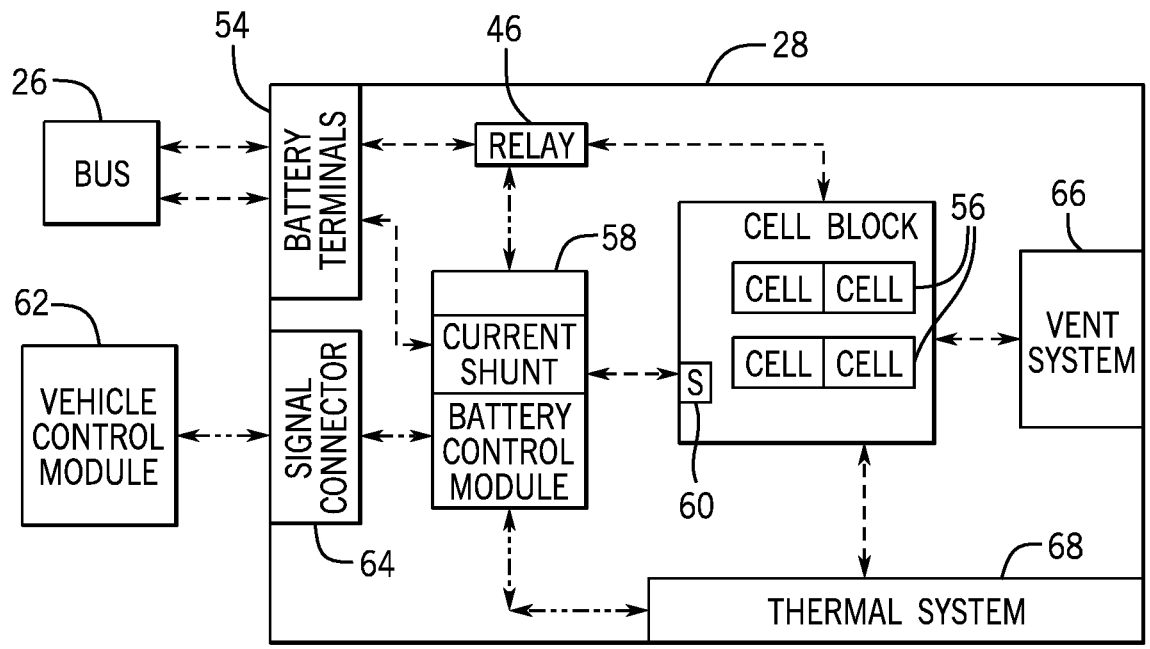
FIG. 6 is a schematic diagram of the lithium ion battery, in accordance with an embodiment.

As described above, the control module 32 may generally control operation of the vehicle 10. In other words, the control module 32 may enable de-rating/re-rating of the battery system 12 by controlling the operation of the electrical energy generator 42 (e.g., output voltage or current) and/or state of the relay 46. In some embodiments, the functions performed by the control module 32 may be split between a battery control module and a vehicle control module. To help illustrate, a block diagram of the lithium ion battery module 28 is described in FIG. 6.

As depicted, the lithium ion battery module 28 is electrically coupled to the bus 26 via battery terminals 54. Additionally, the battery terminals 54 are selectively connected to the battery cells 56 via the relay 46. More specifically, operation of the relay 46 may be controlled by a battery control module 58. For example, the battery control module 58 may instruct the relay 46 to change to a specific state (e.g., the first state or the second state), which may be used to de-rate/re-rate the battery system 12.

As described above, the battery system 12 may be de-rated to regulate temperature of the lithium ion battery module 28, for example, by limiting the amount of charging/discharging performed. Accordingly, the battery control module 58 may be communicatively coupled to one or more sensors 60, which measure operational parameters of the lithium ion battery module 28. For example, the sensors 60 may include a temperature sensor 60, which measures the temperature of the lithium ion battery module 28, and a state of charge sensor, which measures the state of charge of the lithium ion battery module 28. Additionally or alternatively, the sensors 60 may measure other operational parameters that may be used by the battery control module 58 to determine the state of charge of the lithium ion battery module 28, such as a voltage and/or current sensor. For example, using a voltage sensor, the battery control module 58 may determine the state of charge of the lithium ion based on the open-circuit voltage versus state of charge relationship described by the NMC/LTO voltage curve 48.

Additionally, as depicted, the battery control module 58 is communicatively coupled to the vehicle control module 62 via a signal connector 64. More specifically, the battery control module 58 and the vehicle control module 62 may coordinate control to de-rate/re-rate the battery system 12. Accordingly, in some embodiments, the vehicle control module 62 may control operation of the electrical energy generator 42. For example, the vehicle control module 62 may instruct the electrical energy generator 42 to output a particular voltage (e.g., charge voltage and/or current (e.g., charge current). Additionally, the vehicle control module 62 may inform the battery control module 58 when electrical energy is being generated, for example, during regenerative braking.

Furthermore, during repeated charging/discharging of the lithium ion battery module 28, the chemical reactions within the battery module 28 may release gases and produce heat. Accordingly, as depicted, the lithium ion battery module 28 includes a vent system 66, which release the produced gases once the pressure within the battery module 28 reaches a threshold amount. In some embodiments, the vent system 66 may release the produced gas along with the produced heat. Additionally, the lithium ion battery module 28 may include a thermal system 68 to help cool the battery module 28 by exchanging heat with the surround environment.

Figure 7A:
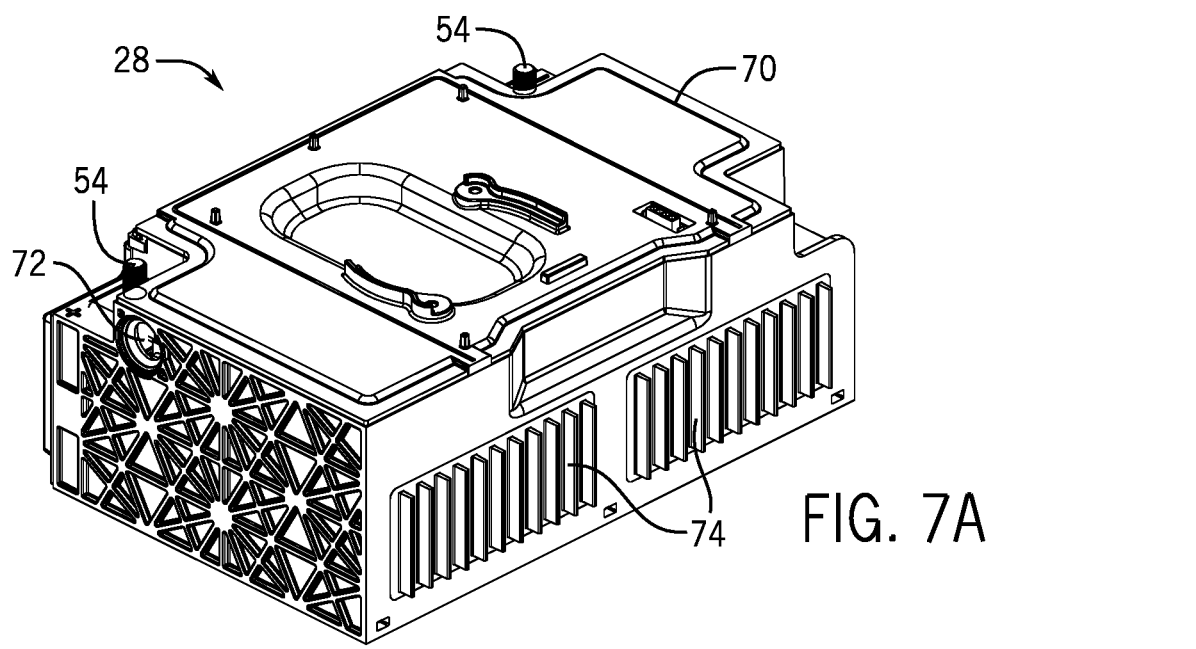
FIG. 7A is a perspective view of a lithium ion battery, in accordance with an embodiment.
Figure 7B:
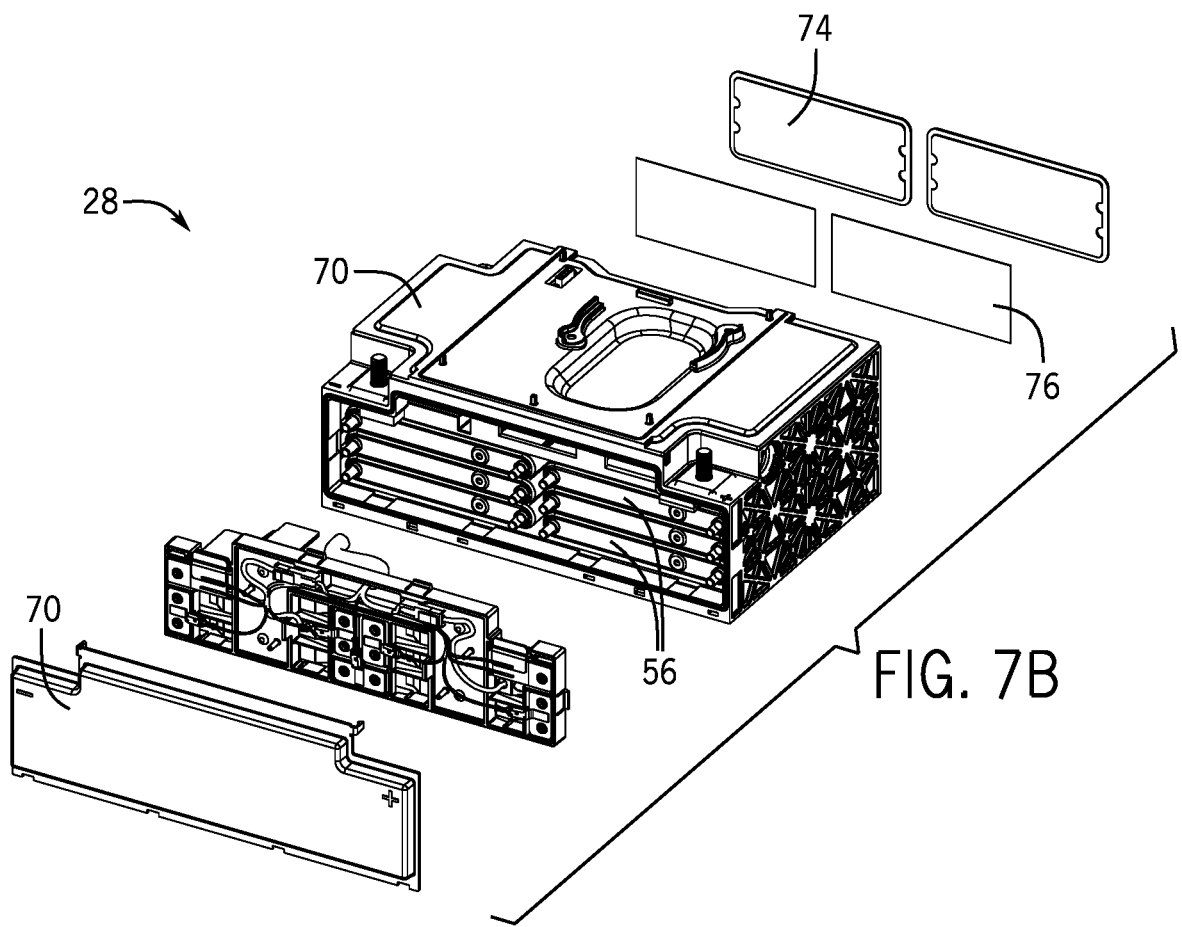
FIG. 7B is an exploded view of the lithium ion battery of FIG. 7A, in accordance with an embodiment.

More specifically, the thermal system 68 may include a passive cooling system, which utilizes passive cooling components, such as a cooling fin. To help illustrate, a lithium ion battery module 28 that utilizes a passive thermal system 68 is shown in FIGS. 7A and 7B. In other words, FIGS. 7A and 7B incorporates features of present embodiments. As depicted in FIG. 7A, the lithium ion battery module 28 includes a housing 70, battery terminals 54, a gas vent 72 (e.g., part of the vent system 66), and cooling fins 74 (e.g., part of the passive thermal system 68). More specifically, the gas vent 72 may be connected to a hose (not depicted), which guides the vent gas to an exhaust. Additionally, the hose connected to the vent 72 may include an over pressure valve (not depicted) to control the flow of vent gas through the exhaust hose. More specifically, the over pressure valve may open to vent gas when a threshold amount of pressure is present.

Additionally, as depicted, the cooling fins 74 are disposed on the side of the battery housing 70. More specifically, the cooling fins 74 may extract heat generated from the battery cells 56 and release heat into the surrounding environment. To help illustrate, an exploded view of the lithium ion battery module 28 is described in FIG. 7B. As depicted, thermal pads 76 may be disposed between the battery cells 56 and the cooling fins 74. In some embodiments, the thermal pads 76 may improve heat extraction from the battery cells 56 by reducing the air gap between the cooling fins 74 and the battery cells 56.

Furthermore, in the depicted embodiment, the cooling fins 74 are separated into two portions. More specifically, the cooling fins 74 may be aligned with the two rows of battery cells 56. In some embodiments, aligning a cooling fin 74 to each row of battery cells 56 may improve heat extraction because a partition that separates the rows generally does not produce heat. As such, extending the cooling fins 74 over the partition may increase production costs and cause a heat gradient to occur, which may reduce heat transfer efficiency.

To facilitate heat exchange with the surrounding environment, the cooling fins 74 may be positioned so that air flows over the cooling fins 74. For example, the cooling fins 74 may be placed next to air ducts in the vehicle, which enables outside air to flow into the vehicle 10. In some embodiments, the ducts may be positioned so that motion of the vehicle 10 cause air to flow into the vehicle 10, remove heat from the cooling fins 74, and exit the vehicle 10.

As such, the vent system 66, which may include the gas vent 72, and the thermal system 68, which include the thermal pad 76, cooling fins 74, may be used to help regulate the temperature of the lithium ion battery module 28. However, in extreme conditions, such as high environmental temperature or a long period of operation, they may still be insufficient to maintain the lithium ion battery module 28 at desired temperatures. As such, the present disclosure utilizes de-rating/re-rating strategies to supplement the cooling provided by the vent system 66 and the thermal system 68. In fact, in some embodiments, the de-rating/re-rating techniques may even enable the lithium ion battery module 28 to utilize only a passively cooled thermal system 68, which may reduce manufacturing complexity and/or costs.

Reactive Control Scheme

Figure 8:
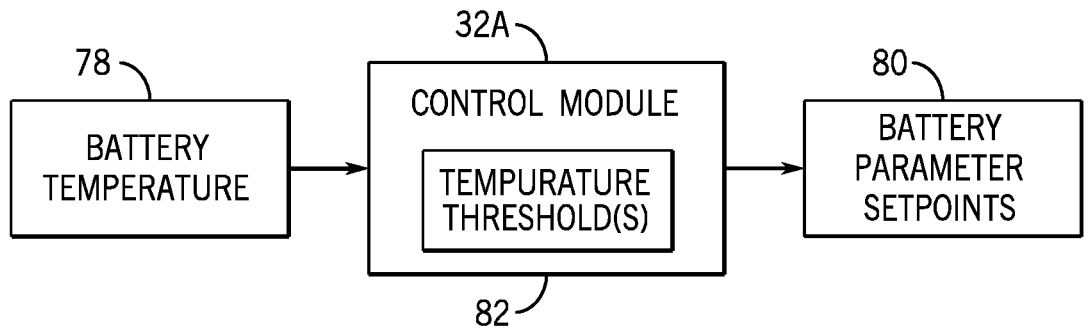
FIG. 8 is a block diagram of a control module used to in a reactive control scheme on the battery system of FIG. 2, in accordance with an embodiment.

As described above, the de-rating/re-rating techniques may be implemented in a reactive control scheme and/or an intelligent (e.g., predictive) control scheme. To help illustrate, an embodiment of a control module 32A implementing a reactive control scheme is described in FIG. 8. As depicted, the control module 32A may receive a measured temperature of the lithium ion battery 28. In some embodiments, the temperature of the lithium ion battery 28 may be determined via a temperature sensor 60 coupled to the lithium ion battery 28.

Based on the measured temperature, the control module 32A may determine battery parameter setpoints 80 to implement in the battery system 12. In some embodiments, the battery parameter setpoints 80 may include charging current produced by the electrical energy generator 42, charging voltage produced by the electrical energy generator 42, discharging current output by the lithium ion battery module 28, discharging voltage output by the lithium ion battery module 28, or any combination thereof. Thus, the control module 32A may determine the battery parameter setpoints 80 to implement de-rating and/or re-rating the battery system 12. For example, the control module 32A may instruct the electrical energy generator 42 to reduce charging current to reduce amount of charging and discharging performed by the lithium ion battery module 28, thereby reducing battery temperature.

More specifically, in a reactive control scheme, the control module 32A may determine the battery parameter setpoints 80 using one or more temperature thresholds 82. For example, in some embodiments, the control module 32A may compare the measured battery temperature 78 with a temperature threshold 82. When the measured battery temperature 78 is greater than the temperature threshold 82, the control module 32A may determine battery parameter setpoints 80 to de-rate the battery system 12. Additionally, when the measured battery temperature reduces below a temperature threshold 82, the control module 32A may determine battery parameter setpoints 80 to re-rate the battery system 12.

Figure 9:
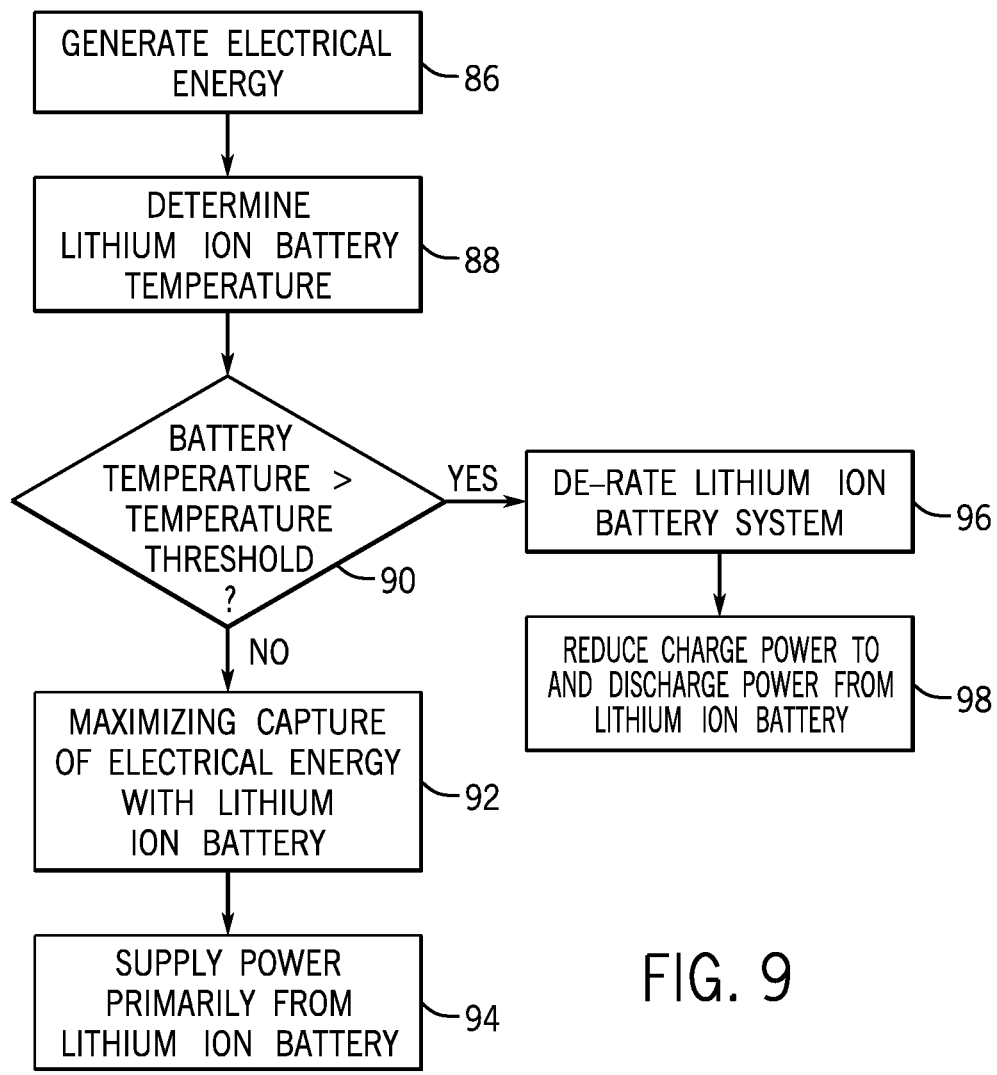
FIG. 9 is a flow diagram describing a first process for reactive control of the battery system of FIG. 2 using the control module of FIG. 8, in accordance with an embodiment.

To help illustrate, an embodiment of a process 84 for reactively de-rating the battery system 12 in a passive parallel architecture is described with respect to FIG. 9. Generally, the process 84 includes generating electrical energy (process block 86), determining the lithium ion battery temperature (process block 88), and determining whether the lithium ion battery temperature is greater than a temperature threshold (decision block 90). When the lithium ion battery temperature is not greater than the threshold, the process 84 includes maximizing capture of electrical energy with the lithium ion battery (process block 92) and supplying electrical power primarily from the lithium ion battery (process block 94). On the other hand, when the lithium ion battery temperature is greater than the temperature threshold, the process 84 includes de-rating the lithium ion battery system (process block 96) and reducing charge power to and discharge power from the lithium ion battery (process block 98). In some embodiments, process 84 may be implemented with instructions stored on one or more tangible, non-transitory, computer-readable medium, such as memory 36, and executed by one or more processors, such as processor 34.

Accordingly, in some embodiments, the control module 32A (e.g., the vehicle control module 62) may instruct the electrical energy generator 42 to generate electrical energy (process block 86). As described above, the electrical energy generator 42 (e.g., electric motor 22) may generate electrical energy during regenerative braking by converting the mechanical energy produced by the movement of the vehicle 10 into electrical energy. Additionally or alternatively, the electrical energy generator 42 (e.g., alternator 18) may convert mechanical energy produced by the internal combustion engine 24 into electrical energy.

Additionally, the control module 32A (e.g., battery control module 58) may determine the lithium ion battery temperature 78 (process block 88). More specifically, the battery control module 58 may poll a temperature sensor 60 coupled to the battery cells 56 to determine temperature lithium ion battery module 28. In some embodiments, the battery control module 58 may determine the temperature of the lithium ion battery module 28 in response to determining that electrical energy is being generated, for example, from the vehicle control module 62. In other embodiments, the battery control module 58 may periodically determine temperature of the lithium ion battery module 28 during operation, for example, every five seconds.

The control module 32A may then determine whether the lithium ion battery temperature 78 is greater than a temperature threshold 82 (decision block 90). Generally, the temperature threshold 82 may be set to reduce the likelihood of degrading performance and/or life span of the lithium ion battery module 28 due to temperature. As such, the temperature threshold 82 may be predetermined and stored in memory 36. Thus, the control module 32A may retrieve the temperature threshold 82 from memory 36 and compare it with the lithium ion battery temperature 78.

Additionally, since the operation of the lithium ion battery module 28 may be reduced due to de-rating, the temperature threshold may be set to balance any performance and/or lifespan degradation of the lithium ion battery module 28 due to temperature and the effect reduced operation of the lithium ion battery module 28 may have on vehicle operation. For example, the temperature threshold may be set at 70° C. to increase the duration the lithium ion battery module 28 is fully operational, thereby reducing effects of de-rating on operation of the vehicle 10 while increasing the likelihood of performance and/or life span degradation of the lithium ion battery module 28. On the other hand, the temperature threshold may be set at 55° C. to reduce the duration the lithium ion battery is fully operational, thereby increasing effects of de-rating on operation of the vehicle 10 while decreasing the likelihood of performance and/or life span degradation of the lithium ion battery module 28.

When the control module 32A determines that the lithium ion battery temperature 78 is not greater than the temperature threshold, the control module 32A may enable maximizing capture of the generated electrical energy using the lithium ion battery module 28 (process block 92). In other words, the lithium ion battery module 28 may utilize a maximum storage capacity (e.g., up to 100% SOC) to capture the generated electrical energy.

For example, when the lithium ion battery module 28 is a NMC/LTO battery and the electrical energy generator 42 (e.g., alternator 18 or the electric motor 22) outputs a variable voltage, the control module 32A may instruct the electrical energy generator 42 to output a voltage greater than 16.2 volts, thereby enabling the lithium ion battery module 28 to capture electrical energy up to 100% state of charge. Additionally, since the maximum open-circuit voltage of the lead-acid battery module 30 is 12.9 volts, the voltage output by the electrical energy generator 42 may also enable the lead-acid battery module 30 to capture electrical energy up to 100% state of charge. In other words, the full storage capacity of the battery system 12 may be utilized when the lithium ion battery temperature 78 is not greater than the temperature threshold.

Furthermore, since a maximum storage capacity of the lithium ion battery module 28 may be utilized, the open-circuit voltage of the lithium ion battery module 28 may end up being higher than the open-circuit voltage of the lead-acid battery module 30. For example, when a NMC/LTO battery is charged above 25% state of charge, the open-circuit voltage should be higher than the open-circuit voltage of the lead-acid battery module 30.

Accordingly, when the open-circuit voltage of the lithium ion battery module 28 is higher than the open-circuit voltage of the lead-acid battery module 30, the electrical power may be supplied to the vehicle's electrical system primarily from the lithium ion battery module 28 (process block 94). As described above, the open-circuit voltage of the lithium ion battery module 28 may decrease at it discharges. Thus, the lead-acid battery module 30 may also begin supplying electrical power when the open-circuit voltage of the lithium ion battery module 28 nears the open-circuit voltage of the lead-acid battery module 30.

As such, when the lithium ion battery temperature 78 is below the temperature threshold 82, the lithium ion battery module 28 may utilize a maximum storage capacity to capture electrical energy and provide electrical power by itself until it nears the open-circuit voltage of the lead-acid battery module 30. In other words, the lithium ion battery module 28 may repeatedly charge and discharge to supply electrical power to the electrical system 44. Additionally, the amount of energy stored in the lithium ion battery module 28 may be as high as 100% state of charge. However, as described above, repeatedly charging/discharging the lithium ion battery module 28 may increase the temperature of the lithium ion battery module 28. In other words, the longer the lithium ion battery module 28 is fully utilized, the lithium ion battery temperature 78 may gradually increase.

On the other hand, when the control module 32A determines that the lithium ion battery temperature 78 is greater than the temperature threshold 82, the control module 32A may de-rate the lithium ion battery system (process block 96). More specifically, the control module 32A may de-rate the lithium ion battery system by limiting the electrical energy captured by the lithium ion battery module 28, for example, by controlling charging current produced by the electrical energy generator 42, charging voltage produced by the electrical energy generator 42, discharging current output by the lithium ion battery module 28, discharging voltage output by the lithium ion battery module 28, or any combination thereof.

For example, when the lithium ion battery module 28 is a NMC/LTO battery and the electrical energy generator 42 outputs a variable voltage, the control module 32A (e.g., the vehicle control module 62) may instruct the electrical energy generator 42 to output a reduced voltage and/or a reduced current. In some embodiments, the control module 32A may instruct the electrical energy generator 42 to output 12.9 volts so that the lead-acid battery module 30 may be charged up to 100% state of charge while the lithium ion battery module 28 may only be charged up to 25% state of charge. By further example, the control module 32A may instruct the regenerative braking system to output 12.7 volts so that the lead-acid battery module 30 may be charged up to 85% state of charge while the lithium ion battery module 28 may only be charged up to 15% state of charge.

On the other hand, when the electrical energy generator 42 has a fixed output voltage (e.g., 13.3 volts), the control module 32A (e.g., the vehicle control module 62) may instruct the electrical energy generator 42 to reduce current output, duration electrical energy is generated, or both. For example, the control module 32A may instruct the alternator 18 and/or the electric motor 22 to reduce the output current to 150 amps so that the lithium ion battery module 28 may only be charged to 15% state of charge and the lead-acid battery module 30 may only be charged to 85% state of charge. Additionally or alternatively, control module 32A may instruct the alternator 18 and/or the electric motor 22 to cease generating electrical energy once the batteries 28 and 30 reach their target states of charge.

Thus, the amount of energy captured (e.g., charging) and stored in the lithium ion battery module 28 may be reduced. Additionally, since the open-circuit voltage of the lithium ion battery module 28 and the lead-acid battery module 30 may be close or the same and lead-acid battery module 30 has a higher energy density, the charge power to and the discharge power from the lithium ion battery 28 may be reduced (process block 98). In this manner, de-rating the battery system 12 may reduce the amount of charging/discharge performed by the lithium ion battery module 28, which may facilitate cooling the lithium ion battery module 28.

In some embodiments, the rate of cooling the lithium ion battery module 28 may be related to the reduction in charging/discharging and/or the amount of stored energy. For example, the lithium ion battery module 28 may cool at a faster rate when the voltage output by the electrical energy generator 42 is reduced to 12.7 volts, which limits the lithium ion battery module 28 to 15% SOC, as compared to 12.9 volts, which limits the lithium ion battery module 28 to 25% SOC. More specifically, when the output voltage is 12.7 volts, the lithium ion battery module 28 may capture/store less electrical energy, which reduces charging/discharging performed and enables the lithium ion battery module 28 to cool at a faster rate.

As such, in some embodiments, the control module 32A may instruct the electrical energy generator 42 to operate (e.g., output a specific voltage or current level) based on a temperature of the lithium ion battery module 28 and/or a desired rate of cooling. For example, the control module 32A may instruct the electrical energy generator 42 to output 12.9 volts when the temperature threshold is exceeded and instruct the alternator 18 and/or the electric motor 22 to output 12.7 when a higher temperature threshold is exceeded.

Additionally, as described in process 84, the control module 32A may compare the lithium ion battery temperature to the temperature threshold whenever electrical energy is generated. As such, when the control module 32A determines that the temperature of the lithium ion battery module 28 has decreased below the temperature threshold, the control module 32A may re-rate the battery system 12 to enable the lithium ion battery module 28 to resume utilizing its full storage capacity. In other embodiments, lithium ion battery module 28 may resume utilizing its full storage capacity at a lower temperature threshold, such as 40° C.

Furthermore, although process 84 is described in relation to static temperature thresholds, in other embodiments, the control module 32A may monitor (e.g., determine) the rate of change of the lithium ion battery temperature 78. For example, in decision block 90, the control module 32A may compare the rate at which the lithium ion battery temperature 78 is changing to a temperature threshold, which describes a threshold rate of temperature change. Thus, when the rate of change is greater, the control module 32A may de-rate the battery system 12.

Figure 10:
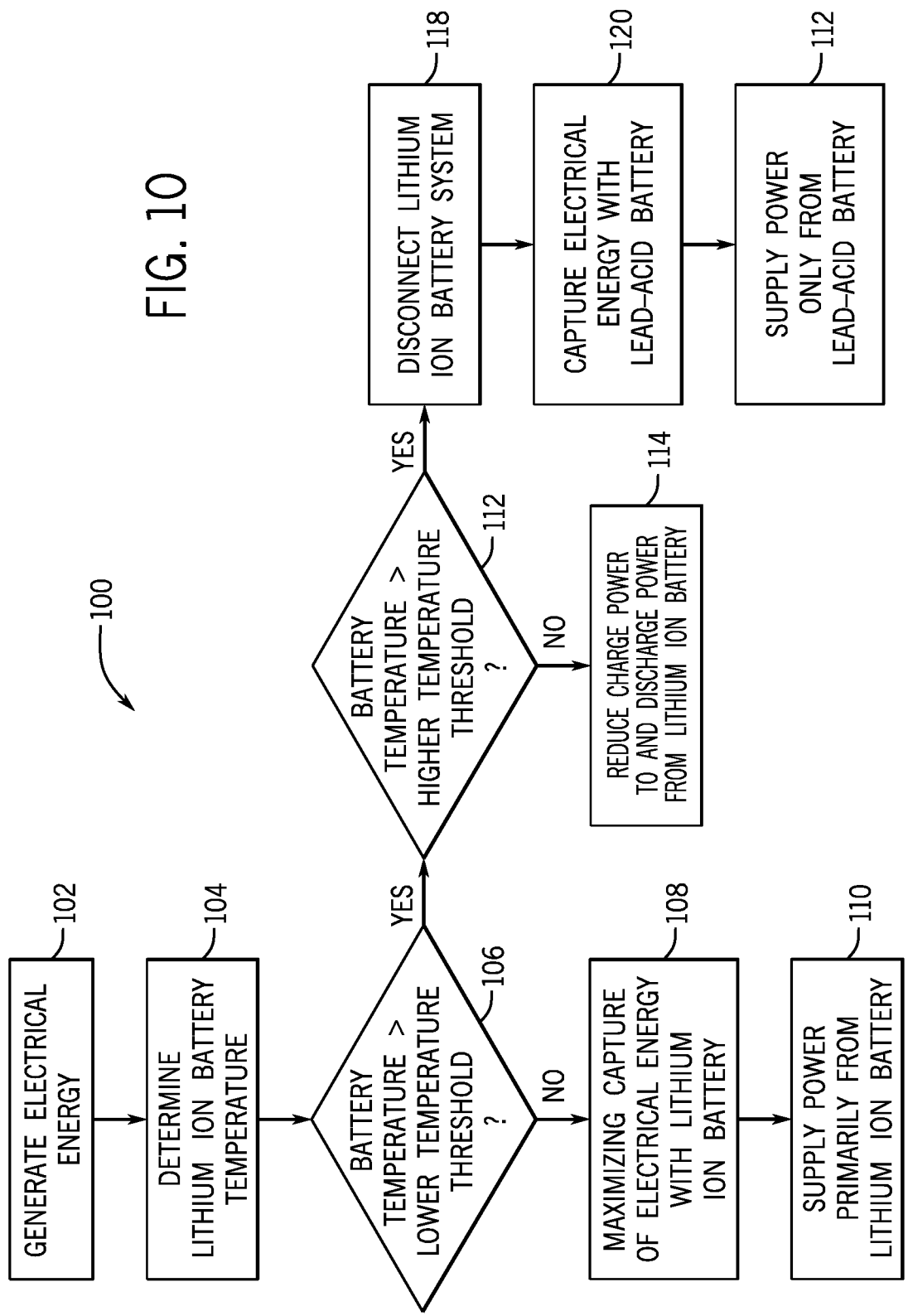
FIG. 10 is a flow diagram describing a second process for reactive control of the battery system of FIG. 2 using the control module of FIG. 8, in accordance with an embodiment.

To further illustrate, an embodiment of a process 100 for reactively de-rating the battery system 12 in a semi-passive parallel architecture is described in FIG. 10. Generally, the process 100 includes generating electrical energy (process block 102), determining the lithium ion battery temperature (process block 104), and determining whether the battery temperature is greater than a lower (e.g., first) temperature threshold (decision block 106). When the battery temperature is not greater than the lower temperature threshold, the process 100 includes maximizing capture of the electrical energy with the lithium ion battery (process block 108) and supplying power primarily from the lithium ion battery (process block 110). On the other hand, when the battery temperature is greater than the lower temperature threshold, the process 100 may include determining whether the battery temperature is greater than a higher (e.g., second) temperature threshold (decision block 112). When the temperature is not greater than the higher temperature threshold, the process 100 includes reducing charge power to and discharge power from the lithium ion battery (process block 114). On the other hand, when the battery temperature is greater than the higher temperature threshold, the process 100 may include disconnecting the lithium ion battery system (process block 118), capturing the electrical energy with the lead-acid battery (process block 120), and supplying power only from the lead-acid battery (process block 122). In some embodiments, process 100 may be implemented by instructions stored on one or more tangible, non-transitory, computer readable medium, such as memory 36, and executed by one or more processors, such as processor 34.

Accordingly, similar to process block 86, the control module 32A (e.g., the vehicle control module 62) may instruct the electrical energy generator 42 to generate electrical energy (process block 102). Additionally, similar to process block 88, the control module 32A (e.g., battery control module 58) may determine the lithium ion battery temperature 78 (process block 104).

The control module 32A may then determine whether the lithium ion battery temperature 78 is greater than a lower temperature threshold (decision block 106). In some embodiments, the lower temperature threshold may be predetermined and stored in memory 36. Thus, the control module 32A may retrieve the lower temperature threshold from memory 36 and compare it with the lithium ion battery temperature 78. For example, the lower temperature threshold may be 55° C.

When the control module 32A determines that the lithium ion battery temperature 78 is not greater than the lower temperature threshold, the control module 32A (e.g., battery control module 58) may instruct the relay 46 to be in the first state, which connects the lithium ion battery module 28 in parallel with the lead-acid battery module 30. Accordingly, similar to process block 92, the control module 32A may maximize capture of the generated electrical energy using the lithium ion battery module 28 (process block 108) and, similar to process block 94, supply electrical power to the vehicle's electrical system 44 may be primarily from the lithium ion battery module 28 (process block 110).

When the control module 32A determines that the lithium ion battery temperature 78 is greater than the lower temperature threshold, the control module 32A may determine whether the battery temperature 78 is greater than a higher temperature threshold (decision block 112). Similar to the lower temperature threshold, in some embodiments, the higher temperature threshold may be predetermined and stored in memory 36. Thus, the control module 32A may retrieve the higher temperature threshold from memory 36 and compare it with the lithium ion battery temperature 78. For example, the higher temperature threshold may be 70° C.

When the control module 32A determines that the lithium ion battery temperature 78 is not greater than the higher temperature threshold, the control module 32A (e.g., battery control module 58) may instruct the relay 46 to remain in the first state and de-rate the lithium ion battery system to reduce charge power to and discharge power from the lithium ion battery 28 (process block 114). More specifically, similar to process block 96, the control module 32A may control the charging current produced by the electrical energy generator 42, charging voltage produced by the electrical energy generator 42, discharging current output by the lithium ion battery module 28, discharging voltage output by the lithium ion battery module 28, or any combination thereof.

When the control module 32A determines that the battery temperature is greater than the higher temperature threshold, the control module 32A (e.g., battery control module 58) may instruct the relay 46 to change to the second state and disconnect the lithium ion battery module 28 (process block 118). Since the lithium ion battery module 28 is disconnected, the lead-acid battery module 30 may capture the generated electrical energy (process block 120) and supply electrical power by itself (process block 122). When the lithium ion battery module 28 is disconnected, it may cease charging/discharging and maintain its state of charge. As such, disconnecting the lithium ion battery module 28 may provide the fastest rate of cooling. However, providing electrical power with only the lead-acid battery module 30 may affect vehicle performance because the lead-acid battery module 30 may power more electrical devices. As such, in some embodiments, the lithium ion battery module 28 may be disconnected as a last resort.

Similar to process 84, the control module 32A in process 100 may compare the lithium ion battery temperature 78 to the lower temperature threshold and the upper temperature threshold whenever electrical energy is generated. As such, when the control module 32A determines that the lithium ion battery temperature 78 has decreased below the upper temperature threshold, the control module 32A may instruct the relay 46 to reconnect the lithium ion battery module 28, but limit the electrical energy capture by the lithium ion battery module 28. Additionally, when the control module 32A determines that the temperature of the lithium ion battery module 28 has decreased below the lower temperature threshold, the control module 32A may re-rate the battery system 12 and enable the lithium ion battery module 28 to resume utilizing its full storage capacity. In other embodiments, lithium ion battery module 28 may resume utilizing its full storage capacity at an even lower temperature threshold, such as 40° C.

Furthermore, although process 100 is described in relation to static temperature thresholds, in other embodiments, the control module 32A may monitor the rate of change of the lithium ion battery temperature 78. For example, in decision block 106, the control module 32A may compare the rate of change of the lithium ion battery temperature 78 to a lower temperature threshold, which describes a lower threshold rate of temperature change. Additionally, in decision block 112, the control module 32A may compare the rate of change of the lithium ion battery temperature 78 to a higher temperature threshold, which describes a higher threshold rate of temperature change. Thus, when the rate of change is greater than the lower temperature threshold, the control module 32A may de-rate the battery system and, when the rate of change is greater than the higher temperature threshold, the control module 32A may disconnect the lithium ion battery module 28.

As such, the reactive control scheme described above may facilitate controlling temperature of the lithium ion battery module 28 based at least in part on a currently determined lithium ion battery temperature 78 and one or more temperature thresholds 82. More specifically, the de-rating/re-rating techniques described may facilitate cooling a lithium ion battery module 28 in the battery system 12 by reactively cooling the lithium ion battery module 28 when the current determined temperature reaches a temperature threshold 82.

To help illustrate, results from testing a vehicle using only a passive thermal system and a reactive de-rating scheme under five different operating scenarios are described below. The operating parameters for each of the scenarios are summarized below in Table 1.

TABLE 1

Operating Parameters of Vehicle Testing Scenarios

|  | 1 | 2 | 3 | 4 | 5 |
|---|---|---|---|---|---|
| Environment | Boston | Boston | Miami | Miami | 45° C. |
| Driving Pattern | 2 × 1 hr | 2 × 1 hr | 2 × 1 hr | 2 × 1 hr | 3.5 hrs NEDC |
| BOL/EOL | BOL | EOL | BOL | EOL | BOL |

As described in Table 1, in the fifth scenario, the vehicle was equipped with a lithium ion battery at the beginning of life (BOL) and driven for three and a half hours in a 45° C. environment. More specifically, in the fifth scenario the vehicle was driven in eleven back-to-back New European Drive Cycle (NEDC) cycles. Additionally, in the first and second scenarios, the vehicle was driven in Boston, Mass. for one hour twice a day. Furthermore, in the third and fourth scenarios, the vehicle was driven in Miami, Fla. for one hour twice a day. More specifically, in the first through fourth scenarios, the vehicle was driven for one hour from the eighth hour to the ninth hour of the day and again for one hour from the seventeenth hour to the eighteenth hour of the day.

Additionally, to determine effect age of the lithium ion battery may have on the vehicle operation, the vehicle was tested when equipped with a lithium ion battery at different stages of life. As described in Table 1, the vehicle was equipped with a lithium ion battery at the beginning of life (BOL) in the first and third scenarios. On the other hand, the vehicle was equipped with a lithium ion battery at the end of life (EOL) in the second and fourth scenarios.

Figure 11:
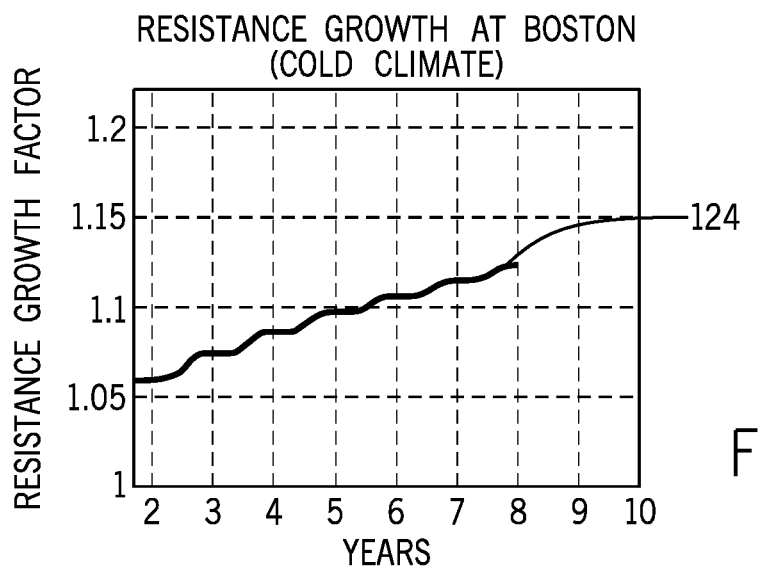
FIG. 11 is a plot describing internal resistance of a lithium ion battery over its lifetime when the lithium ion battery is operated at a first location, in accordance with an embodiment.

Generally, as a lithium battery ages the internal resistance may gradually increase. To help illustrate, the internal resistance of a lithium ion battery operated in Boston over its life is shown in FIG. 11. More specifically, FIG. 11 is a plot that describes the internal resistance of the lithium ion battery with a resistance curve 124 over its eight year life, in which the years are shown on the X-axis and the internal resistance is shown on the Y-axis.

As described by the resistance curve 124, the internal resistance of the lithium ion battery at year eight (e.g., EOL) was approximately 1.12 times its internal resistance at year zero (e.g., BOL). Generally, it is desirable for the internal resistance of the lithium ion battery to be maintained below 1.39 times its beginning of life internal resistance. In some embodiments, when the internal resistance increases more than 1.39 times, the operational efficiency of the lithium ion battery may be degraded. For example, the increased internal resistance may cause the lithium ion battery to heat up more quickly.

Figure 12:
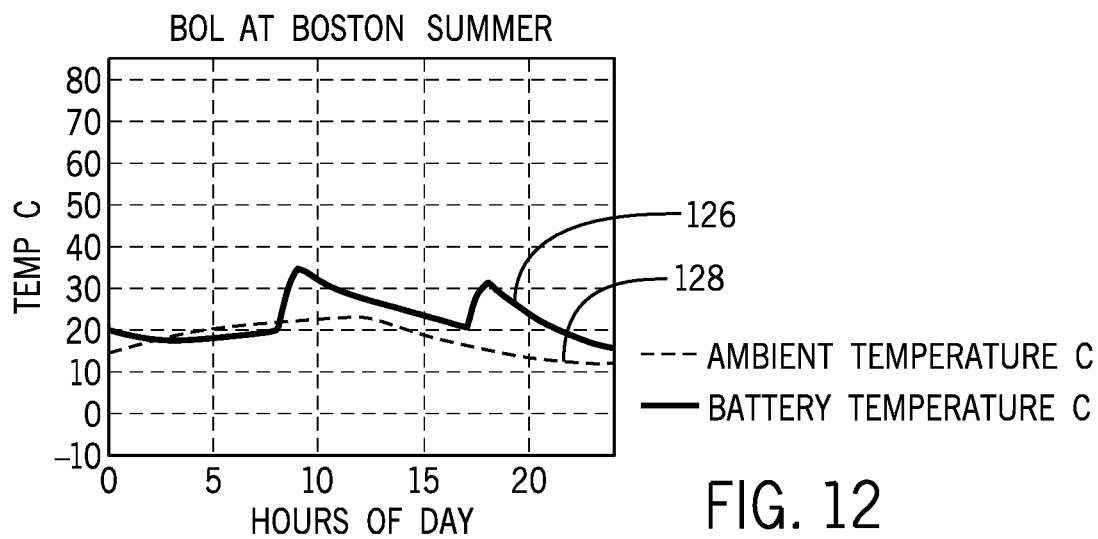
FIG. 12 is a plot describing temperature of the lithium ion battery when operated in a first scenario at the first location, in accordance with an embodiment.
Figure 13:
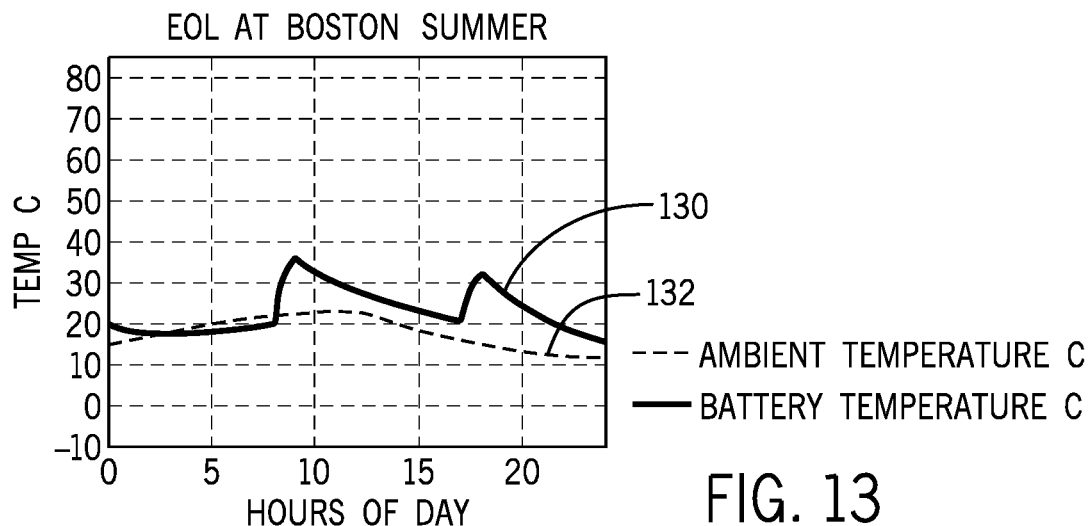
FIG. 13 is a plot describing temperature of the lithium ion battery when operated in a second scenario at the first location, in accordance with an embodiment.

Additionally, even though the internal resistance increased 1.12 times from its beginning of life internal resistance, the temperature of the lithium ion battery did not appear to be drastically affected. To help illustrate, the temperature of the lithium ion battery and the ambient temperature of the vehicle in the first scenario and the second scenario are described in FIGS. 12 and 13 respectively. More specifically, FIG. 12 is a plot that describes the temperature of the lithium ion battery at the beginning of life with a battery temperature curve 126 and ambient temperature of the vehicle with a vehicle temperature curve 128 in the first scenario (e.g., over 24 hours), in which the hours of the day are shown on the X-axis and the temperature is shown on the Y-axis. Similarly, FIG. 13 is a plot that describes the temperature of the lithium ion battery at the end of life with a battery temperature curve 130 and ambient temperature of the vehicle with a vehicle temperature curve 132 in the second scenario (e.g., over 24 hours), in which the hour of the day is shown on the X-axis and the temperature is shown on the Y-axis.

As described by the battery temperature curves 126 and 130, the temperature of the lithium ion battery was approximately the same regardless of whether it was at the beginning of life or the end of life. More specifically, in both the first and second scenarios, the battery temperature remained generally constant from hour zero to hour eight when the vehicle was not in operation. Between hour eight and hour nine, the battery temperature increased as the vehicle was driven for an hour. The battery temperature then gradually decreased from hour nine to hour seventeen when the vehicle was not in operation. Between hour seventeen and hour eighteen, the battery temperatures rose again when the vehicle was driven for an hour. Finally, the battery temperatures again gradually decreased from hour eighteen to hour twenty-four when the vehicle was not in operation.

Additionally, as described by the battery temperature curves 126 and 130, the temperatures of the lithium ion batteries were maintained well below 70° C. In other words, the of the lithium ion battery temperatures were maintained below a temperature threshold of 70° C. As such, in Boston, the passive cooling system was sufficient to maintain the temperature of the lithium ion battery within a desired range, even when the lithium ion battery is at its end of life.

However, as described above, the environmental temperature may affect the temperature of the lithium ion battery. Accordingly, the vehicle was also tested in a harsher environment. More specifically, the vehicle was driven in Miami, which has a higher environmental temperature than Boston.

Figure 14:
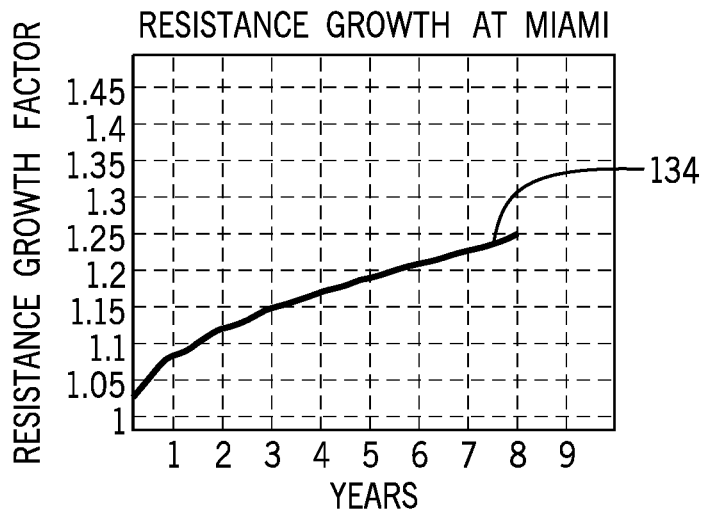
FIG. 14 is plot describing internal resistance of a lithium ion battery over its lifetime when the lithium ion battery is operated at a second location, in accordance with an embodiment.

As expected, the higher temperatures in Miami caused the internal resistance of the lithium ion battery to increase at a faster rate. To help illustrate, the internal resistance of the lithium ion battery operated in Miami, Fla. over its life is described in FIG. 14. More specifically, FIG. 14 is a plot that describes the internal resistance of the lithium ion battery with a resistance curve 134 over its eight year life, in which the years are shown on the X-axis and the internal resistance is shown on the Y-axis.

As described by the resistance curve 134, the internal resistance of the lithium ion battery at year eight (e.g., EOL) was approximately 1.24 times its internal resistance at year zero (e.g., BOL). Thus, even with the higher environmental temperatures, the internal resistance increased by less than the 1.39 times threshold. Additionally, even though the internal resistance of the lithium ion battery increased by a larger amount, the temperature of the lithium ion battery still did not appear to be drastically affected.

Figure 15:
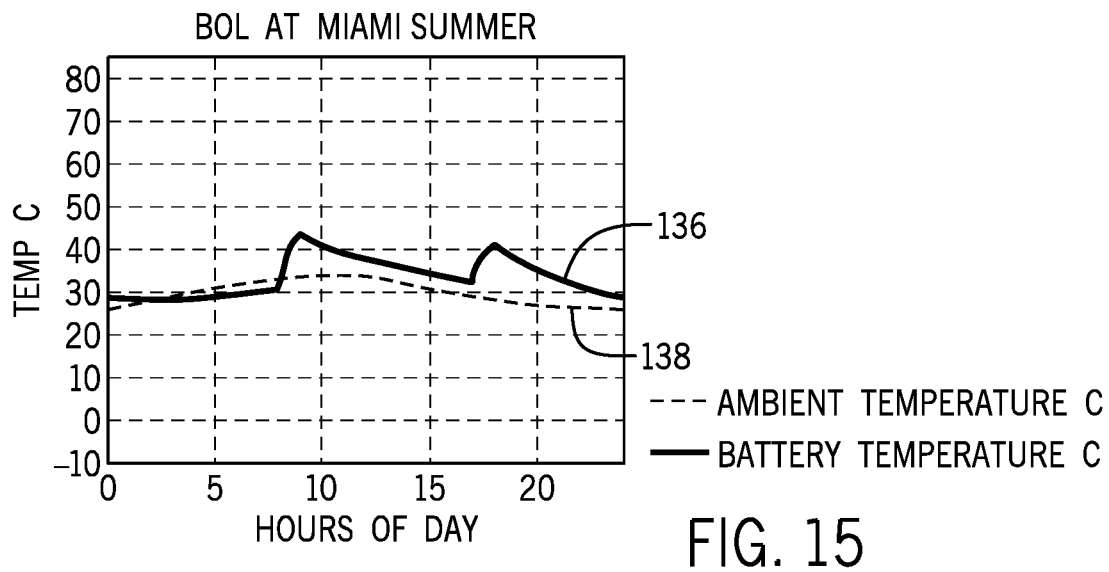
FIG. 15 is a plot describing temperature of the lithium ion battery when operated in a third scenario at the second location, in accordance with an embodiment.
Figure 16:
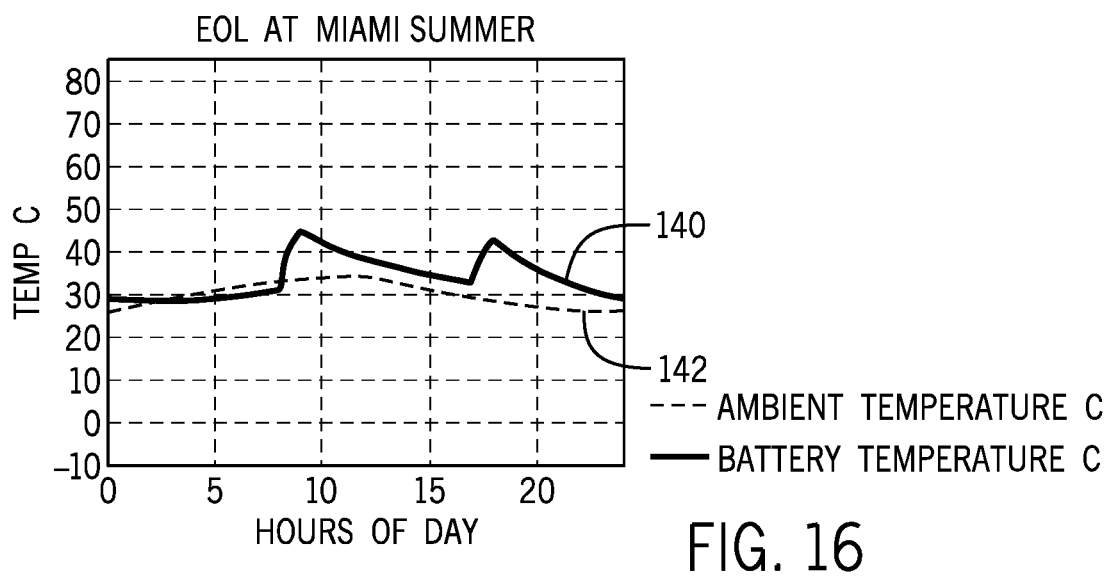
FIG. 16 is a plot describing temperature of the lithium ion battery when operated in a fourth scenario at the second location, in accordance with an embodiment.

To help illustrate, the temperature of the lithium ion battery and the ambient temperature of the vehicle in the third scenario and the fourth scenarios are described in FIGS. 15 and 16 respectively. More specifically, FIG. 15 is a plot that describes the temperature of the lithium ion battery at the beginning of life with a battery temperature curve 136 and ambient temperature of the vehicle with a vehicle temperature curve 138 in the third scenario (e.g., over 24 hours), in which the hours of the day are shown on the X-axis and the temperature is shown on the Y-axis. Similarly, FIG. 16 is a plot that describes the temperature of the lithium ion battery at the end of life with a battery temperature curve 140 and ambient temperature of the vehicle with a vehicle temperature curve 142 in the fourth scenario (e.g., over 24 hours), in which the hour of the day is shown on the X-axis and the temperature is shown on the Y-axis.

As in Boston, the temperature of the lithium ion battery was generally the same regardless of whether it was at the beginning of life or the end of life. Additionally, as described by the battery temperature curves 136 and 140, the temperatures of the lithium ion batteries were maintained below 70° C. In other words, even with the elevated environmental temperatures, the lithium ion batteries were maintained below a temperature threshold of 70° C. As such, even in Miami, the passive cooling system was sufficient to maintain the temperature of the lithium ion battery within a desired range.

A summary of the first four scenarios is presented below in table 2.

TABLE 2

Summary of Testing Results

| | BOL/EOL | R % increase | % De-rated |
|---|---|---|---|
| Miami | BOL | N/A | 0% |
| | EOL | 124% | 0% |
| Boston | BOL | N/A | 0% |
| | EOL | 112% | 0% |

As described in Table 2, the internal resistance of the lithium ion battery operated in Miami increased 124% from the beginning of life to the end of life. Additionally, the internal resistance of the lithium ion battery operated in Boston increased 112% from the beginning of life to the end of life. As such, in both Boston and Miami, the internal resistance of the lithium ion battery increased by less than an upper threshold amount of 139%.

Moreover, as described in Table 2, the lithium ion battery was not de-rated in any of the first four scenarios. In other words, even in harsh conditions, such as Miami, a passive cooling system may be sufficient to maintain the temperature of the lithium ion battery module 28 in a desirable range (e.g., less than a temperature threshold of 70° C.). In other words, since most driving environments are less taxing than Miami, the passive cooling system may be sufficient when drive times are less than one hour.

However, since lithium ion battery temperature gradually increases over operation, the passive cooling system may eventually become insufficient with increased drive times and de-rating/re-rating techniques may be utilized to facilitate controlling temperature. The fifth scenario is used to help illustrate. As described above, in the fifth scenario, the vehicle was driven for eleven back-to-back NEDC drive cycles (e.g., three hours and forty minutes) in a temperature controlled environment.

Figure 17A:
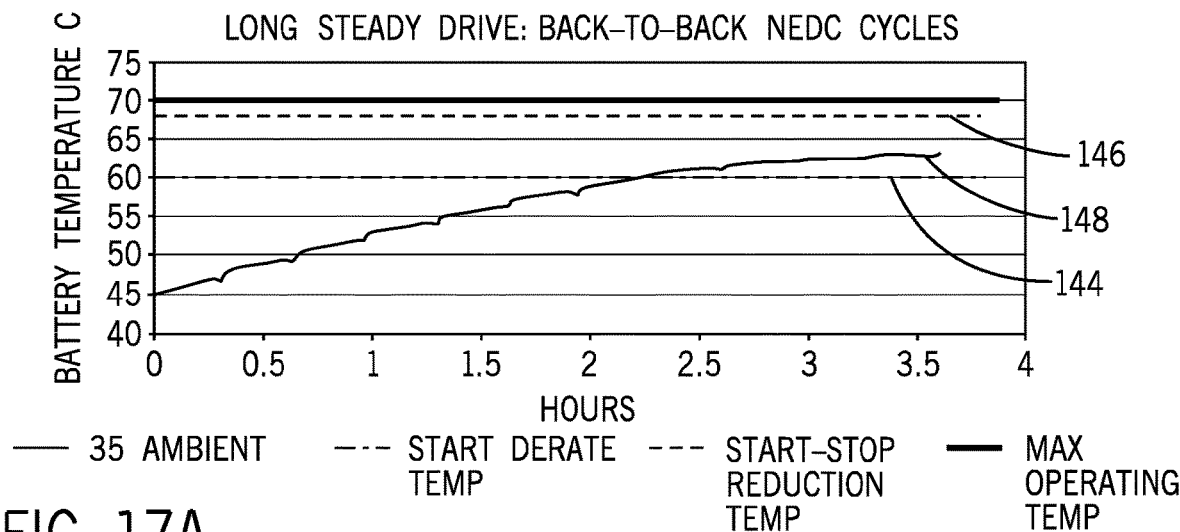
FIG. 17A is a plot describing temperature of a lithium ion battery when operated in a fifth scenario, in accordance with an embodiment.

The temperature of the lithium ion battery gradually increased as driving duration increased. To help illustrate, the results of the fifth scenario are described in FIGS. 17A-17C. More specifically, FIG. 17A is a plot that describes the temperature of the lithium ion battery with a battery temperature curve 148 in the fifth scenario, in which the hours are shown on the X-axis and the temperature is shown on the Y-axis.

In the fifth scenario, a de-rating (e.g., lower) temperature threshold 144 was set at 60° C. and a start-stop (e.g., higher) temperature threshold 146 was set at 68° C. More specifically, the lithium ion battery began to be de-rated once the temperature of the lithium ion battery reached the de-rating temperature threshold 144. Accordingly, as described by the battery temperature curve 148, the temperature of the lithium ion battery increased from 45° C. at hour zero to 60° C. at approximately hour 2.25. Once the de-rating temperature threshold 144 was reached, the battery system was reactively de-rated. Accordingly, the temperature of the lithium ion battery subsequently increased at a slower rate from hour 2.25 to hour 3.5.

Additionally, if the lithium ion battery temperature had reached the start-stop temperature threshold 146, the lithium-ion battery would have been disconnected. In fact, as long the lithium-ion battery remained connected, it was possible to perform start-stop operations. In other words, even though the lithium ion battery was de-rated between hour 2.25 and hour 3.5, the vehicle was still able to disable the internal combustion engine when the vehicle was idle and to re-crank the internal combustion engine when propulsion was desired.

Figure 17B:
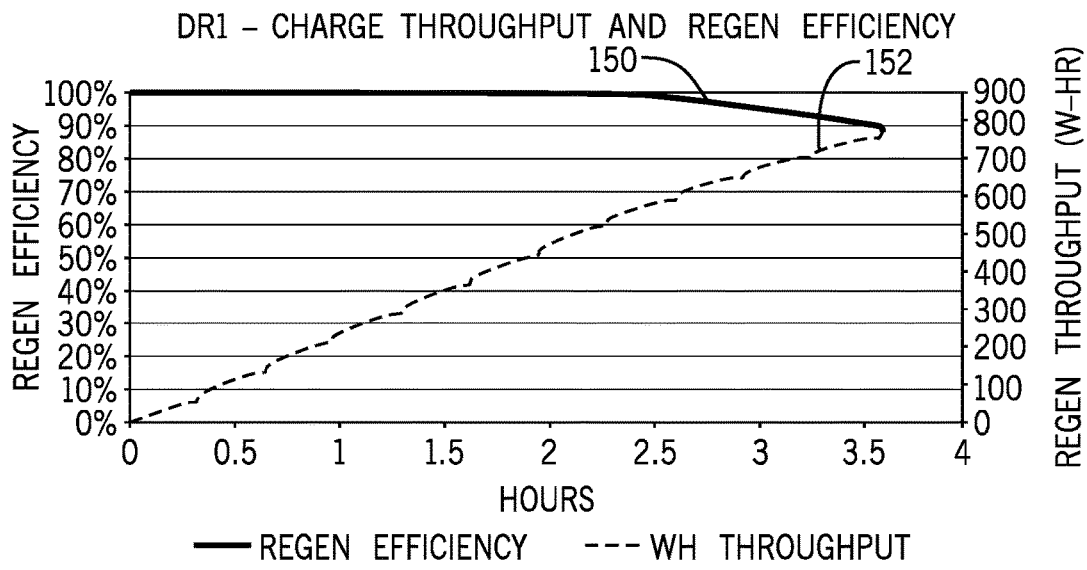
FIG. 17B is a plot describing regenerative efficiency and regenerative throughput when operated in the fifth scenario, in accordance with an embodiment.
Figure 17C:
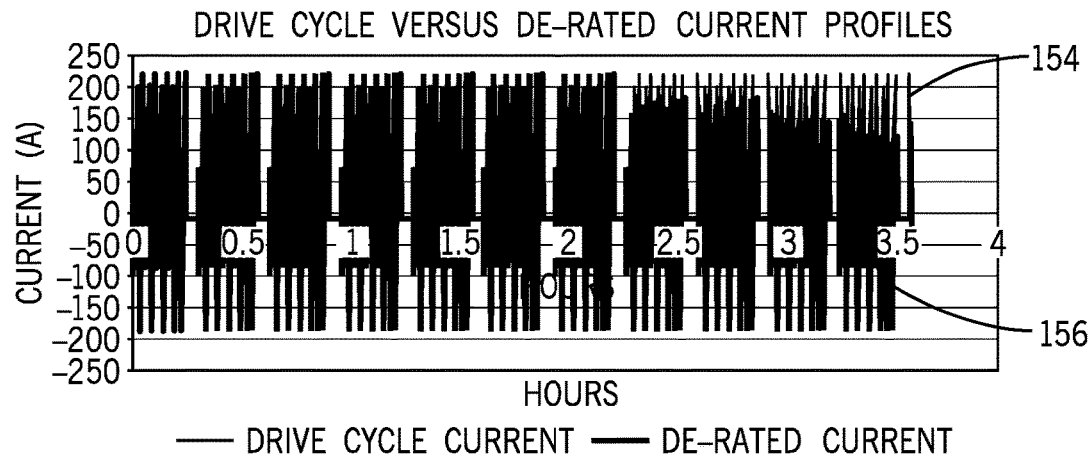
FIG. 17C is a plot describing charge and discharge currents when operated in the fifth scenario, in accordance with an embodiment.

To help illustrate, the effects of de-rating the lithium ion battery are described in FIGS. 17B and 17C. More specifically, FIG. 17B is a plot that describes energy capture efficiency with a regenerative efficiency curve 150 and the amount of regenerative energy captured with a regenerative throughput curve 152 in the fifth scenario, in which the in which the hours are shown on the X-axis, the regenerative efficiency is shown on a first Y-axis, and regenerative energy throughput is shown on a second Y-axis.

As described by the regenerative efficiency curve 150, the energy capture efficiency of the battery system was generally maintained at 100% from hour zero to approximately hour 2.25 because the energy capture capabilities of the lithium-ion battery were maximized. However, once de-rated, the energy capture efficiency of the battery system decreased. More specifically, the energy capture efficiency may have decreased because de-rating caused the lead-acid battery to be used to capture a greater portion of the generated electrical energy.

Nevertheless, even after the battery system was de-rated, the electrical energy generated during regenerative braking continued to be captured. Accordingly, as depicted, the regenerative throughput curve 152 continues to increase during the entire period of operation. However, since de-rating the battery system decreased the energy capture efficiency, the rate at which the electrical energy is captured decreased. Accordingly, as depicted, the slope of the regenerative throughput curve 152 decreases at approximately hour 2.25.

Even though the battery system was de-rated, start-stop operations were still possible. To help illustrate, FIG. 17C is a plot that describes the expected (e.g., un-de-rated) current of the lithium ion battery with a drive cycle current curve 154 and the actual current of the lithium ion battery with a de-rated current curve 156, in which the in which the hours are shown on the X-axis and the current is shown on the Y-axis. In the depicted embodiment, positive current is intended to describe charging current supplied to the lithium ion battery and negative current is intended to describe discharging current supplied by the lithium ion battery.

As described by the drive cycle current curve 154 and the de-rated current curve 156, the actual current of the lithium ion battery was generally as expected between hour zero to approximately hour 2.25. More specifically, during that period, the lithium ion battery was charged with a relatively constant 200 amps during regenerative braking. Additionally, the lithium ion battery output a relatively constant 80 amps to the electrical system of the vehicle. Furthermore, the lithium ion battery periodically output pulses of approximately 180 amps to crank the internal combustion engine (e.g., during a start-stop operation).

However, once the battery system was de-rated, the actual current of the lithium ion battery began to vary from the expected current. More specifically, the lithium ion battery was charged with a decreasing current, thereby reducing the electrical energy captured by the lithium ion battery. Nevertheless, during this period, the lithium ion battery was still able to output a relatively constant 80 amps to the electrical system of the vehicle and output pulses of 180 amps to crank the internal combustion engine (e.g., during a start-stop operation). As such, even when the battery system was de-rated to control temperature of the lithium ion battery, efficiency benefits provided by mHEVs may still be utilized.

As illustrated by the above example, operation of the battery system 12 may be controlled in a reactive control scheme based on current operation of the lithium ion battery. For example, a reactive control scheme may de-rate/re-rate the battery system based on a presently measured operational parameter (e.g., measured temperature 78) and one or more thresholds governing the operational parameters (e.g., temperature thresholds 82). In this manner, a reactive control scheme may improve performance and/or life span of lithium ion battery by reactively maintaining lithium ion battery temperature within a desired temperature range.

Intelligent Control Scheme

To further improve performance and/or life span of the lithium ion battery, operation of the battery system 12 may be controlled in an intelligent (e.g., predictive) control scheme based on current as well as predicted future operation of the lithium ion battery module 28. For example, an intelligent control scheme may de-rate/re-rate the battery system based on a presently measured operational parameter as well as a predicted trajectory of the operational parameter, one or more models that facilitate determining the projected trajectory, and an objective function that facilitates determining battery parameters setpoints. In this manner, an intelligent control scheme may further improve performance and/or life span of the lithium ion battery module 28 by guiding lithium ion battery temperature along a target temperature trajectory and/or maintaining the lithium ion battery temperature below a temperature threshold.

More specifically, as described above, lithium ion battery temperature may affect performance and/or life span of the lithium ion battery. For example, exposing the lithium ion battery to higher temperatures may cause internal resistance to increase at a faster rate, thereby increasing the aging rate of the lithium ion battery module 28. Additionally, de-rating the battery system may affect the operation of the vehicle 10, for example, by reducing electrical energy capture and thus fuel economy of the vehicle 10.

Accordingly, in some embodiments, using an intelligent control scheme may enable the battery system to improve battery system 12 operation by balancing effects various aspects of the battery system 12, such as temperature of the lithium ion battery module 28, life span of the lithium ion battery module 28, fuel economy contribution by the lithium ion battery module 28, and the like. Moreover, the intelligent control scheme may enable accounting for the predicted effects on the various factors in future operation. For example, taking into account future operation, the battery system 12 may be de-rate earlier and more gradually, thereby reducing effects on operation of the vehicle 10 caused by de-rating.

Figure 18:
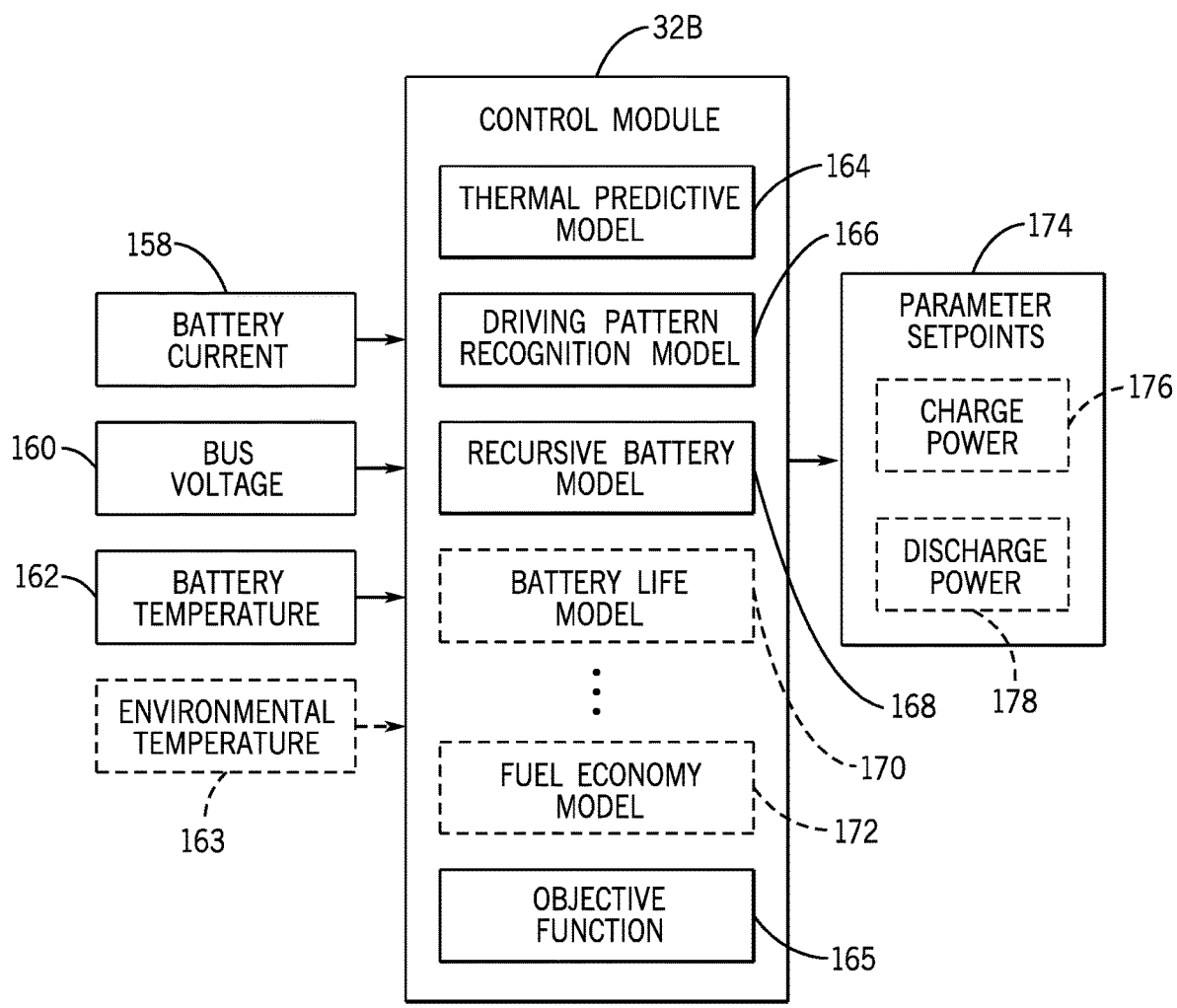
FIG. 18 is a block diagram of a control module used in an intelligent control scheme on the battery system of FIG. 2, in accordance with an embodiment.

To help illustrate, an embodiment of a control module 32B used to implement an intelligent control scheme is described in FIG. 18. As depicted, the control module 32B receives input operational parameters determined for the present time step, which include battery current 158, bus voltage 160, battery temperature 162, and optionally environmental temperature 163. In some embodiments, the input operational parameters may be measured by one or more sensors 60. For example, a current sensor electrically coupled to terminals 54 of the lithium ion battery module 28 may facilitate determining the battery current 158 by measuring the current supplied to the lithium ion battery (e.g., charging current) and the current supplied from the lithium ion battery (e.g., discharging current). Additionally, a voltage sensor electrically coupled to the bus 26 may facilitate determining the bus voltage 160 by measuring voltage on the bus 26. Furthermore, temperature sensors 60 may facilitate determining the battery temperature 162 by measuring temperature of the lithium ion battery module 28 and/or determining the environmental temperature 163 by measuring temperature of environment surrounding the vehicle 10. Additionally or alternatively, the environmental temperature 163 may be indirectly determined based on other operational parameters.

As depicted, the control module 32B also includes one or more models and an objective function 165. In the depicted embodiment, the control module 32 includes a thermal predictive model 164, a driving pattern recognition model 166, a recursive battery model 168, and optionally a battery life model 170 and a fuel economy model 172. It should be appreciated that the described one or more models are intended to be merely illustrative and not limiting.

Based at least in part on the input operational parameters, the one or more models, and the objective function 165, the control module 32B may determine battery parameter setpoints 174 to be implemented. In some embodiments, the battery parameter setpoints 174 may be implemented to de-rate or re-rate the battery system 12. Accordingly, the battery parameter setpoints 174 may include charge power setpoints 176 and/or discharge power setpoints 178. For example, the control module 32B may instruct the electrical energy generator 42 to implement the charge power setpoints 176 to control charging current and/or charging voltage supplied to the lithium ion battery module 28. Additionally, the control module 32B may implement the discharge power setpoints 178 to control the discharging current and/or discharging voltage output by the lithium ion battery module 28.

As will be described in more detail below, in an intelligent control scheme, the control module 32B may determine the battery parameter setpoints 174 taking into account predicted effects implementing the battery parameter setpoints 174 may have, such as effects on the predicted temperature trajectory 208, predicted battery life span 266, and predicted battery contribution to fuel economy 288. More specifically, the control module 32B may use the one or more models to project operational parameters of the battery system over a prediction horizon (e.g., multiple time steps in the future). Additionally, the control module 32B may determine the battery parameter setpoints using the objective function 165, which describes a desired balance between the projected effects on the operational parameters, to control operational parameters of the battery system over a control horizon (e.g., multiple time steps in the future).

As used herein, a "prediction horizon" is intended to describe a period for which trajectory of an operational parameter (e.g., driving pattern, battery temperature, or battery current) is predicted. On the other hand, the control horizon is intended to describe a period for which trajectory of a parameter setpoint (e.g., charge current, discharge current, charge voltage, discharge voltage) is determined. In some embodiments, the control horizon may be less than or equal to the prediction horizon.

Figure 19:
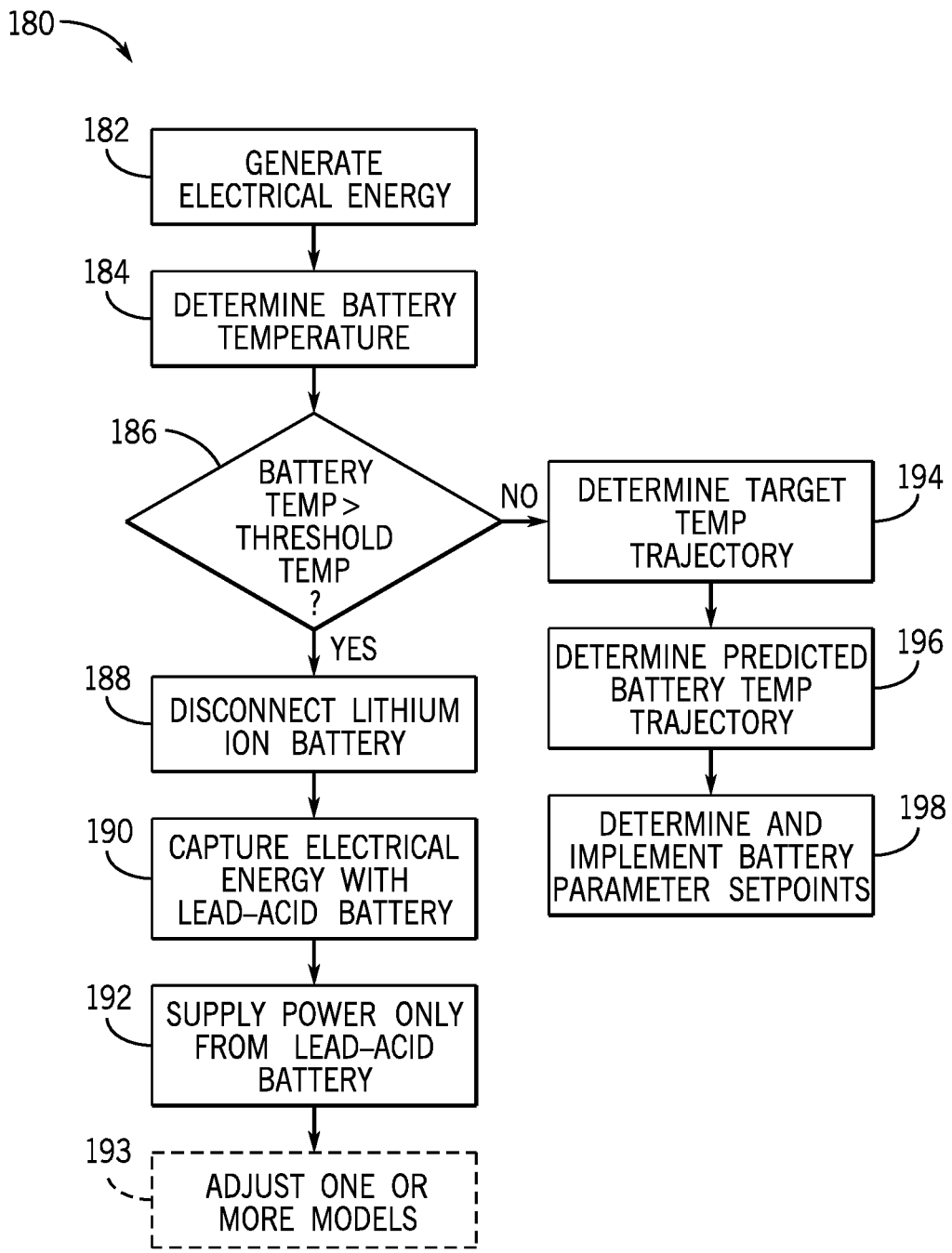
FIG. 19 is a flow diagram describing a process for intelligent control of the battery system of FIG. 2 using the control module of FIG. 18, in accordance with an embodiment.

To help illustrate, one embodiment of a process 180 for determining the battery parameter setpoints 174 in an intelligent control scheme is described in FIG. 19. Generally, the process 180 includes generating electrical energy (process block 182), determining a battery temperature (process block 184), and determining whether the battery temperature is greater than a temperature threshold (decision block 186). When the battery temperature is greater than the temperature threshold, the process 180 includes disconnecting a lithium ion battery (process block 188), capturing electrical energy with a lead-acid battery (process block 190), supplying power only from the lead-acid battery (process block 192), and optionally adjusting one or more models (process block 193). When the battery temperature is not greater than the temperature threshold, the process 180 includes determining a target temperature trajectory and/or a temperature threshold (process block 194), determining a predicted battery temperature trajectory (process block 198), and determining and implementing battery parameter setpoints (process block 196). In some embodiments, process 180 may be implemented by instructions store in memory 36 and/or another suitable tangible, non-transitory computer-readable medium that are executable by processor 34 and/or another suitable processing circuitry.

Accordingly, similar to process block 86, the control module 32B (e.g., the vehicle control module 62) may instruct the electrical energy generator 42 to generate electrical energy (process block 182). Additionally, similar to process block 88, the control module 32B (e.g., battery control module 58) may determine the lithium ion battery temperature 162 (process block 184).

The control module 32B may then determine whether the lithium ion battery temperature 162 is greater than a temperature threshold (decision block 186). In some embodiments, the temperature threshold may be predetermined and stored in memory 36. Thus, the control module 32B may retrieve the temperature threshold from memory 36 and compare it with the lithium ion battery temperature 162.

Similar to process block 118, when the control module 32B determines that the battery temperature 162 is greater than the temperature threshold, the control module 32B (e.g., battery control module 58) may instruct the relay 46 to change to the second state and disconnect the lithium ion battery module 28 (process block 188). Since the lithium ion battery module 28 is disconnected, the lead-acid battery module 30 may capture the generated electrical energy (process block 190) and supply electrical power by itself (process block 192). As described above, when the lithium ion battery module 28 is disconnected, it may cease charging/discharging and maintain its state of charge. As such, disconnecting the lithium ion battery module 28 may provide the fastest rate of cooling. However, providing electrical power with only the lead-acid battery module 30 may affect vehicle performance because the lead-acid battery module 30 may power more electrical devices.

In other words, the temperature threshold may be set such that the lithium ion battery module 28 is disconnected only as a last resort. In fact, as will be described in more detail below, using an intelligent control scheme should enable the lithium ion battery temperature 162 to be consistently maintained below the temperature threshold since operation may be controlled based at least in part on a predicted trajectory of the lithium ion battery temperature 208. As such, in some embodiments, the temperature threshold in an intelligent control scheme may be set at the highest acceptable temperature of the lithium ion battery module 28. In fact, in some embodiments, the temperature threshold in an intelligent control scheme may be greater than or equal to the higher temperature threshold in a reactive control scheme.

Moreover, since an intelligent control scheme enables the battery parameter setpoints to be adjusted in advance of reaching the temperature threshold, reaching the temperature threshold may indicate an inaccuracy in the predicted battery temperature trajectory 208. In some instances, the inaccuracy may result from unanticipated environmental changes that were not accounted for in the one or more models used to determine the predicted battery temperature trajectory 208. In other instances, the inaccuracies may result from inability for the one or more models to accurately describe operation of the vehicle 10. Thus, when the lithium ion battery temperature 162 repeatedly reaches the temperature threshold, the control module 32B determine that inaccuracies are present in the one or more models.

In some embodiments, when inaccuracies are detected, the control module 32B may adjust the one or more models to more accurately describe operation (process block 193). For example, in some embodiments, the control module 32B adjust the one or more models based at least in part on previously implemented battery parameters and the resulting operational parameters (e.g., battery temperature 162). Additionally or alternatively, the control module 32B may empirically adjust the one or more models either online or offline. For example, during operation of the vehicle 10, the control module 32B may calibrate the one or more models online to describe each implemented set of battery parameter setpoints 174 and resulting operational parameters. Additionally, when the vehicle 10 is off, the control module 32 may calibrate the one or more models offline by running a calibration sequence that implements various sets of battery parameter setpoints 174 and determines resulting operational parameters.

On the other hand, when the lithium ion battery temperature 162 is not greater than the temperature threshold, the control module 32B may determine a target battery temperature trajectory (process block 194). More specifically, the target temperature trajectory and/or the temperature threshold may serve as constraints on the lithium ion battery temperature 162. Thus, as will be described in more detail below, the target temperature trajectory and/or the temperature threshold may be determined to directly influence subsequent control over operation (e.g., de-rating and/or re-rating) of the battery system 12.

Accordingly, based at least in part on the target temperature trajectory and/or the temperature threshold, the control module 32B may determine the predicted battery temperature trajectory (process block 196). The control module 32B may then determine battery parameter setpoints 174 and implement the battery parameter setpoints 174 to facilitate realizing the predicted battery temperature trajectory (process block 198). More specifically, the control module 32B may determine the battery parameter setpoints such that the predicted battery temperature trajectory 208 is guided toward the target battery temperature trajectory and/or maintained below the battery temperature threshold 206. In some embodiments, control module 32B may determine the predicted battery temperature trajectory 208 using the thermal predictive model 164.

Figure 20:
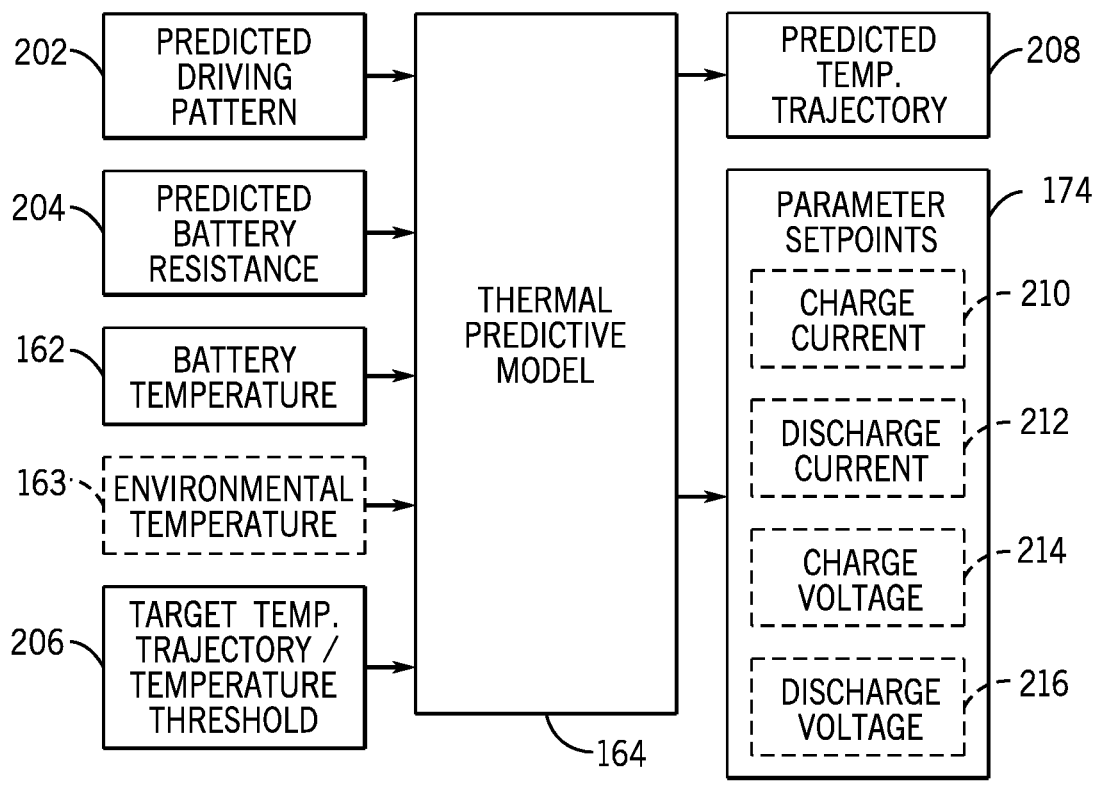
FIG. 20 is block diagram of a thermal predictive model used in the control module of FIG. 18, in accordance with an embodiment.

To help illustrate, one embodiment of a thermal predictive model 164 is described in FIG. 20. It should be appreciated that the described thermal predictive model 164 is intended merely to be illustrative and not limiting. Generally, the thermal predictive model 164 may be a model that describes effects operation of the battery system 12 has on the lithium ion battery temperature 162. For example, in the depicted embodiment, the thermal predictive model 164 may predict the temperature of the lithium ion battery over a prediction horizon (e.g., a predicted temperature trajectory 208) based on input parameters for a present time step including the battery temperature 162, a predicted driving pattern 202, a predicted battery resistance 204, a target temperature trajectory and/or temperature threshold 206, and optionally the environmental temperature 163. Additionally or alternatively, the thermal predictive model 164 may determine the environmental temperature 163 based at least in part on the other operational parameters.

Additionally, the thermal predictive model 164 may determine battery parameter setpoints 174 to implement in the battery system 12. For example, the thermal predictive model 164 may determine the battery parameter setpoints 174, which when implemented de-rate and/or re-rate the battery system 12. Thus, as described above, the battery parameter setpoints 174 may include any combination of a charge current 210, a discharge current 212, a charge voltage 214, and a discharge voltage 216.

Figure 21:
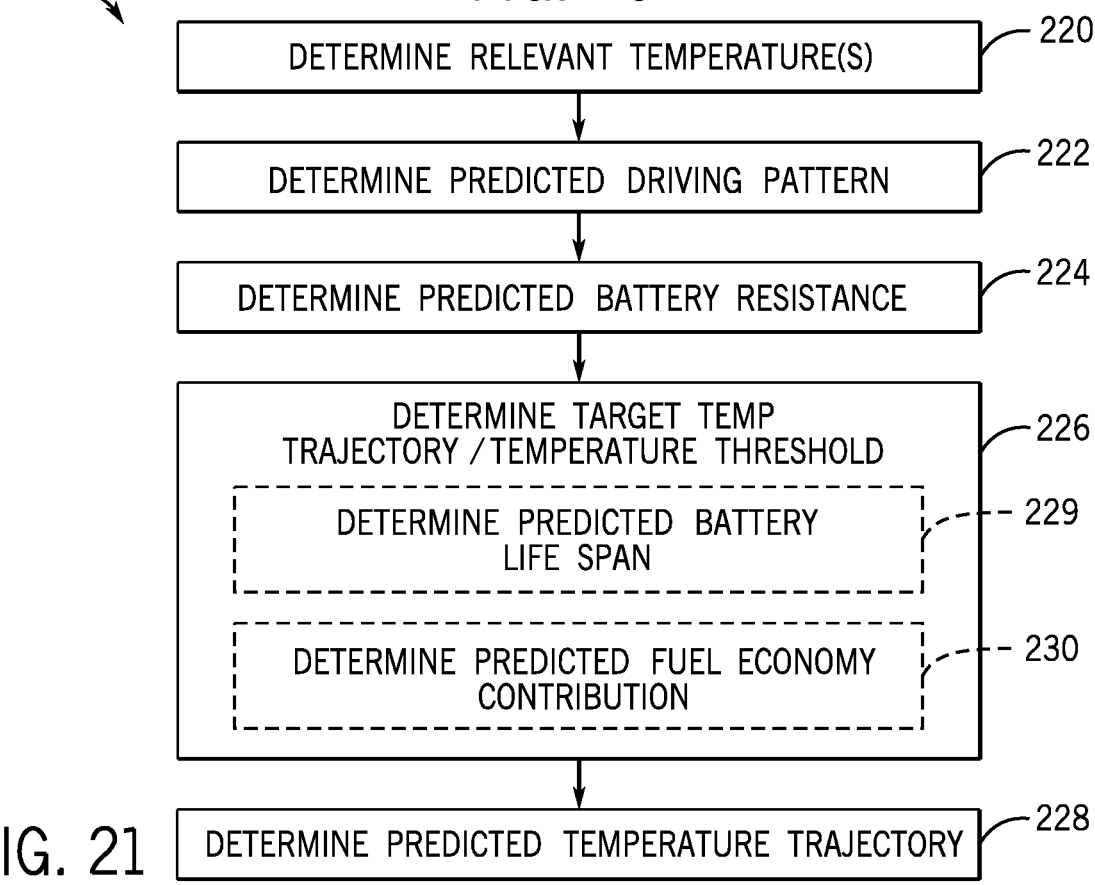
FIG. 21 is a flow diagram describing a process for determining battery parameter setpoints using the thermal predictive model of FIG. 20, in accordance with an embodiment.

One embodiment of a process 218 for operating the thermal predictive model 164 is described in FIG. 21. Generally, the process 218 includes determining relevant temperature(s) (process block 220), determining a predicted driving pattern (process block 222), determining a predicted battery resistance (process block 224), determining a target temperature trajectory/temperature threshold (process block 226), and determining a predicted temperature trajectory (process block 228). In some embodiments, process 218 may be implemented by instructions store in memory 36 and/or another suitable tangible, non-transitory computer-readable medium that are executable by processor 34 and/or another suitable processing circuitry.

Accordingly, the control module 32B may determine the relevant temperature(s) (process block 220). In some embodiments, the relevant temperatures may include the lithium ion battery temperature 162 and/or the environmental temperature 163. For example, the control module 32B may utilize a temperature sensor 60 coupled to the battery system 12 to directly measure temperature of the lithium ion battery module 28 and a temperature sensor 60 coupled to the vehicle 10 to directly measure temperature of environment surrounding the vehicle 10. Additionally or alternatively, the control module 32B may utilize other types of sensors 60 to measure parameters indicative of the lithium ion battery temperature 162 and/or the environmental temperature 163. Furthermore, in some embodiments, the control module 32B may either continuously or periodically determine the relevant temperature(s), for example, based on a fixed time cycle and/or in response to indication to run the thermal predictive model 164.

The control module 32B may also determine the predicted driving pattern 202 of the vehicle 10 (process block 222). More specifically, the predictive driving pattern 202 may describe how the vehicle 10 is expected to be driven over a prediction horizon. In some embodiments, the control module 32B may determine the predicted driving pattern 202 based at least in part on the previous driving pattern of the vehicle, for example, using the driving pattern recognition model 166.

Figure 22:
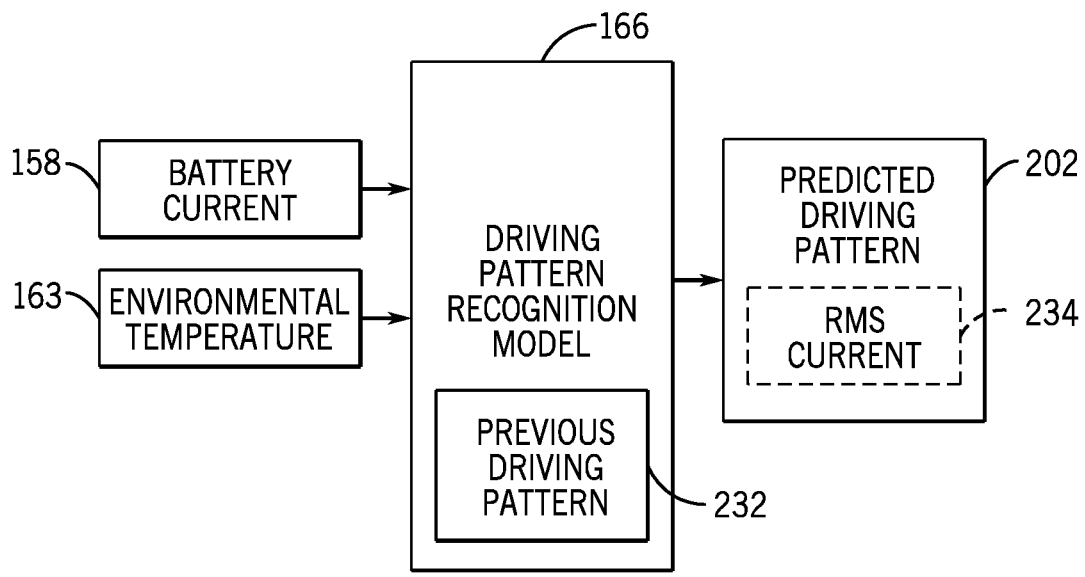
FIG. 22 is a block diagram of a driving pattern recognition model used in the control module of FIG. 18, in accordance with an embodiment.

To help illustrate, one embodiment of a driving pattern recognition model 166 is described in FIG. 22. It should be appreciated that the described driving pattern recognition model 166 is intended merely to be illustrative and not limiting. Generally, the driving pattern recognition model 166 is a model that describes a how a vehicle 10 is expected to be driven over a prediction horizon (e.g., predicted driving pattern 202). For example, in the depicted embodiment, the driving pattern recognition model 166 may determine the predicted driving pattern 202 based at least in part on the previous driving pattern 232 of the vehicle 10, the battery current 158, and the environmental temperature 163.

In some embodiments, the predicted driving pattern 202 may be described as the root-mean-square (RMS) current 234 and/or an average current. In other words, in such embodiments, the predicted driving pattern 202 is described as static battery current that is expected to be present over the prediction horizon. As such, the predicted driving pattern 202 may be determined based on the presently determined battery current 158 and the previous driving pattern 232, which may include previously determined battery current. Additionally or alternatively, greater amounts of detail may be included in the driving pattern recognition model 166 to enable a dynamic predicted driving pattern 202 over the prediction horizon. For example, the predicted driving pattern 202 may describe battery currents that are expected to be present at each point in time over the prediction horizon.

Figure 23:
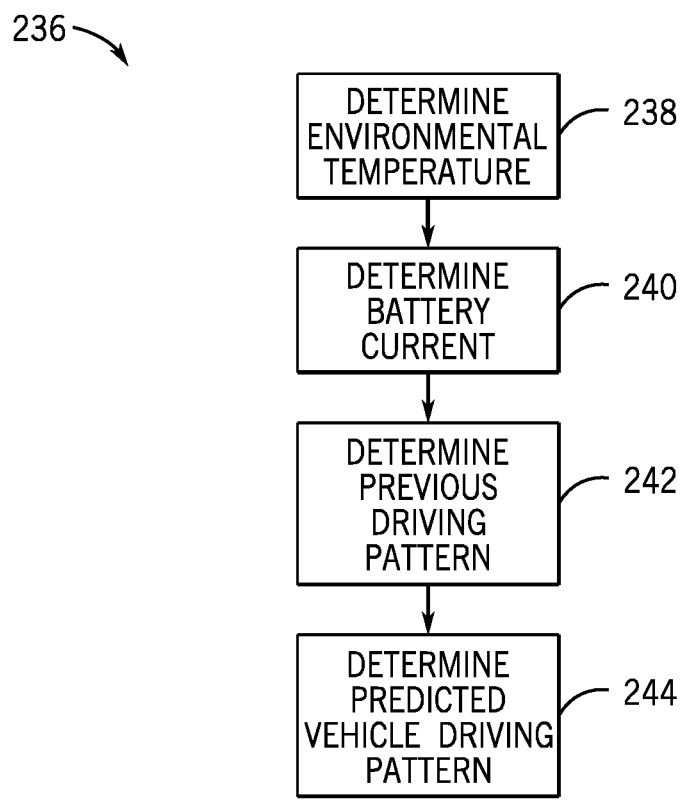
FIG. 23 is a flow diagram describing a process for determining predicted vehicle drive pattern using the driving pattern recognition model of FIG. 22, in accordance with an embodiment.

One embodiment of a process 236 for operating the driving pattern recognition model 166 is described in FIG. 23. Generally, the process 236 includes determining an environmental temperature (process block 238), determining a battery current (process block 240), determining a previous driving pattern (process block 242), and determining a predicted vehicle driving pattern (process block 244). In some embodiments, the process 236 may be implemented by instructions store in memory 36 and/or another suitable tangible, non-transitory computer-readable medium that are executable by processor 34 and/or another suitable processing circuitry.

Accordingly, the control module 32B may determine the environmental temperature 163 (process block 238). In some embodiments, the control module 32B may utilize a temperature sensor 60 coupled to vehicle 10 to directly measure temperature of the surrounding environment. Additionally, the control module 32B may determine the battery current 158 (process block 240). In some embodiments, the control module 32B may utilize a current sensor electrically coupled to the terminal 54 of the lithium ion battery module 28 to measure the battery current 158 (e.g., current used to charge the lithium ion battery module 28 and current output by the lithium ion battery module 28).

The control module 32B may also determine the previous driving pattern 232 of the vehicle 10 (process block 242). As described above, in some embodiments, the driving pattern may be expressed as the expected battery current over a prediction horizon. In such embodiments, the previous driving pattern 232 may include battery currents determined at previous points in time over the life of the lithium ion battery module 28. Additionally, in some embodiments, the previous driving pattern 232 may be stored in memory 36 as a curve. Thus, the control module 32B may determine the previous driving pattern 232 by retrieving the curve from memory 36.

Using the driving pattern recognition model 166, the control module 32B may then determine the predicted driving pattern 202 (process block 244). In the above described embodiment, the control module 32B may determine the predicted driving pattern 202 based at least in part on the battery current 158, the environmental temperature 163, and the previous driving pattern 232. More specifically, since drivers generally have fixed driving habits (e.g., routes, acceleration/braking tendencies, drive times), it is likely that the predicted driving pattern 202 may be similar to at least a portion of the previous driving pattern 232. Moreover, the present operating parameters (e.g., profile of battery current 158 and/or environmental temperature 163) may facilitate identifying similar portions of the previous driving pattern 232 as well as adjusting portions of the previous driving pattern 232 to account from the current operating parameters.

To help illustrate, in some embodiments, the control module 32B may determine the predicted driving pattern 202 as a static RMS current that is expected to occur over a prediction horizon. For example, based at least in part on the presently determined battery current 158, the control module 32B may identify a portion of the previous driving pattern 232 that is expected to occur over the prediction horizon. The control module 32B may then determine the predicted driving pattern 202 by determining a square each of the battery currents in the identified portion, determining an arithmetic mean of the squared battery currents, and determining a square root of the arithmetic mean. Additionally or alternatively, the control module 32B may determine the predicted driving pattern 202 by determining a square of each of the battery current in the previous driving pattern 232 and the presently determined battery current 158, determining an arithmetic mean of the squared battery currents, and determining a square root of the arithmetic mean.

To further illustrate, in some embodiments, the control module 32B may determine the predicted driving pattern 202 as a predicted battery current at points in time over the prediction horizon. For example, based at least in part on profile of the presently determined battery current 158, the control module 32B may identify a portion of the previous driving pattern 232 that is expected to occur over the prediction horizon. The control module 32B may then determine the predicted driving pattern 202 should be similar to the identified portion of the previous driving pattern 232. Accordingly, the control module 32B is the identified portion with any adjustments due to present operating conditions, such as environmental temperature 163.

In fact, in some embodiments, additional present operating conditions may further facilitate identifying portions of the previous driving pattern 232. For example, the control module 32B may identify portions of the previous driving pattern 232 based at least in part on time of the day or duration of travel. Additionally, the previous driving pattern 232 may be updated with the presently determined battery current 158 to facilitate determining the predicted driving pattern 202 in future time steps. For example, in some embodiments, the presently determined battery current 158 may be added to the previous driving pattern 232 and stored in memory 36 as a curve.

Returning to the process 218 of FIG. 21, the control module 32B may then determine the predicted lithium ion battery resistance 204 (process block 224). Generally, the resistance of the lithium ion battery module 28 is dynamic during operation and over the course of its life span. For example, the resistance may increase as the lithium ion battery module 28 ages and resistance may be inversely related to environmental temperature. Additionally, the resistance may pulse (e.g., spike) during operation, for example, when the lithium ion battery module 28 is charged during regenerative braking or discharged during a start-stop operation. In some embodiments, the control module 32B may utilize the recursive battery model 168 to facilitate determining the predicted lithium ion battery resistance 204.

Figure 24:
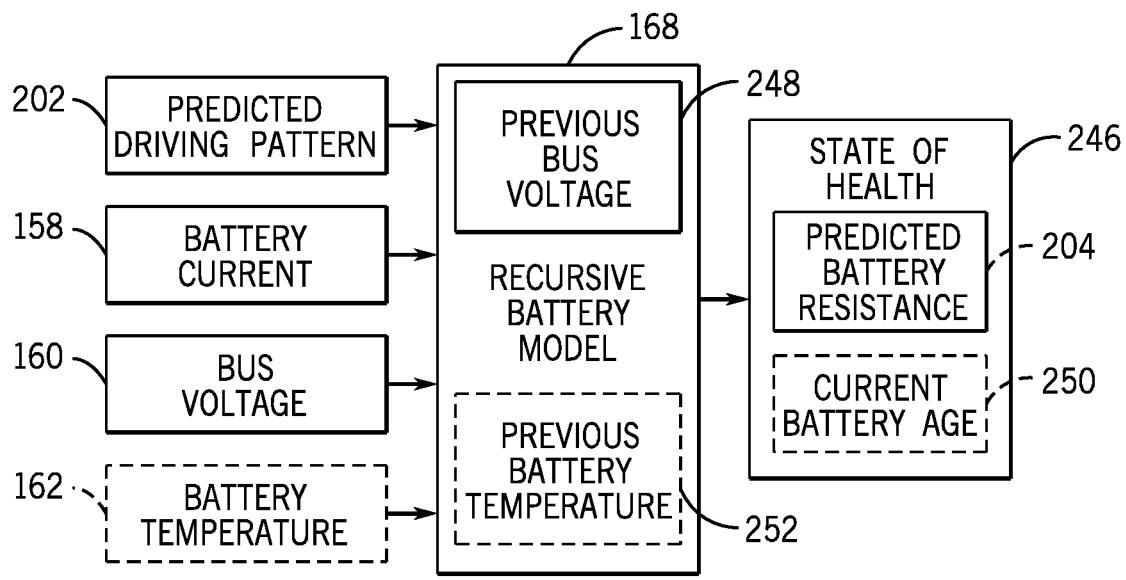
FIG. 24 is a block diagram of a recursive battery model used in the control module of FIG. 18, in accordance with an embodiment.

To help illustrate, one embodiment of a recursive battery model 168 is described in FIG. 24. It should be appreciated that the described recursive battery model 168 is intended merely to be illustrative and not limiting. Generally, the recursive battery model 168 may be a model that determines state of health 246 of a battery. In some embodiments, the state of health 246 may include the predicted battery resistance 204 of the lithium ion battery module 28 over the prediction horizon and/or a current battery age 250 of the lithium ion battery module 28. For example, as will be described in more detail below, the recursive battery model 168 may facilitate determining a current age 250 of the battery based at least in part on the presently determined battery temperature 162 and previously determined battery temperatures 252. Additionally, in the depicted embodiment, the recursive battery model 168 may facilitate determining a predicted lithium ion battery resistance 204 based at least in part on the predicted driving pattern 202, the battery current 158, and the bus voltage 160, and a previously determined bus voltage 248.

Figure 25:
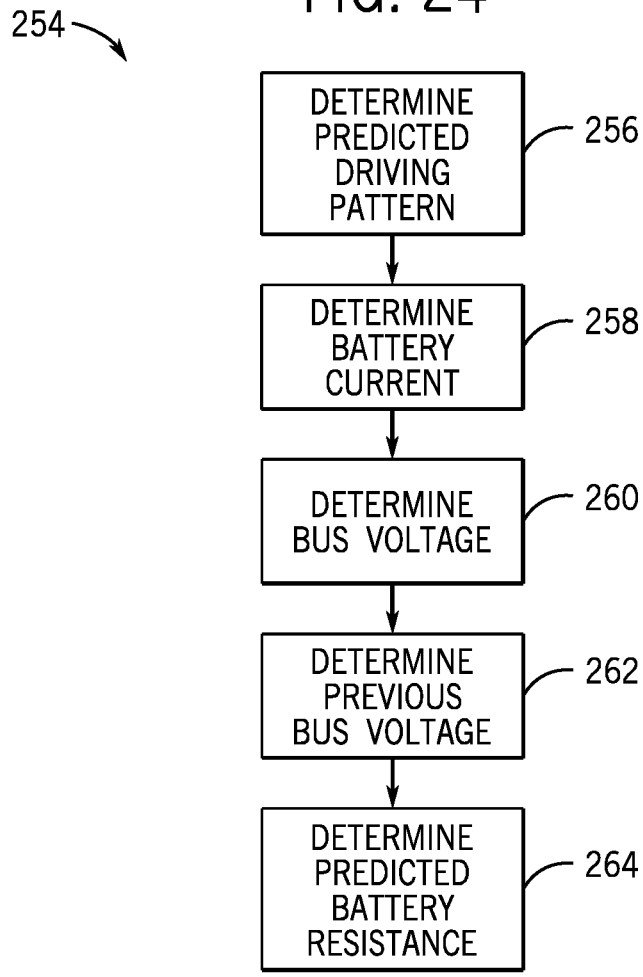
FIG. 25 is a flow diagram describing a process for determining battery state of health using the recursive battery model of FIG. 24, in accordance with an embodiment.

One embodiment of a process 254 for operating the recursive battery model 168 to determine the predicted battery resistance 204 is described in FIG. 25. Generally, the process 254 includes determining a predicted driving pattern (process block 256), determining a battery current (process block 258), determining a bus voltage (process block 260), determining a previous bus voltage (process block 262), and determining a predicted battery resistance (process block 264). In some embodiments, the process 254 may be implemented by instructions store in memory 36 and/or another suitable tangible, non-transitory computer-readable medium that are executable by processor 34 and/or another suitable processing circuitry.

Accordingly, the control module 32B may determine the predicted driving pattern 202 (process block 256). In some embodiments, the control module 32B may determine the predicted driving pattern 202 using the driving pattern recognition model 166 as described in process 236. Additionally, the control module 32B may determine the battery current 158 (process block 258). In some embodiments, the control module 32B may utilize a current sensor electrically coupled to the terminal 54 of the lithium ion battery module 28 to measure the battery current 158 (e.g., current used to charge the lithium ion battery module 28 and current output by the lithium ion battery module 28). Furthermore, the control module 32B may determine the bus voltage 160 (process block 260). In some embodiments, the control module 32B may utilize a voltage sensor electrically coupled to the bus 26 to measure the bus voltage 160.

The control module 32B may also determine the previous bus voltage 248 (process block 262). More specifically, the previous bus voltage 252 may include a bus voltage determined in a previous time step. Accordingly, the previous bus voltage 252 may be stored in memory 36 and the control module 32B may determine the previous bus voltage 248 by retrieving it from memory 36. Furthermore, the control module 32B may store the presently determined bus voltage 160 in memory 36 for use as the previous bus voltage 248 in the next time step.

Using the recursive battery model 168, the control module 32B may then determine the predicted lithium ion battery resistance 204 (process block 264). In some embodiments, predictive lithium ion battery resistance 204 may be an RMS resistance value that is expected to occur over a prediction horizon. For example, in the above described embodiment, the recursive battery model 168 may determine the predictive lithium ion battery resistance 204 based at least in part on the predicted driving pattern 202, the battery current 158, the bus voltage 160, and the previous bus voltages 248. In such embodiments, the predicted battery resistance may be calculated as follows:

$$R = \frac{\Delta V * I}{I_{RMS}} \quad (1)$$

where R is the predicted battery resistance 204, $\Delta V$ is the difference between the presently determined bus voltage 160 and the previous bus voltage 248, I is the presently determined battery current 158, and $I_{RMS}$ is the predicted driving pattern 202 expressed as an RMS current. In this manner, the predicted battery resistance 204 may determine the predicted battery resistance 204 with appropriate consideration of resistance pulses, for example, due to charging during regenerative braking or discharging during start-stop.

Returning to the process 218 of FIG. 21, the control module 32B may then determine a target temperature trajectory and/or a temperature threshold 206 (process block 226). In some embodiments, the target temperature trajectory and/or temperature threshold 206 may be stored in memory 36. Accordingly, the control module 32B may determine the target temperature trajectory and/or temperature threshold 206 by retrieving them from memory 36.

Additionally, as described above, the control module 32B may control operation of the battery system 12 based at least in part on the target temperature trajectory and/or temperature threshold 206. In other words, the control module 32B may determine the target temperature trajectory and/or temperature threshold 206 based on desired future operation of the battery system 12. For example, when lithium ion battery temperature 162 is a primary concern, the control module 32B may determine a temperature threshold 206 that describes a temperature, which the present and future battery temperatures are desired to be maintained below.

As described above, the lithium ion battery temperature 162 may also affect other factors, such as the life span of the lithium ion battery module 28, fuel economy contribution by the lithium ion battery module 28, drivability of the vehicle 10, and the like. Accordingly, the control module 32B may determine a target temperature trajectory 206 that describes temperatures over a control horizon, which the lithium ion battery temperature 162 is desired to be at. As such, the target temperature trajectory 206 may be determined to balance the effects on various factors expected to occur in future operation.

For example, the control module 32B may determine the target temperature trajectory 206 based at least in part on a predicted battery life span of the lithium ion battery module 28 and/or a predicted fuel economy contribution by the lithium ion battery module 28. In such embodiments, determining the target temperature trajectory 206 may include determining a predicted battery life span (process block 229) and determining a predicted fuel economy contribution (process block 230). For example, in some embodiments, the control module 32B may determine the predicted battery life span using the battery life model 170.

To help illustrate, one embodiment of a battery life model 170 is described in FIG. 26. It should be appreciated that the described battery life model 170 is intended merely to be illustrative and not limiting. Generally, the battery life model 170 may be a model used to determine a predicted battery life span 266 of the lithium ion battery module 28. For example, in the depicted embodiment, the battery life model 170 determines the predicted battery life span 266 based at least in part on a predicted driving pattern 202, a current battery age 250, and a battery life span threshold 267. Additionally, based on the predicted battery life span 266, the battery life model 170 may determine a battery life target temperature trajectory 268, which, as will be described in more detail below, may be used to determine the target temperature trajectory 206 supplied to the thermal predictive model 164.

One embodiment of a process 270 for operating the battery life model 170 is described in FIG. 27. Generally the process 270 includes determining a predicted driving pattern (process block 272), determining a battery life span threshold (process block 274), determining a current battery age (process block 275), determining a predicted battery life span (process block 276), and determining a battery life target temperature trajectory (process block 278). In some embodiments, the process 270 may be implemented by instructions store in memory 36 and/or another suitable tangible, non-transitory computer-readable medium that are executable by processor 34 and/or another suitable processing circuitry.

Accordingly, the control module 32B may determine the predicted driving pattern 202 (process block 272). In some embodiments, the control module 32B may determine the predicted driving pattern 202 using the driving pattern recognition model 166 as described in process 236. For example, the control module 32B may retrieve the predicted driving pattern 202 from memory 36.

Additionally, the control module 32B may also determine a battery life span threshold 267 (process block 274). More specifically, the battery life span threshold 267 may describe duration the lithium ion battery module 28 is expected to last. For example, in some embodiments, the battery life span threshold 267 may be eight years and/or a specific number of charging/discharging cycles. Additionally, in some embodiments, the battery life span threshold 267 may be predetermined and stored in memory 36. Accordingly, the control module 32B may determine the battery life span threshold 267 by retrieving it from memory 36.

The control module 32B may also determine the current battery age 250 of the lithium ion battery module 28 (process block 275). As described above, the current battery age 250 may be determined using the recursive battery model 168. One cause of aging may be result of charging and discharging the lithium ion battery module 28 (e.g., cycle aging).

Accordingly, the recursive battery model 168 may determine the current battery age 250 based at least in part on number of charging/discharging cycles previous performed. In some embodiments, the control module 32B may determine when the lithium ion battery 28 is charging and when the lithium ion battery 28 is discharging may be determined based on the battery currents 158 and/or the bus voltage 160. As such, the recursive battery model 168 may indicate the current cycle age of the lithium ion battery 28 based at least in part on the battery current 158 and/or the bus voltage 160.

Another cause of aging may be the result of battery temperature (e.g., calendar aging). Accordingly, the recursive battery model 168 may also determine the current battery age 250 based at least in part on the temperature experienced by the lithium ion battery 28 over its lifetime. Accordingly, the recursive battery model 168 may indicate the current calendar age of the lithium ion battery 28 based at least in part on the battery temperature 162 and/or previous battery temperatures 252.

One embodiment of a process 280 for operating the recursive battery model 168 to determine the current battery age 250 (e.g., calendar age) is described in FIG. 28. Generally, the process 280 includes determining a battery temperature (process block 282), determining previous battery temperatures (process block 284), and determining a current battery age (process block 286). In some embodiments, the process 280 may be implemented by instructions store in memory 36 and/or another suitable tangible, non-transitory computer-readable medium that are executable by processor 34 and/or another suitable processing circuitry.

Accordingly, the control module 32B may determine the lithium ion battery temperature 162 (process block 282). In some embodiments, the control module 32B may utilize a temperature sensor 60 coupled to the battery system 12 to directly measure temperature of the lithium ion battery module 28. In other embodiments, the control module 32B may utilize other types of sensors 60 to measure parameters indicative of the lithium ion battery temperature 162.

Additionally, the control module 32B may determine previous battery temperatures 252 (process block 284). In some embodiments, the previous battery temperatures 252 may include a portion or all of the battery temperatures previously measured during life of the lithium ion battery module 28. Additionally, in some embodiments, the previous battery temperatures 252 may be stored in memory 36. Accordingly, the control module 32B may determine the previous bus voltages 248 by retrieving them from memory 36. Furthermore, the control module 32B may store the presently determined lithium ion battery temperature 162 in memory 36 as part of the previous battery temperatures 252 to facilitate determining battery age in future time steps.

Using the recursive battery model 168, the control module 32B may determine the current battery age 250 (process block 286). More specifically, the control module 32B may determine how much of the total life of the lithium ion battery module 28 has been exhausted. For example, in the described example, the recursive battery model 168 may describe a relationship between the portion the battery life span already exhausted and magnitude and/or duration of the past and present battery temperatures (e.g., battery temperature 162 and the previous battery temperatures 252). In some embodiments, the current battery age 250 may be expressed in years, for example, based on the battery life span threshold 267 multiplied by the exhausted percentage.

Returning to the process 270 of FIG. 27, the control module 32B may then determine the predicted battery life span 266 of the lithium ion battery 28 using the battery life model 170 (process block 276). More specifically, the predicted battery life span 266 may include a sum of the current battery age 250 and the predicted remaining battery life span. In the above described embodiment, the battery life model 170 may determine the predicted battery life span 266 based at least in part on the predicted driving pattern 202 and the current battery age 250 (e.g., calendar age and/or cycle age).

As described above, calendar aging may be caused by lithium ion battery temperature 162. Accordingly, to determine the predicted battery life span due to calendar aging, the battery life model 170 may determine the lithium ion battery temperatures expected to occur over future operation based at least in part on the predicted driving pattern 202. More specifically, as described above, the predicted driving pattern 202 may describe battery currents expected over a future prediction horizon. As such, the expected lithium ion battery temperatures may be determined based at least in part on the expected battery currents. The battery life model 170 may then determine the predicted remaining calendar life span based on how the expected temperatures will affect life of the lithium ion battery module 28.

Additionally, as described above, cycle aging may be caused by charging/discharging the lithium ion battery module 28. In some embodiments, when the lithium ion battery module 28 is charging and when the lithium ion battery module 28 is discharging may be determined based on its battery current. For example, as described in FIG. 17C, a positive battery current may indicate that the lithium ion battery module 28 is charging and a negative battery current may indicate that the lithium ion battery module 28 is discharging. Additionally, by integrating the battery current, an energy throughput projection may be determined which may provide a further indication to the predicted remaining cycle life span because the storage capacity may decrease and the cell resistance may increase as the lithium ion battery 28 ages.

Accordingly, since the predicted driving pattern 202 may describe battery currents expected over a future prediction horizon, the battery life model 170 determine the predicted battery life span due to cycle aging based at least in part on the predicted driving pattern 202. The battery life model 170 may then determine the predicted remaining cycle life span based on the number of charging/discharging cycles expected in the future prediction horizon and/or the projected energy throughput.

In this manner, the control module 32B may determine the predicted remaining life span (e.g., predicted remaining calendar life span and/or the predicted remaining cycle life span) of the lithium ion battery 28. In some embodiments, the predicted remaining calendar life span and the predicted remaining cycle life span may be combined into a single predicted remaining life span, for example, by averaging the two or taking the lesser of the two. The control module 32B may then determine the predicted battery life span 266 of the lithium ion battery 28 by summing together the current battery age 250 and the predicted remaining life span.

Additionally, the control module 32B may determine the battery life target temperature trajectory 268 based at least in part on the predicted battery life span 266 and the battery life span threshold 267 (process block 278). More specifically, the control module 32B may compare the two to determine whether the predicted battery life span 266 is less than, equal to, or greater than the battery life span threshold 267. The control module 32B may then determine the battery life temperature trajectory 268 based at least in part on the comparison to adjust the predicted battery life span 266. For example, when the predicted battery life span 266 is less than the battery life span threshold 267, the control module 32B may determine the battery life target temperature trajectory 268 to reduce future battery temperatures. On the other hand, when the predicted battery life span 266 is greater than the battery life span threshold 267, the control module 32B may determine the battery life target temperature trajectory 268 to enable increased battery temperatures, which may facilitate improving battery fuel economy contribution.

In addition to the life span, the control module 32B may control operation of the battery system 12 based at least in part on fuel economy contribution by the lithium ion battery module 28. For example, the lithium ion battery module 28 may affect fuel economy by capturing electrical power during regenerative braking and supplying electrical power during start-stop, thereby reducing use of the alternator 18 and improving fuel economy. In some embodiments, the control module 32B may determine the predicted battery fuel economy contribution using the fuel economy model 172.

Figure 29:
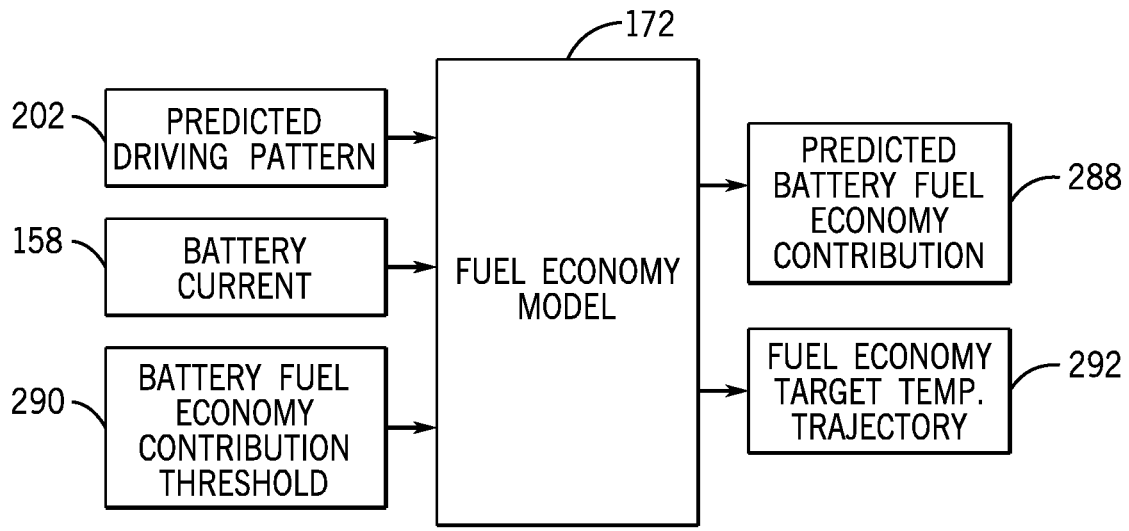
FIG. 29 is a block diagram of a fuel economy model used in the control module of FIG. 18, in accordance with an embodiment.

To help illustrate, one embodiment of a fuel economy model 172 is described in FIG. 29. It should be appreciated that the described fuel economy model 172 is intended merely to be illustrative and not limiting. Generally, the fuel economy model 172 may be a model that describes expected contribution by a lithium ion battery module 28 to fuel economy of the vehicle 10 over a prediction horizon (e.g., predicted battery fuel economy contribution 288). For example, in the depicted embodiment, the fuel economy model 172 determines the predicted battery fuel economy contribution 288 based at least in part on a predicted driving pattern 202, a battery current 158, and a battery fuel economy contribution threshold 290. Additionally, based on the predicted fuel economy contribution 288, the fuel economy model 172 may determine a fuel economy target temperature trajectory 292, which, as will be described in more detail below, may be used to determine the target temperature trajectory 206 supplied to the thermal predictive model 164.

Figure 30:
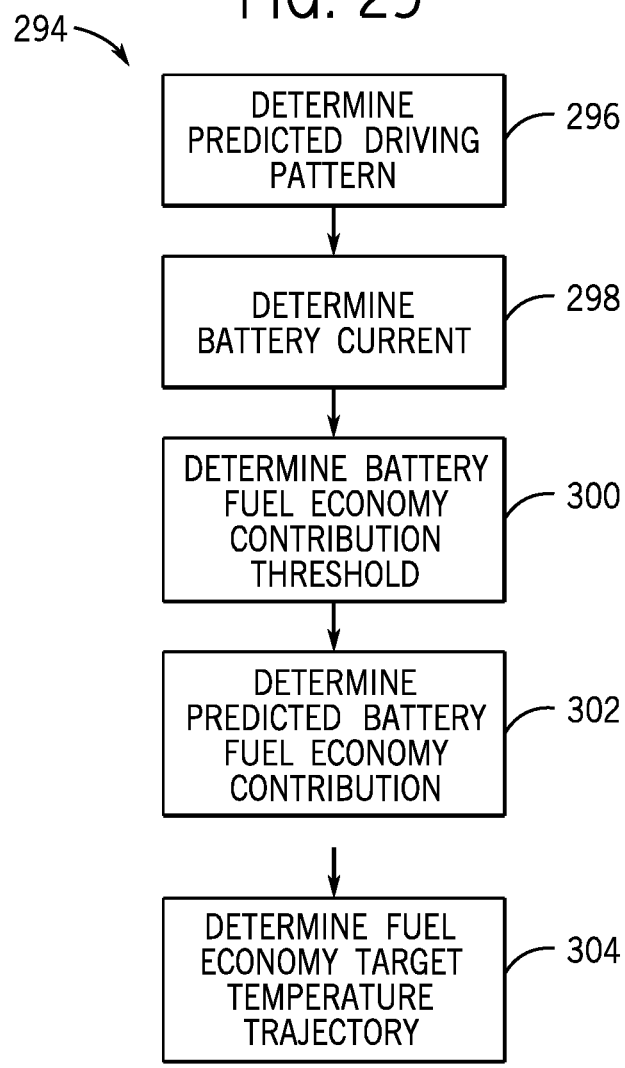
FIG. 30 is a flow diagram describing a process for determining a target temperature trajectory using the fuel economy model of FIG. 29, in accordance with an embodiment.

One embodiment of a process 294 for operating the fuel economy model 172 is described in FIG. 30. Generally, the process 294 includes determining a predicted driving pattern (process block 296), determining a battery current (process block 298), determining a battery fuel economy contribution threshold (process block 300), determining a battery fuel economy contribution (process block 302), and determining a fuel economy target temperature trajectory (process block 304). In some embodiments, the process 294 may be implemented by instructions store in memory 36 and/or another suitable tangible, non-transitory computer-readable medium that are executable by processor 34 and/or another suitable processing circuitry.

Accordingly, the control module 32B may determine the predicted driving pattern 202 (process block 296). In some embodiments, the control module 32B may determine the predicted driving pattern 202 using the driving pattern recognition model 166 as described in process 236. Additionally, the control module 32B may determine the battery current 158 (process block 298). In some embodiments, the control module 32B may utilize a current sensor electrically coupled to the terminal 54 of the lithium ion battery module 28 to measure the battery current 158 (e.g., current used to charge the lithium ion battery module 28 and current output by the lithium ion battery module 28).

Furthermore, the control module 32B may determine the battery fuel economy contribution threshold 290 (process block 300). Generally, the battery fuel economy contribution threshold 290 may describe a threshold amount desired for the lithium ion battery module 28 to contribute (e.g., improve) to fuel economy of the vehicle 10. Accordingly, in some embodiments, the battery fuel economy contribution threshold 290 may be predetermined by a manufacturer of the vehicle 10 and/or the battery system 12 and stored in memory 36. Thus, the control module 32B may determine the battery fuel economy contribution threshold by retrieving it from memory 36.

Using the fuel economy model 172, the control module 32B may then determine the predicted battery fuel economy contribution 288 (process block 302). More specifically, the predicted battery fuel economy contribution 288 may describe the effect on fuel economy of the vehicle 10 caused by the lithium ion battery module 28 over the prediction horizon. In some embodiments, the predicted battery fuel economy contribution 288 may describe benefits to fuel economy caused by use of the lithium ion battery module 28 and detriments to fuel economy caused by reduced use of the lithium ion battery module 28 (e.g., de-rating). For example, the predicted battery fuel economy contribution 288 may account for when the lithium ion battery module 28 is expected to capture electrical power during regenerative braking and supply electrical power to the electrical system 44, thereby reducing use of the alternator 18 and improving fuel economy.

In the above described embodiment, the fuel economy model 172 may determine the predicted battery fuel economy contribution 288 based at least in part on the predicted driving pattern 202, the battery current 158, and the battery fuel economy contribution threshold 290. As described above, the battery current 158 and the predicted driving pattern 202 may describe expected battery current over the prediction horizon. More specifically, patterns in the expected battery current may indicate operations performed by the lithium ion battery module 28. For example, a current discharge pulse may indicate cranking the internal combustion engine 24 during a start-stop operation. Additionally, a current charge pulse may indicate that the lithium ion battery module 28 is capturing electrical energy during regenerative braking. In this manner, the control module 32B may determine when and/or duration the lithium ion battery module 28 is expected to perform an operation (e.g., start-stop) that affects fuel economy of the vehicle 10 during the prediction horizon.

Based at least in part on the predicted battery fuel economy contribution 288 and the battery fuel economy contribution threshold 290, the control module 32B may determine the fuel economy target temperature trajectory 292 (process block 302). More specifically, the control module 32B may compare the two to determine whether the predicted battery fuel economy contribution 288 is less than, equal to, or greater than the battery fuel economy contribution threshold 290. The control module 32B may then determine the fuel economy target temperature trajectory 292 based at least in part on the comparison to adjust the predicted battery fuel economy contribution 288. For example, when the predicted battery fuel economy contribution 288 is less than the battery fuel economy contribution threshold 290, the control module 32B may determine the fuel economy target temperature trajectory 292 to enable increased lithium ion battery temperatures and, thus, increased lithium ion battery module 28 operation. On the other hand, when the predicted battery fuel economy contribution 288 is greater than the predicted battery fuel economy contribution threshold 290, the control module 32B may determine the fuel economy target temperature trajectory 292 to enable reduced battery temperatures, which may facilitate improving battery life span.

Returning to the process 218 of FIG. 21, as described above, the control module 32B may determine the target temperature trajectory 206 accounting for various factors, such as battery life span of the lithium ion battery module 28 and/or fuel economy contribution by the lithium ion battery module 28. Accordingly, in some embodiments, the control module 32B may determine the target temperature trajectory 206 based at least in part on the battery life target temperature trajectory 268 and/or the fuel economy target temperature trajectory 292 (e.g., factor target temperature trajectories).

However, in some instances, various factors may be inversely related. For example, fuel economy contribution may be increased by increasing charging/discharging of the lithium ion battery module 28. However, the increased charging/discharging may also result in increased battery temperature, which decreases life span of the lithium ion battery module 28. Accordingly, the control module 32B may utilize the objective function 165 to provide a weighting between the various factors. For example, the objective function 165 may enable placing greater emphasis battery life span over battery fuel economy contribution. Accordingly, in such an embodiment, the battery life target temperature trajectory 268 may be weighted more heavily than the fuel economy target temperature trajectory 292 when determining the target temperature trajectory 206.

In fact, in some embodiments, the objective function 165 may enable dynamically changing the weightings between the factors. For example, a user (e.g., driver or mechanic) may manually change the weightings based on personal importance. Additionally or alternatively, the weightings may be adjusted automatically by placing a greater emphasis on a factor when the factor falls below and/or approaches a threshold. For example, a greater emphasis may be placed on lithium ion battery temperature 162 the closer the lithium ion battery temperature 162 is to the temperature threshold. Accordingly, in such embodiments, the temperature threshold may be weighted more heavily than the battery life target temperature trajectory 268 and the fuel economy target temperature trajectory 292 when determining the target temperature trajectory 206.

Based on the target temperature trajectory and/or the temperature threshold 206, the control module 32B may determine the predicted temperature trajectory 208 (process block 228). More specifically, the predicted temperature trajectory 208 may be determined such that the predicted temperature trajectory 208 is guided toward the target temperature trajectory. Additionally or alternatively, the predicted temperature trajectory 208 may be determined such that the predicted temperature trajectory is maintained below the temperature threshold.

Returning to process 180 of FIG. 19, the control module 32B may determine battery parameter setpoints 174 and implement the battery parameter setpoints 174 to realize the predicted temperature trajectory 208 (process block 198). As described above, in some embodiments, the control module 32B may instruct the battery system 12 to implement the battery parameter setpoints 174 to de-rate and/or re-rate the battery system 12, thereby controlling the lithium ion battery temperature 162.

For example, the control module 32B may instruct the electrical energy generator 42 to reduce generated charge current 210 and/or charge voltage 214 to de-rate the battery system 12, thereby reducing lithium ion battery temperature 162. Additionally, the control module 32B may instruct the electrical energy generator 42 to increase generated charge current 210 and/or charge voltage 214 to re-rate the battery system 12, thereby increasing operation of the lithium ion battery module 28. Furthermore, the control module 32B may instruct the battery system 12 to reduce discharge current 212 and/or discharge voltage 216 output by the lithium ion battery module 28 to de-rate the battery system 12.

As such, the intelligent control scheme described above may facilitate controlling temperature of the lithium ion battery module 28 based at least in part on presently determined operational parameters (e.g., lithium ion battery temperature 162) and a temperature threshold as well as predicted operational parameters over a prediction horizon and a target temperature trajectory. For example, using the target temperature trajectory 206 may facilitate de-rating/re-rating techniques to preemptively cool a lithium ion battery module 28 based at least in part on whether the predicted trajectory of the operational parameters are expected to approach or surpass respective thresholds.

Figure 31A:
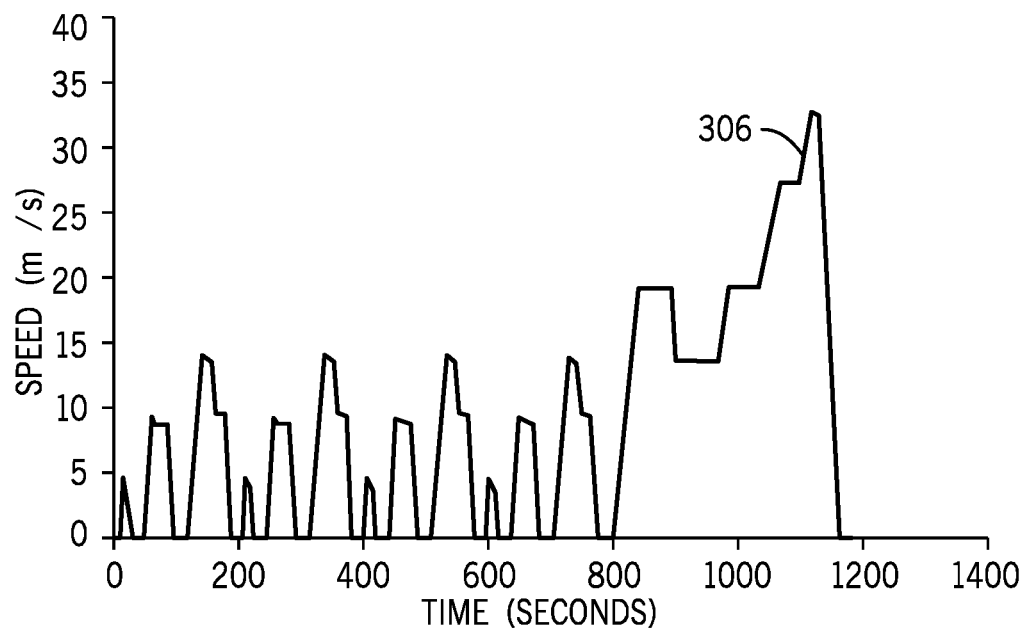
FIG. 31A is a plot describing a hypothetical driving pattern, in accordance with an embodiment.

To help illustrate, results from testing a vehicle with an intelligent de-rating scheme is described below. More specifically, the vehicle was driven in one New European Drive Cycle (NEDC). The NEDC is described in described in FIG. 31A. More specifically, FIG. 31A is a plot that describes the speed of the vehicle during the NEDC with a drive cycle curve 306, in which time in seconds is shown on the X-axis and speed of the vehicle is shown on the Y-axis.

As described by the drive cycle curve 306, the vehicle was driven through an urban drive cycle four times between second 0 to second 780. More specifically, during each urban drive cycle, the vehicle started idle. After remaining idle for 11 seconds, the vehicle accelerated to approximately 5 m/s in 4 seconds, cruised for 8 seconds, and decelerated coming to a stop in 5 seconds. After remaining idle for 21 seconds, the vehicle accelerated to approximately 10 m/s in 12 seconds, cruised for 24 seconds, and decelerated coming to a stop in 11 seconds. After remaining idle for another 21 seconds, the vehicle accelerated to approximately 15 m/s in 26 seconds, cruised for 12 seconds, decelerated to approximately 10 m/s in 8 seconds, cruised for another 13 seconds, and decelerated coming to a stop in 12 seconds.

Additionally, as described by the drive cycle curve 306, the vehicle was driven through an extra-urban drive cycle between second 780 and second 1180. More specifically, the vehicle started the extra-urban drive cycle idle. After remaining idle for 20 seconds, the vehicle accelerated to approximately 20 m/s in 41 seconds, cruised for 50 seconds, decelerated to approximately 15 m/s in 8 seconds. After cruising at 8 m/s for 69 seconds, the vehicle again accelerated to approximately 20 m/s in 13 seconds, cruised at 20 m/s for 50 seconds, and accelerated to approximately 30 m/s in 30 seconds. After cruising at 30 m/s for 30 seconds, the vehicle accelerated to approximately 35 m/s in 20 seconds, cruised at 35 m/s for 10 seconds, decelerated to a stop in 34 seconds, and idled for 20 seconds.

Figure 31B:
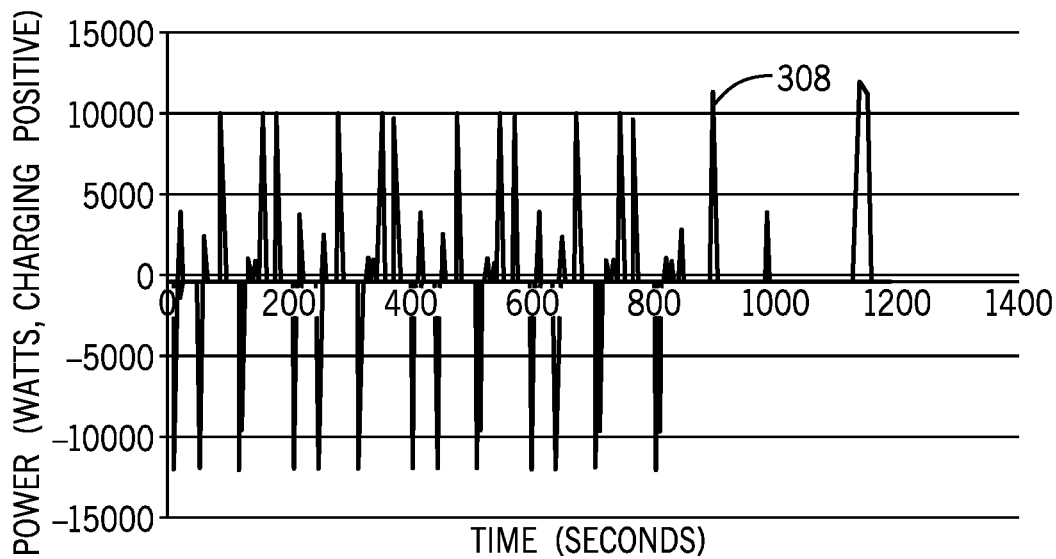
FIG. 31B is a plot describing charge and discharge currents of a lithium ion battery during the hypothetical driving pattern of FIG. 31A, in accordance with an embodiment.

During the NEDC, the lithium ion battery module 28 captured electrical energy when the vehicle decelerated. Additionally, the lithium ion battery module 28 supplied electrical power to the vehicle's electrical system and to the ignition to restart the internal combustion engine during a start-stop operation. To help illustrate, the battery current of the lithium ion battery measured during the NEDC is described in FIG. 31B. More specifically, FIG. 31B is a plot that describes the battery current with a current curve 308, in which time in seconds is shown on the X-axis and the battery current is shown on the Y-axis. More specifically, a positive battery current indicates that the lithium ion battery was charging and a negative battery current indicates that the lithium ion battery was discharging.

As described by the current curve 308, during each urban drive cycle, the lithium ion battery supplied a pulse of discharge current to crank the internal combustion engine at second 11 and captured charge current due to regenerative braking between second 23 and second 28. Additionally, the lithium ion battery module 28 supplied a pulse of discharge current to crank the internal combustion engine at second 49 and captured charge current due to regenerative braking from second 75 to second 86. Furthermore, the lithium ion battery supplied a pulse of discharge current to crank the internal combustion engine 24 at second 107, captured charge current due to regenerative braking from second 145 to second 153 and from second 166 to second 188.

Additionally, as described by the current curve 308, the battery current was approximately the same during each urban drive cycle. Accordingly, as the vehicle began each drive cycle, the control module 32B in the vehicle was able to determine the predicted driving pattern 202 of the vehicle. For example, determining that the vehicle remained idle from second 195 to second 206, accelerated to approximately 5 m/s from second 206 to second 210, and cruised at 5 m/s from second 210 to second 218 based on the battery current, the control module 32B was able to determine the predicted driving pattern 202. More specifically, the control module 32B determined at second 218 a predicted driving pattern 202 such that the vehicle was expected to decelerate to a stop from second 218 to second 223, remain idle from second 223 to second 244 and accelerate to approximately 10 m/s from second 244 to second 256.

In this manner, the vehicle was able to implement battery parameter setpoints 174 based at least in part on the predicted driving pattern 202. For example, at second 218, the vehicle was able to determine the predicted temperature trajectory 208, the predicted battery resistance 204, and the predicted battery fuel economy contribution 288 for at least from second 218 to second 256. In this manner, the vehicle was able to preemptively de-rate and re-rate the battery system 12 when desired.

In other words, the techniques described herein may supplement cooling components, such as vent system 66 and thermal system 68, in the battery system 12. In fact, the techniques may enable a vehicle to rely solely on a passive thermal system with passive cooling components, such as cooling fins 74, without the use of additional active cooling components, such as a fan or an evaporator plate.

Thus, one or more of the disclosed embodiments, alone or on combination, may provide one or more technical effects including improving performance of a battery system. In particular, the disclosed embodiments may de-rate/re-rate the battery system to regulate temperature of a lithium ion battery in the battery system, for example, based on fuel economy contribution by the lithium ion battery, life span of the lithium ion battery, and/or charge capture efficiency of the battery system. For instance, a control module may utilize a reactive control scheme to de-rate the battery system to reduce operation of the lithium ion battery when temperature of lithium ion battery reaches a temperature threshold. Additionally or alternatively, a control module may utilize an intelligent control scheme to de-rate the battery system based at least in part on a predicted trajectory of temperature of the lithium ion battery. In this manner, the techniques described herein enable controlling operation of the battery system based at least in part on various performance factors. The technical effects and technical problems in the specification are exemplary and are not limiting. It should be noted that the embodiments described in the specification may have other technical effects and can solve other technical problems.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The invention claimed is:

1. A tangible, non-transitory, computer-readable medium storing instructions executable by one or more processors of an electrical device, wherein the instructions comprise instructions to:

determine, using the one or more processors, a predicted driving pattern of an automotive vehicle in which a battery module is to be deployed;

predict, using the one or more processors, operational parameters of the battery module expected to occur when the automotive vehicle performs the predicted driving pattern based at least in part on a control scheme implemented by the automotive vehicle;

determine, using the one or more processors, a predicted life span of the battery module based at least in part on a battery life model that describes a relationship between a predicted remaining life span of the battery module and the operational parameters of the battery module expected to occur when the automotive vehicle performs the predicted driving pattern;

determine, using the one or more processors, a battery life span threshold associated with the automotive vehicle; and indicate, using the one or more processors, that the battery module is suitable to be deployed in the automotive vehicle when the predicted life span of the battery module is greater than or equal to the battery life span threshold associated with the automotive vehicle;

further comprising:

(a) instructions to control, using the one or processors, operation of the automotive vehicle in accordance with the control scheme after the battery module is deployed in the automotive vehicle to facilitate maintaining actual life span of the battery module greater than or equal to the battery life span threshold associated with the automotive vehicle and wherein the instructions to control operation of the automotive vehicle in accordance with the control scheme comprise instructions to:

instruct, using the one or more processors, an electrical generator implemented in an electrical system of the automotive vehicle to adjust voltage, current, or both of electrical power output from the electrical generator;

instruct, using the one or more processors, a relay electrically coupled between battery cells of the battery module and the electrical system to switch to, maintain, or both a closed position;

instruct, using the one or more processors, the relay electrically coupled between the battery cells of the battery module and the electrical system to switch to, maintain, or both an open position; or any combination thereof; or (b) determine, using the one or more processors, a current age of the battery module based at least in part on a recursive battery model that describes a relationship between the current age of the battery module and previous operational parameters of the battery module; and determine, using the one or more processors, the predicted life span of the battery module based at least in part on the current age of the battery module and the predicted remaining life span of the battery module; or (c) wherein:
the instructions to determine the predicted driving pattern comprise instructions to receive the predicted driving pattern from a manufacturer of the automotive vehicle;
the instructions to determine the battery life span threshold comprise instructions to receive the battery life span threshold from the manufacturer of the automotive vehicle; or
both.

2. A tangible, non-transitory, computer-readable medium storing instructions executable by one or more processors of an electrical device, wherein the instructions comprise instructions to:
determine, using the one or more processors, a predicted driving pattern of an automotive vehicle in which a battery module is to be deployed;
predict, using the one or more processors, operational parameters of the battery module expected to occur when the automotive vehicle performs the predicted driving pattern based at least in part on a control scheme implemented by the automotive vehicle;
determine, using the one or more processors, a predicted life span of the battery module based at least in part on a battery life model that describes a relationship between a predicted remaining life span of the battery module and the operational parameters of the battery module expected to occur when the automotive vehicle performs the predicted driving pattern;
determine, using the one or more processors, a battery life span threshold associated with the automotive vehicle; and
indicate, using the one or more processors, that the battery module is suitable to be deployed in the automotive vehicle when the predicted life span of the battery module is greater than or equal to the battery life span threshold associated with the automotive vehicle
wherein:
the instructions to predict the operational parameters of the battery module comprise instructions to predict battery current expected to flow through the battery module when the automotive vehicle performs the predicted driving pattern; and
the instructions to determine the predicted life span of the battery module comprise instructions to determine the predicted remaining life span of the battery module based at least in part on the battery current expected to flow through the battery module when the automotive vehicle performs the predicted driving pattern.

3. The tangible, non-transitory, computer-readable medium of claim 2, wherein:
the instructions to predict the operational parameters of the battery module comprise instructions to determine a predicted trajectory of temperature of the battery module based at least in part on the battery current expected to flow through the battery module when the automotive vehicle performs the predicted driving pattern; and the instructions to determine the predicted life span of the battery module comprise instructions to determine the predicted remaining life span of the battery module based at least in part on the predicted trajectory of the temperature of the battery module.

4. A method of testing a battery module, comprising:
determining, using processing circuitry, a predicted driving pattern of an automotive vehicle in which a battery module is to be deployed;
predicting, using the processing circuitry, operational parameters of the battery module expected to occur when the automotive vehicle performs the predicted driving pattern based at least in part on a control scheme implemented by the automotive vehicle;
determining, using the processing circuitry, a predicted fuel economy contribution of the battery module based at least on a fuel economy model that describes a relationship between the predicted fuel economy contribution of the battery module and the operational parameters of the battery module expected to occur when the automotive vehicle performs the predicted driving pattern;
determining, using the processing circuitry, a fuel economy contribution threshold associated with the automotive vehicle; and
indicating, using the processing circuitry, that the battery module is suitable to be deployed in the automotive vehicle when the predicted fuel economy contribution of the battery module is greater than or equal to the fuel economy contribution threshold associated with the automotive vehicle;
further comprising:
(a) controlling, using the processing circuitry, operation of the automotive vehicle in accordance with the control scheme after the battery module is deployed in the automotive vehicle to facilitate maintaining actual fuel economy contribution of the battery module greater than or equal to the fuel economy contribution threshold associated with the automotive vehicle; and wherein controlling operation of the automotive vehicle in accordance with the control scheme comprises:
instructing, using the processing circuitry, an electrical generator implemented in an electrical system of the automotive vehicle to adjust voltage, current, or both of electrical power output from the electrical generator;
instructing, using the processing circuitry, a relay electrically coupled between battery cells of the battery module and the electrical system to switch to, maintain, or both a closed position;
instructing, using the processing circuitry, the relay electrically coupled between the battery cells of the battery module and the electrical system to switch to, maintain, or both an open position; or
any combination thereof; or
(b) predicting the operational parameters of the battery module comprises predicting battery current expected to flow through the battery module when the automotive vehicle performs the predicted driving pattern; and determining the predicted fuel economy contribution of the battery module comprise determining the predicted fuel economy contribution of the battery module based at least in part on the battery current expected to flow through the battery module when the automotive vehicle performs the predicted driving pattern; or (c) determining the predicted driving pattern comprises receiving the predicted driving pattern of the automotive vehicle from a manufacturer of the automotive vehicle;
determining the fuel economy contribution threshold comprises to receiving the fuel economy contribution threshold from the manufacturer of the automotive vehicle; or
both.

* * * * *

UNITED STATES PATENT AND TRADEMARK OFFICE
CERTIFICATE OF CORRECTION

PATENT NO. : 11,040,624 B2  
APPLICATION NO. : 16/160369  
DATED : June 22, 2021  
INVENTOR(S) : Jin et al.

Page 1 of 2

It is certified that error appears in the above-identified patent and that said Letters Patent is hereby corrected as shown below:

In the Specification

1. In Column 1, Line 43, delete "full hybrid systems (FHEVs)" and insert -- full hybrid electric vehicles (FHEVs) --, therefor.

2. In Column 1, Lines 46-47, delete "mild hybrid systems (MHEVs)" and insert -- mild hybrid electric vehicles (MHEVs) --, therefor.

3. In Column 2, Line 21, delete "to power to the xEV." and insert -- to power the xEV. --, therefor.

4. In Column 4, Line 1, delete "used to in" and insert -- used in --, therefor.

5. In Column 5, Line 43, delete "storage/expending" and insert -- storage/expanding --, therefor.

6. In Column 6, Line 65, delete "resistance a" and insert -- resistance at a --, therefor.

7. In Column 13, Line 61, delete "voltage" and insert -- voltage) --, therefor.

8. In Column 14, Line 9, delete "surround" and insert -- surrounding --, therefor.

9. In Column 17, Line 20, delete "at it" and insert -- as it --, therefor.

10. In Column 22, Line 44, delete "the of the" and insert -- the --, therefor.

11. In Column 24, Lines 41-42, delete "in which the in which the" and insert -- in which the --, therefor.

12. In Column 25, Line 3, delete "in which the in which the" and insert -- in which the --, therefor.

Signed and Sealed this  
Twenty-fifth Day of January, 2022

Drew Hirshfeld  
*Performing the Functions and Duties of the*  
*Under Secretary of Commerce for Intellectual Property and*  
*Director of the United States Patent and Trademark Office*

CERTIFICATE OF CORRECTION (continued)
U.S. Pat. No. 11,040,624 B2

13. In Column 28, Line 17, delete "lithium ion battery temperature 208." and insert -- lithium ion battery temperature 162. --, therefor.

14. In Column 30, Line 22, delete "describes a how a vehicle" and insert -- describes how a vehicle --, therefor.

15. In Column 34, Line 54, delete "duration the" and insert -- duration of the --, therefor.

16. In Column 35, Line 58, delete "portion the" and insert -- portion of the --, therefor.

17. In Column 38, Line 43, delete "duration the" and insert -- duration of the --, therefor.